(12) United States Patent
Makita et al.

(10) Patent No.: US 7,049,183 B2
(45) Date of Patent: May 23, 2006

(54) SEMICONDUCTOR FILM, METHOD FOR MANUFACTURING SEMICONDUCTOR FILM, SEMICONDUCTOR DEVICE, AND METHOD FOR MANUFACTURING SEMICONDUCTOR DEVICE

(75) Inventors: Naoki Makita, Nara (JP); Michinori Iwai, Matsusaka (JP); Shinya Morino, Ikoma (JP); Takayuki Tsutsumi, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/699,460

(22) Filed: Nov. 3, 2003

(65) Prior Publication Data
US 2004/0115906 A1 Jun. 17, 2004

(30) Foreign Application Priority Data
Nov. 8, 2002 (JP) ............................. 2002/325677

(51) Int. Cl.
*H01L 21/84* (2006.01)
*H01L 21/00* (2006.01)
(52) U.S. Cl. .................. 438/149; 438/166; 438/162; 438/486; 438/473
(58) Field of Classification Search ............... 438/149, 438/166, 200, 486, 146, 143, 151, 476, 473, 438/162, 508
See application file for complete search history.

(56) References Cited

U.S. PATENT DOCUMENTS

| | | | |
|---|---|---|---|
| 5,608,232 A * | 3/1997 | Yamazaki et al. ............ | 257/66 |
| 5,879,974 A | 3/1999 | Yamazaki | |
| 5,915,174 A | 6/1999 | Yamazaki et al. | |
| 6,251,712 B1 * | 6/2001 | Tanaka et al. ............... | 438/143 |
| 6,465,288 B1 * | 10/2002 | Ohnuma ...................... | 438/166 |
| 6,858,480 B1 | 2/2005 | Nakamura et al. | |
| 6,893,503 B1 * | 5/2005 | Ohnuma et al. .............. | 117/94 |
| 2002/0149017 A1 * | 10/2002 | Gotoh et al. .................. | 257/65 |
| 2002/0197785 A1 * | 12/2002 | Yamazaki et al. .......... | 438/225 |
| 2003/0134459 A1 * | 7/2003 | Tanaka et al. .............. | 438/151 |

FOREIGN PATENT DOCUMENTS

JP 10-270363 10/1998

OTHER PUBLICATIONS

Official Communication dated Jul. 26, 2005 issued in the corresponding Korean Application No. 10-2003-0078792.

* cited by examiner

*Primary Examiner*—B. William Haumeister
*Assistant Examiner*—Igwe U. Anya
(74) *Attorney, Agent, or Firm*—Keating & Bennett, LLP

(57) ABSTRACT

A method of the present invention includes the steps of forming an amorphous semiconductor layer on an insulative surface, adding a catalyst element capable of promoting crystallization to the amorphous semiconductor layer and then performing a first heat treatment so as to crystallize the amorphous semiconductor layer, thereby obtaining a crystalline semiconductor layer, performing a first gettering process to remove the catalyst element from the semiconductor layer, and performing a second gettering process that is different from the first gettering process to remove the catalyst element from the semiconductor layer. The first gettering process includes removing at least large masses of a semiconductor compound of the catalyst element present in the crystalline semiconductor layer. The second gettering process includes moving at least a portion of the catalyst element remaining in the crystalline semiconductor layer so as to form a low-catalyst-concentration region in the crystalline semiconductor layer, the low-catalyst-concentration region having a lower catalyst element concentration than in other regions.

28 Claims, 20 Drawing Sheets

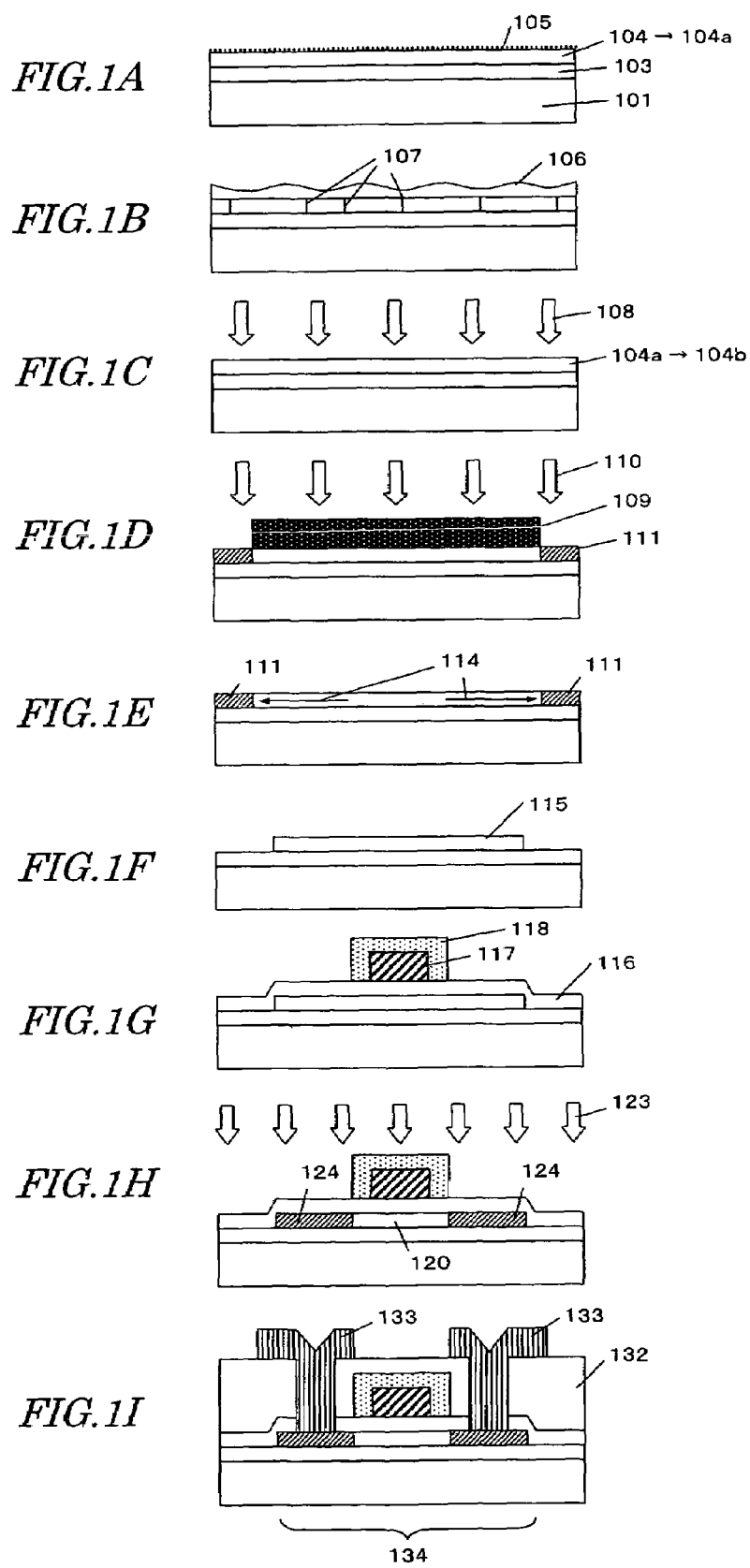

*FIG.17*
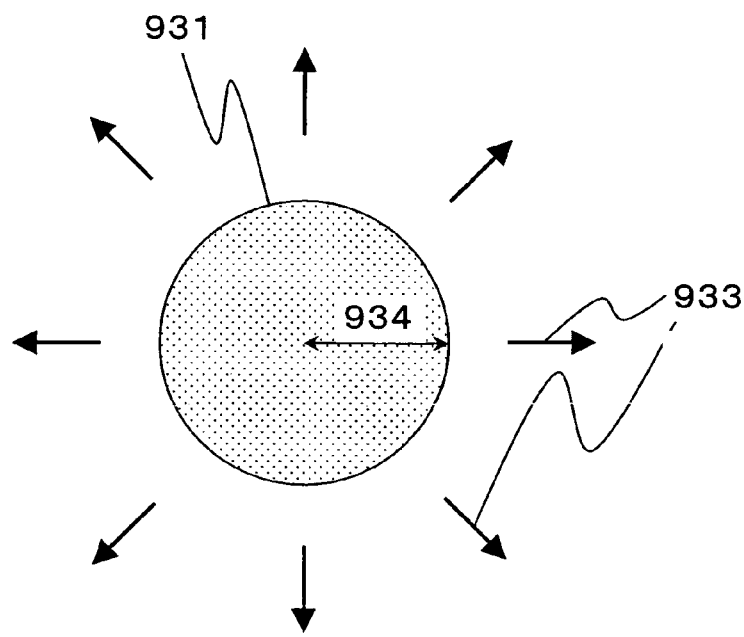
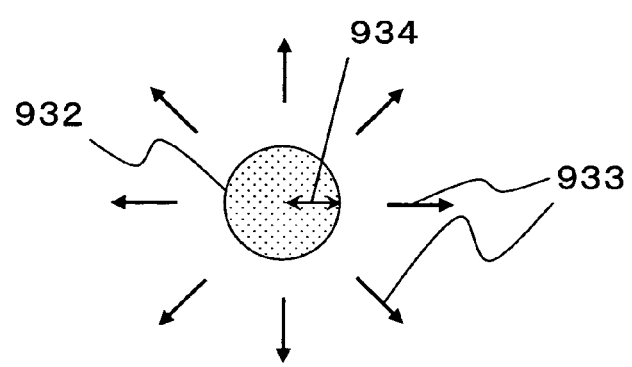

SEMICONDUCTOR FILM, METHOD FOR MANUFACTURING SEMICONDUCTOR FILM, SEMICONDUCTOR DEVICE, AND METHOD FOR MANUFACTURING SEMICONDUCTOR DEVICE

BACKGROUND OF THE INVENTION

1. Field of the Invention

The present invention relates to a semiconductor device including thin film transistors (TFTs), and a method for manufacturing the same. More particularly, the present invention relates to a semiconductor device including thin film transistors in which the active region is formed from a crystalline semiconductor film obtained by crystallizing an amorphous semiconductor film, and a method for manufacturing the same. The semiconductor device of the present invention, having thin film transistors formed on an insulative surface such as a glass substrate, can be used in various applications such as active matrix liquid crystal display devices, organic EL display devices, contact image sensors, and three-dimensional ICs, and other suitable apparatuses.

2. Description of the Related Art

In recent years, attempts have been made in the art to form high-performance semiconductor elements on an insulative substrate such as a glass substrate or an insulating film, aiming at realization of liquid crystal display devices and organic EL display devices having larger sizes and higher resolutions, contact image sensors operating at higher speeds with higher resolutions, three-dimensional ICs, etc. Particularly, a type of liquid crystal display device having the pixel section and the driving circuit on the same substrate is finding wide usage in various household appliances, in addition to a monitor of a personal computer (PC). For example, liquid crystal displays are used as television sets, replacing CRTs (Cathode-Ray Tubes), and front projectors are used for home entertainment applications such as for watching movies and for playing video games. Thus, the market for liquid crystal display devices has been growing at a remarkable rate. Moreover, system-on-panel devices have been developed actively, in which logic circuits such as a memory circuit and a clock generation circuit are formed on a glass substrate.

Displaying high-resolution images means an increase in the amount of data to be written to pixels, and the data needs to be written within a short time. Otherwise, it is not possible to display a moving picture that has a very large amount of data for high-definition display. Therefore, TFTs used in a driving circuit are required to operate at a high speed. In order to achieve high-speed operations, there is a demand for forming the TFTs using a crystalline semiconductor film having a desirable crystallinity, with which it is possible to obtain a high field-effect mobility.

The present inventors have developed a method for obtaining a desirable crystalline semiconductor film on a glass substrate. In this method, a metal element capable of promoting crystallization is added to an amorphous semiconductor film, which is then subjected to a heat treatment. With this method, a desirable semiconductor film having a uniform crystal orientation can be obtained through a heat treatment performed at a lower temperature and for a shorter time than other conventional methods.

However, when a silicon film crystallized with a catalyst element is used as it is as the semiconductor layer of a TFT, the TFT will have an abrupt increase in the off-state current. The catalyst element irregularly segregates in the semiconductor film, and the segregation is significant at crystal grain boundaries. It is believed that the segregation of the catalyst element creates leak paths for a current, resulting in the abrupt increase in the off-state current. Therefore, after the formation of the crystalline silicon film, it is necessary to reduce the catalyst element concentration in the semiconductor film by moving the catalyst element out of the semiconductor film. The step of removing the catalyst element will be hereinafter referred to as a "gettering process".

Various types of gettering processes and methods have been proposed in the art.

For example, Japanese Laid-Open Patent Publication No. 8-213317 discloses a technique of forming an amorphized region in a silicon material that has been crystallized by using a catalyst element, and subjecting the silicon material to a heat treatment so that the catalyst element is moved (gettered) into lattice defects in the amorphized region. The publication discloses one method in which the amorphous region (gettering region) is formed outside the semiconductor element region, and another method in which the source/drain region of the TFT is used as the amorphous region (gettering region). When the source/drain region is used as the gettering region, the manufacturing process can be simplified. However, the method requires an additional step of activating the source/drain region with laser light, or the like, since an amorphous region as it is cannot function as a source/drain region.

Japanese Laid-Open Patent Publication No. 10-270363 discloses a technique of selectively introducing a group VB element such as phosphorus into a portion of a silicon material that has been crystallized by using a catalyst element, and subjecting the silicon material to a heat treatment so that the catalyst element is moved (gettered) into the region where the group VB element has been introduced (gettering region). As the catalyst element is gettered into the region where the group VB element has been introduced, there is created a region where the catalyst element concentration is lowered (hereinafter referred to also as "low-catalyst-concentration region"), and this region is used to form the active region of the semiconductor element (TFT).

Japanese Laid-Open Patent Publication No. 9-107100 discloses a method in which a silicide component of the catalyst element is selectively etched away by using hydrofluoric acid.

The conventional gettering processes, including those disclosed in the three publications mentioned above, have various problems such as the provision of additional steps for the gettering process, which complicates the manufacturing process and increases the load on the manufacturing apparatus, thereby increasing the cost.

However, the most serious problem which has not been recognized or addressed to date, is that the conventional methods do not provide a sufficient gettering effect, and are not capable of sufficiently lowering the amount of the catalyst element remaining in the channel region of the TFT. That is, the conventional gettering methods consistently left catalyst in the channel region and did not address the fact that there were several different types of catalyst (e.g. Si, Ni, NiSi, $Ni_2Si$) remaining in the channel region that had to be removed to avoid serious problems with the resulting semiconductor films and elements (TFTs).

One of the simplest methods may be to etch away the catalyst element in the silicon film by using hydrofluoric acid, as disclosed in Japanese Laid-Open Patent Publication No. 9-107100. The present inventors have actually examined the amount of the catalyst element remaining after the gettering process of Japanese Laid-Open Patent Publication No. 9-107100, and discovered and confirmed through experiment that about one half of the catalyst element introduced into the silicon film remains unremoved. Even if the concentration of hydrofluoric acid is increased or the etching time is extended, the process reaches saturation when about one half of the catalyst element is removed, and the amount of the catalyst element cannot be reduced any further. Thus, the present inventors discovered and confirmed that this conventional gettering method is capable only of reducing the catalyst element concentration to about one half of that at the time of introduction of the catalyst element. As TFTs were produced with this method, about 10% to 20% (in terms of the number of products) of all the TFTs produced were defective with significant off-state leak current. This corresponds to 100,000 to 200,000 defective TFTs in an active matrix substrate (a form of semiconductor device) having 1,000,000 TFTs. Also about 10% to 20% of all the reference TFTs, produced with no gettering process at all, were defective with significant leak current, indicating that with the method disclosed in Japanese Laid-Open Patent Publication No. 9-107100 alone, the gettering process is not effective at all in improving the device characteristics.

In contrast, when a gettering region is formed by introducing a "gettering element" (the term "gettering element" as used herein refers to an element capable of attracting the catalyst element) such as an amorphous element or phosphorus so that the catalyst element in the silicon film is moved into the gettering region, as disclosed in Japanese Laid-Open Patent Publication No. 8-213317 or Japanese Laid-Open Patent Publication No. 10-270363, the present inventors discovered and confirmed that the amount of the catalyst element can be reduced by one order of magnitude or more. However, as TFTs were produced with the methods disclosed in these publications, there were defective TFTs with significant off-state leak current at a defect rate on the order of 0.1 to 1% for both of the methods, with a slight difference between their gettering effects due to the difference in the method of forming the gettering region. As about 10% to 20% of all the reference TFTs, produced with no gettering process at all, were defective with significant leak current, it can be seen that the methods of these publications clearly provide some gettering effect, improving the device characteristics. Nevertheless, there still are defective TFTs with significant leak current at a defect rate on the order of 1% even with these methods. This corresponds to some tens of thousands of defective TFTs in an active matrix substrate having 1,000,000 TFTs.

Thus, with the conventional gettering techniques, one needs to expect a TFT defect rate at least on the order of 0.1%, which is the lowest rate in the present inventors' experimental data. If an active matrix substrate for a liquid crystal or organic EL display device is produced with such a TFT defect rate, some pixel TFTs will have off-state leak current, resulting in bright spots (point defects), and the driver (driving circuit) section will have a line defect due to leak current in the sampling TFT section. As a result, the panel production yield will be decreased significantly.

An analysis has confirmed that a defective TFT with significant off-state leak current contains masses of a silicide of the catalyst element at the junction between the channel region and the drain region. Thus, the primary cause of the defect is the segregation of the catalyst element, and the secondary cause is the gettering of the catalyst element being insufficient. With the conventional techniques of the publications mentioned above, the catalyst element is not gettered sufficiently, a problem which was not recognized previously but was discovered and confirmed by the present inventors. Thus, even though these conventional gettering techniques are capable of producing some high-performance TFTs, with such high defect rates and poor reliabilities, they cannot be used for mass production.

SUMMARY OF THE INVENTION

In order to overcome the problems described above, preferred embodiments of the present invention provide a high-quality crystalline semiconductor film, and a semiconductor device with TFTs having very desirable characteristics obtained by using the crystalline semiconductor film, and also provide a manufacturing method capable of manufacturing such a semiconductor device at low cost without increasing the manufacturing steps.

An inventive semiconductor film is a semiconductor film formed on an insulative surface, wherein the semiconductor film is crystalline, includes a catalyst element capable of promoting crystallization of a semiconductor material of the semicondutor film, and includes at least one region having a plurality of minute holes. The at least one region may be substantially the entire region of the semiconductor film, or may be a plurality of regions thereof corresponding to those regions that are to be active regions (at least channel regions).

In a preferred embodiment, the at least one region of the semiconductor film includes substantially no higher semiconductor compound of the catalyst element, and the catalyst element is present in a form of solid solution in the crystalline semiconductor film.

In a preferred embodiment, the semiconductor film is substantially made of Si, the catalyst element is a metal element M, and the higher semiconductor compound has a composition of $M_xSi_y$ ($x<y$).

In a preferred embodiment, the at least one region of the semiconductor film includes substantially no lower semiconductor compound of the catalyst element.

In a preferred embodiment, the semiconductor film is substantially made of Si, the catalyst element is a metal element M, and the lower semiconductor compound has a composition of $M_xSi_y$ ($x \geq y$).

In a preferred embodiment, a concentration of the catalyst element in the at least one region of the semiconductor film is about $1 \times 10^{17}$ atoms/cm$^3$ or less.

Another inventive semiconductor film is a semiconductor film formed on an insulative surface, wherein the semiconductor film includes an active region formed from a crystalline semiconductor layer and including a catalyst element capable of promoting crystallization of a semiconductor material of the semiconductor film, the active region includes a first region, and a pair of second regions that are formed adjacent to and on opposite sides of the first region, and the first region of the crystalline semiconductor layer includes a plurality of minute holes.

In a preferred embodiment, the first region includes substantially no higher semiconductor compound of the catalyst element, and the catalyst element is in a form of solid solution in the crystalline semiconductor layer.

In a preferred embodiment, the crystalline semiconductor layer is substantially made of Si, the catalyst element is a metal element M, and the higher semiconductor compound has a composition of $M_xSi_y$ ($x<y$).

In a preferred embodiment, the first region includes substantially no lower semiconductor compound of the catalyst element.

In a preferred embodiment, the crystalline semiconductor layer is substantially made of Si, the catalyst element is a metal element M, and the lower semiconductor compound has a composition of $M_xSi_y$ ($x \geq y$).

In a preferred embodiment, a concentration of the catalyst element in the first region is about $1 \times 10^{17}$ atoms/cm³ or less.

In a preferred embodiment, a concentration of the catalyst element in the pair of second regions is higher than that in the first region.

In a preferred embodiment, a concentration of the catalyst element in the pair of second regions is in a range of about $1 \times 10^{18}$ atoms/cm³ to about $1 \times 10^{20}$ atoms/cm³.

In a preferred embodiment, the pair of second regions of the crystalline semiconductor layer include a plurality of minute holes.

In a preferred embodiment, the pair of second regions of the crystalline semiconductor layer include substantially no higher semiconductor compound of the catalyst element, and the catalyst element is in a form of solid solution in the crystalline semiconductor layer.

In a preferred embodiment, the crystalline semiconductor layer is substantially made of Si, the catalyst element is a metal element M, and the higher semiconductor compound has a composition of $M_xSi_y$ ($x<y$).

In a preferred embodiment, the pair of second regions include substantially no lower semiconductor compound of the catalyst element.

In a preferred embodiment, the crystalline semiconductor layer is substantially made of Si, the catalyst element is a metal element M, and the lower semiconductor compound has a composition of $M_xSi_y$ ($x \geq y$).

In a preferred embodiment, a concentration of the catalyst element in the pair of second regions is about $1 \times 10^{17}$ atoms/cm³ or less.

In a preferred embodiment, the pair of second regions include a group VB impurity element giving n-type conductivity.

In a preferred embodiment, the active region includes the first region, the pair of second regions, and a gettering region capable of attracting the catalyst element.

In a preferred embodiment, a concentration of the catalyst element in the gettering region is higher than that in the first region.

In a preferred embodiment, a concentration of the catalyst element in the gettering region is in a range of about $1 \times 10^{18}$ atoms/cm³ to about $1 \times 10^{20}$ atoms/cm³.

In a preferred embodiment, a concentration of the catalyst element in the gettering region is higher than that in the first region and that in the pair of second regions.

In a preferred embodiment, the gettering region has a larger amorphous component content than in the first region and in the pair of second regions.

In a preferred embodiment, the gettering region includes a group VB impurity element giving n-type conductivity and a group IIIB impurity element providing p-type conductivity.

In a preferred embodiment, the gettering region includes at least one rare gas element selected from the group consisting of Ar, Kr and Xe.

In a preferred embodiment, the plurality of minute holes are formed as a result of removing masses of a semiconductor compound of the catalyst element.

In a preferred embodiment, diameters of the plurality of minute holes are in a range of about 0.05 μm to about 1.0 μm.

In a preferred embodiment, an average surface roughness Ra of the crystalline semiconductor layer is in a range of about 4 nm to about 9 nm at least in the first region.

In a preferred embodiment, the catalyst element is at least one metal element selected from the group consisting of Ni, Co, Sn, Pb, Pd, Fe and Cu.

An inventive method for manufacturing a semiconductor film includes the steps of: (a) forming an amorphous semiconductor layer on an insulative surface; (b) adding a catalyst element capable of promoting crystallization to the amorphous semiconductor layer and then performing a first heat treatment so as to crystallize the amorphous semiconductor layer, thereby obtaining a crystalline semiconductor layer; (c) performing a first gettering process to remove the catalyst element from the semiconductor layer; and (d) performing a second gettering process that is different from the first gettering process to remove the catalyst element from the semiconductor layer.

The first gettering process of step (c) preferably includes removing at least large masses of a semiconductor compound of the catalyst element present in the crystalline semiconductor layer.

The second gettering process of step (d) preferably includes moving at least a portion of the catalyst element remaining in the crystalline semiconductor layer so as to form a low-catalyst-concentration region in the crystalline semiconductor layer, the low-catalyst-concentration region having a lower catalyst element concentration than in other regions.

In a preferred embodiment, the step (c) includes a step of removing a higher semiconductor compound of the catalyst element, and the low-catalyst-concentration region includes substantially no higher semiconductor compound.

In a preferred embodiment, the crystalline semiconductor layer is substantially made of Si, the catalyst element is a metal element M, and the higher semiconductor compound has a composition of $M_xSi_y$ ($x<y$).

In a preferred embodiment, the step (d) includes a step of moving the catalyst element forming a lower semiconductor compound of the catalyst element, and the low-catalyst-concentration region includes substantially no lower semiconductor compound.

In a preferred embodiment, the crystalline semiconductor layer is substantially made of Si, the catalyst element is a metal element M, and the lower semiconductor compound has a composition of $M_xSi_y$ ($x \geq y$).

In a preferred embodiment, the step (d) includes a step of moving the catalyst element present in a form of solid solution in the crystalline semiconductor layer.

In a preferred embodiment, the step (c) includes a step of selectively etching away a semiconductor compound of the catalyst element.

In a preferred embodiment, the etching process in the step (c) is performed by using acid including at least hydrogen fluoride as an etchant.

In a preferred embodiment, the step (d) includes a step of dissolving, in the crystalline semiconductor film, the catalyst element forming a semiconductor compound of the catalyst element remaining in the crystalline semiconductor film.

In a preferred embodiment, the step (d) includes a step of forming a gettering region or a gettering layer capable of attracting the catalyst element, and a step of performing the second heat treatment so that the catalyst element remaining in the crystalline semiconductor film is moved into the gettering region or the gettering layer.

In a preferred embodiment, the gettering region or the gettering layer has a larger amorphous component content than in other regions of the crystalline semiconductor film.

In a preferred embodiment, the gettering region or the gettering layer includes a group VB impurity element giving n-type conductivity.

In a preferred embodiment, the impurity element includes at least one element selected from the group consisting of P, As and Sb.

In a preferred embodiment, the gettering region or the gettering layer includes a group IIIB impurity element giving p-type conductivity.

In a preferred embodiment, the impurity element includes at least one of B and Al.

In a preferred embodiment, the gettering region or the gettering layer includes at least one rare gas element selected from the group consisting of Ar, Kr and Xe.

In a preferred embodiment, the impurity element and/or the at least one rare gas element included in the gettering region or the gettering layer are introduced by an ion implantation method.

In a preferred embodiment, the method further includes a step of removing the gettering region or the gettering layer after the step (d).

In a preferred embodiment, the step (b) includes a step of selectively adding the catalyst element to a region of the amorphous semiconductor film and then performing the first heat treatment so that a crystal growth process proceeds laterally from the region to which the catalyst element has been selectively added.

In a preferred embodiment, the step (b) includes a step of irradiating the crystalline semiconductor film with laser light after the first heat treatment.

In a preferred embodiment, the step (c) includes a step of selectively etching away a semiconductor compound of the catalyst element; and the etching step is performed after the first heat treatment step and before the laser light irradiation step in the step (b), and serves also as a surface cleaning step.

In a preferred embodiment, the step (b) includes a step of forming an insulating film on the crystalline semiconductor film after the first heat treatment step; the step (c) includes a step of selectively etching away a semiconductor compound of the catalyst element; and the etching step is performed after the first heat treatment step and before the insulating film formation step in the step (b), and serves also as a surface cleaning step.

In a preferred embodiment, the catalyst element is at least one metal element selected from the group consisting of Ni, Co, Sn, Pb, Pd, Fe and Cu.

Another inventive method for manufacturing a semiconductor device includes the steps of providing a semiconductor film manufactured by any of the methods for manufacturing a semiconductor film set forth above, and producing a thin film transistor including the semiconductor film in an active region thereof.

In a preferred embodiment, the active region includes a channel region, a source region and a drain region; and the step of producing the thin film transistor includes a step of forming at least the channel region in the low-catalyst-concentration region.

In a preferred embodiment, the step of producing the thin film transistor includes a step of forming the channel region, the source region and the drain region in the low-catalyst-concentration region.

An inventive semiconductor device includes a thin film transistor including any of the semiconductor films set forth above in an active region thereof.

In a preferred embodiment, the active region includes a channel region, a source region and a drain region, and at least the channel region is formed in the first region.

In a preferred embodiment, the channel region, a junction region between the channel region and the source region, and a junction region between the channel region and the drain region are formed in the first region.

In a preferred embodiment, the junction region between the channel region and the source region, and the junction region between the channel region and the drain region are each extending within about 2 µm from a junction boundary thereof.

In a preferred embodiment, the active region includes a channel region, a source region and a drain region, the channel region is formed in the first region, and the source region and the drain region are formed in the pair of second regions.

In a preferred embodiment, the semiconductor device further includes a gate insulating film formed on the semiconductor film over the channel region, and a gate electrode formed so as to oppose the channel region via the gate insulating film; and the gate electrode is formed from a metal film including at least one element selected from the group consisting of W, Ta, Ti and Mo.

An inventive electronic device includes any of the semiconductor devices set forth above.

In a preferred embodiment, the electronic device further includes a display section including a plurality of pixels, wherein a display signal is supplied to each of the plurality of pixels via the semiconductor device. The electronic device including a display section may be, for example, an active matrix liquid crystal display device or an organic EL display device, or any other suitable device including a semiconductor device according to preferred embodiments of the present invention.

Other features, elements, characteristics, steps and advantages of the present invention will become more apparent from the following detailed description of preferred embodiments with reference to the attached drawings.

BRIEF DESCRIPTION OF THE DRAWINGS

FIG. 1A to FIG. 1I are schematic cross-sectional views illustrating steps for manufacturing a semiconductor device according to a first preferred embodiment of the present invention.

FIG. 17 is a schematic diagram illustrating the mechanism of how Ni silicide masses dissolve into solid solution.

DETAILED DESCRIPTION OF PREFERRED EMBODIMENTS

The present inventors conducted an in-depth study concerning the mechanism of the gettering techniques disclosed in the publications mentioned above, and concerning the reasons why these techniques cannot provide sufficient gettering and consistently fail to completely remove the catalyst elements from the channel region. As a result, the present inventors have not only discovered the fact that the gettering techniques described above fail to completely remove the catalyst element, but have also successfully identified the cause of such failure, and based on these discoveries, have developed the present invention. The process of identifying the cause of the failures of the previous gettering processes, the results thereof, and preferred embodiments of the present invention, will now be described.

Consider a method in which a catalyst element in a silicon film is moved into the gettering region, where the catalyst element is nickel, as disclosed in Japanese Laid-Open Patent Publication No. 8-213317 or Japanese Laid-Open Patent Publication No. 10-270363. The movement of nickel can be modeled in terms of the diffusion migration of nickel. However, based simply on the diffusion coefficient of nickel, the movement of nickel should be completed by a heat treatment for a very short period of time. However, the movement of nickel actually requires an annealing step at a high temperature for a long period of time, which is not consistent at all with a calculation based on the diffusion coefficient. In practice, not all of the nickel is present in solid solution in the silicon film, but the majority thereof is precipitated. Taking this into consideration, consider another model assuming that diffusion migration occurs only for a portion of nickel up to an amount corresponding to the solid solubility of nickel in the silicon film. This model will now be described with reference to FIG. 13.

Figure 13:
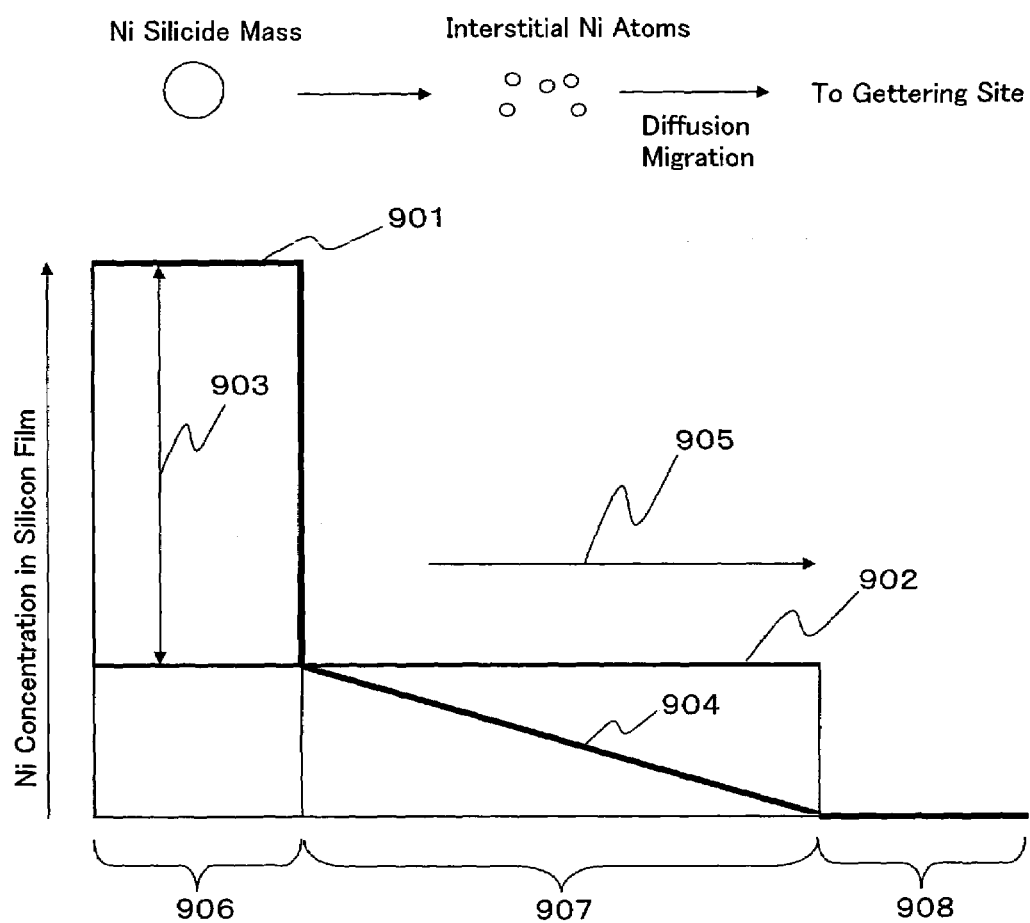
FIG. 13 is a schematic diagram illustrating a gettering mechanism for use in a method for manufacturing a semiconductor film according to various preferred embodiments of the present invention.

As illustrated in FIG. 13, this is a model in which an Ni silicide mass first dissolves into interstitial Ni atoms, which then move through the silicon film. In FIG. 13, a line 901 represents the Ni concentration in the silicon film, and a line 902 represents the solid solubility of Ni. A region 906 is a region that has not yet been gettered, where Ni 903 exceeding the solid solubility 902 is precipitated as Ni silicide masses. A region 907 is a region that has been gettered; where the Ni concentration 901 is less than or equal to the solid solubility 902. A region 908 is a gettering site (gettering region), where it is assumed that the gettering capability is infinite and the Ni concentration is zero. Thus, as illustrated in FIG. 13, an Ni concentration gradient 904 occurs at concentrations less than or equal to the solid solubility 902 at a temperature of the gettering heat treatment, with the amount of Ni silicide gradually decreasing through the diffusion migration of Ni in a direction 905 toward the gettering site 908. As a result, the gettering distance from the gettering site (the width of the region 907) increases gradually. This phenomenon is quite consistent with the actual experimental results.

Based on this theory, the gettering distance (the width of the region 907) can be represented by the following expression, indicating that the gettering distance L increases gradually over time t. In the expression below, $C_0$ is the solid solubility of Ni in the silicon film, and D is the diffusion coefficient of Ni in the silicon film, each being a function of the temperature T. $C_1$ is the original Ni concentration in the silicon film.

$$L = \sqrt{(2C_0 \cdot D \cdot t / C_1)}$$

Figure 14:
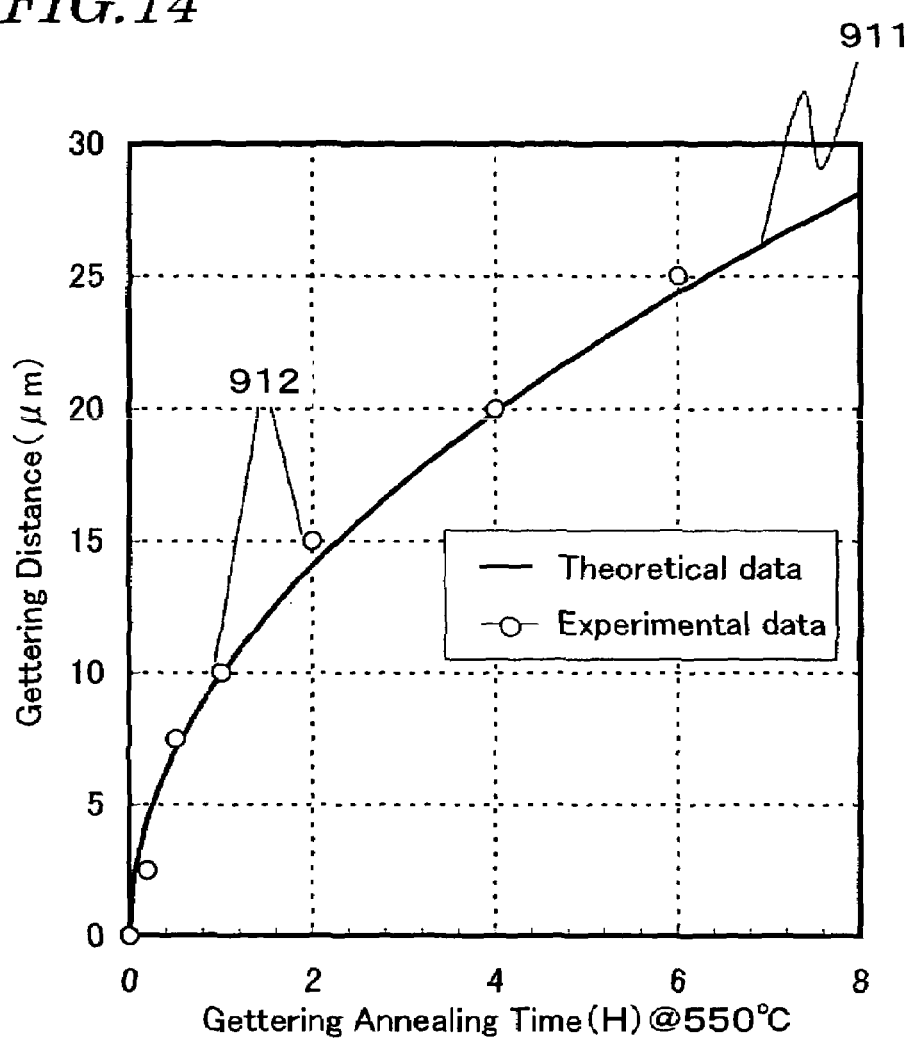
FIG. 14 is a graph illustrating the relationship between the gettering annealing time and the gettering distance.

FIG. 14 shows a curve 911 obtained by calculation based on this expression. In FIG. 14, it is assumed that the gettering heat treatment is performed at 550° C. The curve 911 based on the expression above indicates that the gettering distance increases gradually with respect to the gettering heat treatment time. FIG. 14 also shows plotted points 912 each representing an experimental gettering distance. In the experiment, residual Ni silicide masses were etched away with hydrofluoric acid, and the gettering distance was determined based on the presence/absence of etch pits. The gettering region was doped with boron in addition to phosphorus so as to enhance the gettering capability thereof. The gettering heat treatment was performed at 550° C. As can be seen from FIG. 14, the experimental data 912 and the theoretical data 911 are quite consistent with each other, suggesting that the theory about the gettering migration of Ni describe above is quite correct.

However, the theoretical data on the gettering distance often fails to match with experimental data for various conditions. One such condition is the gettering capability of the gettering region being insufficient, where the experimental data diverges from the theoretical data, which is obtained while assuming that the gettering capability is infinite. However, what is really a problem is that there are cases where the experimental gettering distance is significantly shorter than the theoretical gettering distance even if the gettering region is formed with a sufficient gettering capability. This is the fundamental cause of the problem with the conventional techniques, i.e., the catalyst element cannot be gettered sufficiently, thereby failing to completely suppress the abnormal off-state leak current for some TFTs.

Figure 15:
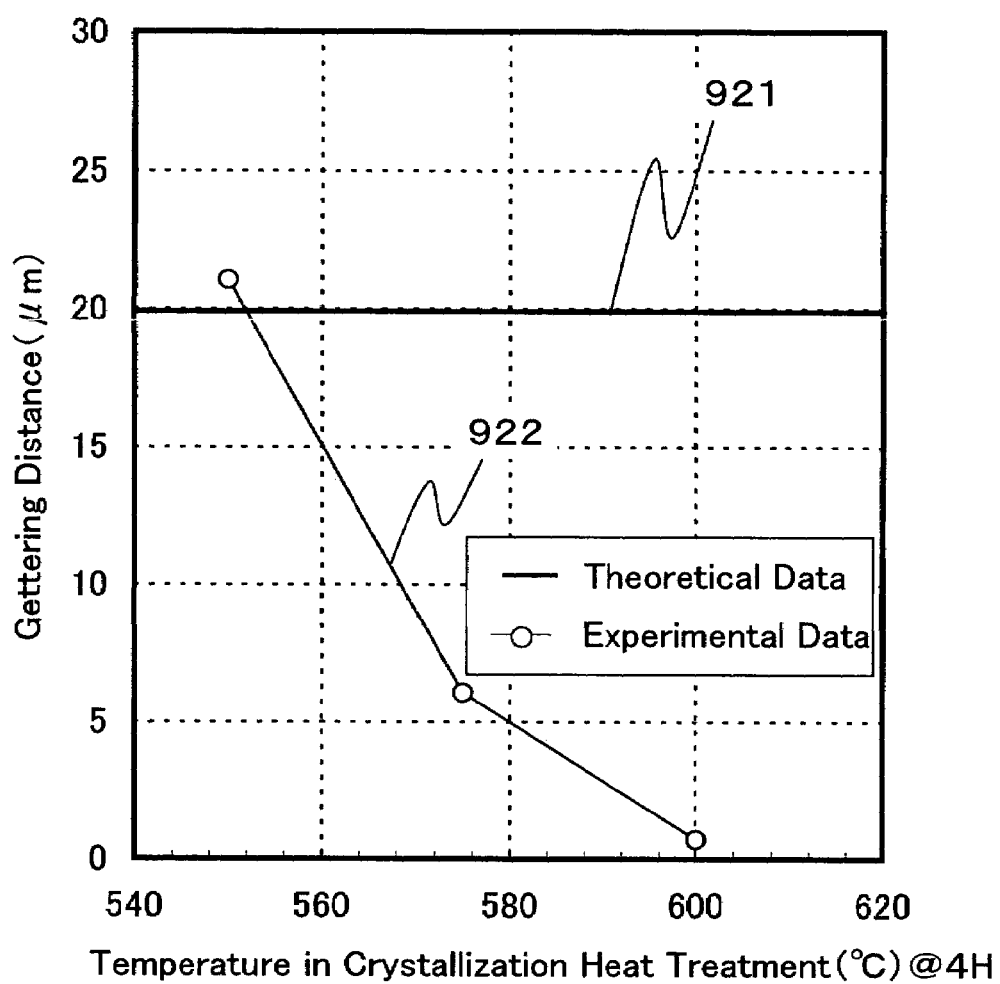
FIG. 15 is a graph illustrating the relationship between the temperature used in the crystallization heat treatment and the gettering distance.

The present inventors studied the cause, and found that the temperature used for the crystal growth with the addition of a catalyst element is a significant factor. The experimental results are shown in FIG. 15. The gettering heat treatment was performed at 550° C. for 4 hours, and the gettering distance was examined by the method described above. The horizontal axis represents the temperature used in the heat treatment for crystallization with a catalyst element (the first heat treatment). The heat treatment time is fixed to 4 hours. While a gettering distance 921 calculated based on the theory as described above is constant at about 20 µm irrespective of the crystallization temperature, an experimental gettering distance 922 is substantially dependent on the temperature used in the crystallization heat treatment, and is decreased significantly as the temperature used in the crystallization heat treatment is increased.

Figure 16:
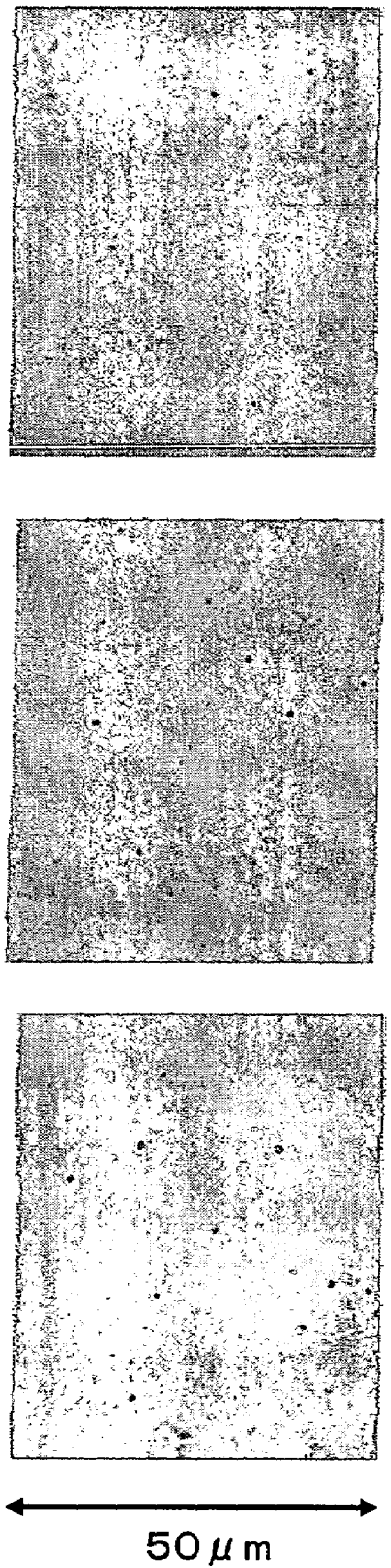
FIG. 16 shows optical microscope images of crystalline silicon films in which Ni silicide masses have been visualized (as voids) by being etched away using hydrofluoric acid after the crystallization heat treatment.

It is believed that this is because the segregation of Ni silicide after the crystal growth varies depending on the temperature used in the crystallization heat treatment. FIG. 16 shows optical microscope images each obtained by etching away and thus visualizing (as voids) Ni silicide masses with hydrofluoric acid, after the crystallization heat treatment. Black spots in these images are visualized etch pits (minute holes) produced by etching away Ni silicide masses and significantly damaging the base layer. The three images are for different crystallization annealing temperatures of 550° C., 575° C. and 600° C., respectively. There appears to be a tendency that the higher the annealing temperature is, the larger the Ni silicide etch pits are. Thus, it is believed that the size of the individual Ni silicide mass is generally larger as the temperature used in the crystallization heat treatment is higher.

In practice, masses of Ni silicide (a semiconductor compound of a catalyst element) present in the film after the crystal growth have various sizes. Some are particularly large, and some are relatively small. The crystal growth temperature influences the overall (average) size of the Ni silicide masses. With the conventional techniques, a TFT defect rate on the order of 0.1% occurs, thus failing to realize a sufficient production yield, even if the crystallization is performed at a temperature of 550° C. or less. Although the crystallization temperature is not the primary factor of the present invention, the experiment on the crystallization temperature described above provides important hint for solving the problems in the prior art described above.

That is, Ni-induced TFT defects still occur under conditions such that the catalyst element is apparently gettered completely, because of the various sizes of Ni silicide masses present in the film. This mechanism will now be described with reference to FIG. 17. In FIG. 17, a circle 931 schematically represents a large Ni silicide mass, and a circle 932 schematically represents a small Ni silicide mass. In the model of gettering migration described above with reference to FIG. 13, an Ni silicide mass first dissolves into interstitial Ni atoms, which then move through the silicon film. Thus, in order to getter Ni, it is necessary to first dissolve Ni silicide masses into interstitial Ni atoms in the silicon film. In the above expression obtained based on this model, the amount of time required for dissolving Ni silicide masses is calculated based only on the initial concentration. However, Ni silicide masses actually dissolve two-dimensionally, as indicated by arrows 933 in FIG. 17. Therefore, the dissolving time differs for different silicide masses depending on their sizes (radii 934). Dissolving a silicide mass having a larger radius R requires a longer heat treatment. Thus, in order to determine the amount of time that is actually required for the gettering process, a term for determining the dissolving time dependent on the silicide mass radius 934 needs to be added to the expression.

The fundamental cause of the problem with the conventional techniques was found to be that when there is a particularly large Ni silicide mass, which takes a long time to dissolve, it will still remain as an Ni silicide mass after a predetermined heat treatment time although the size thereof decreases gradually during the gettering heat treatment. Thus, such an Ni silicide mass is not apparently gettered completely. Ni silicide masses of various sizes are present in the film after the crystal growth, and some silicide masses of particularly large sizes cannot be gettered sufficiently with the conventional techniques, resulting in a TFT defect rate on the order of 0.1%.

Figure 18:
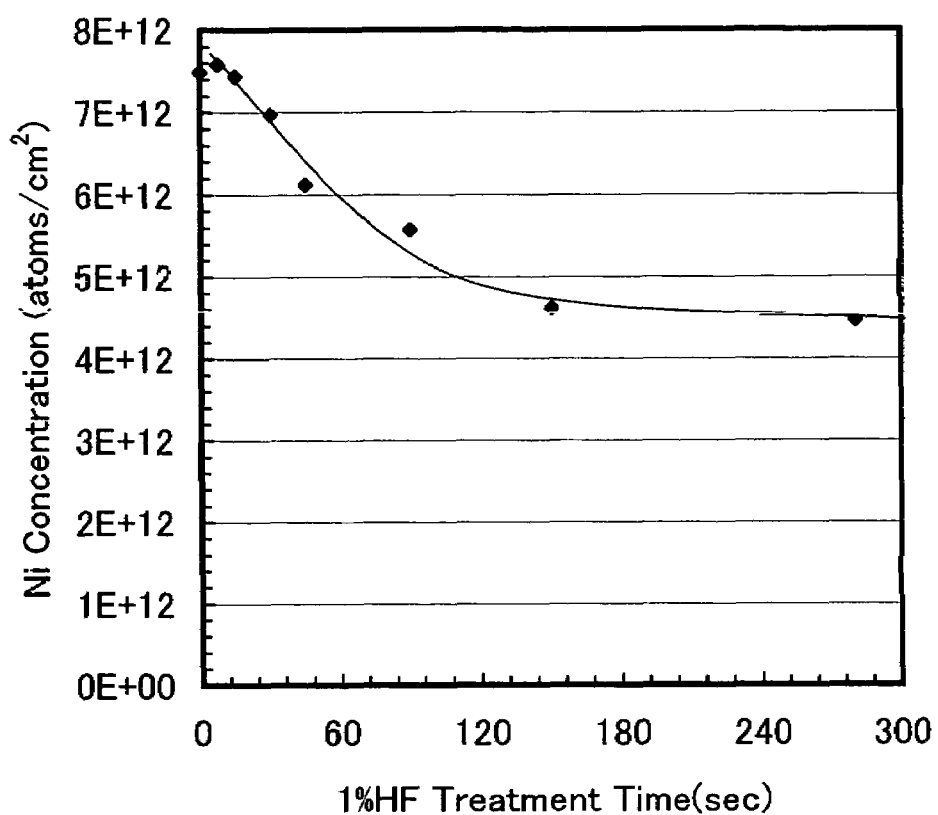
FIG. 18 is a graph illustrating the relationship between the treatment time of the hydrofluoric acid treatment on the surface of a silicon film that has been crystallized with a catalyst element, and the Ni concentration on the surface of the silicon film.
Figure 19:
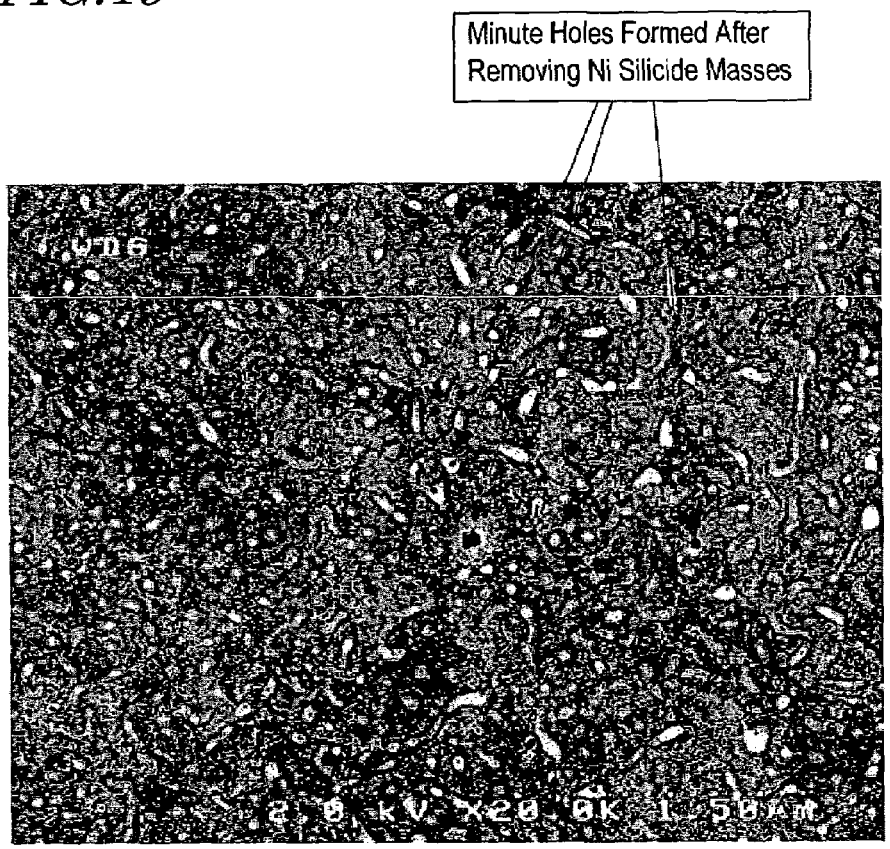
FIG. 19 is a scanning electron microscope (SEM) image illustrating a silicon film crystallized with Ni after Ni silicide masses have been etched away.

An effective method for removing such large Ni silicide masses is to selectively etch away the Ni silicide masses with hydrofluoric acid. FIG. 18 shows the relationship between the amount of time for a hydrofluoric acid treatment on the surface of a silicon film crystallized with a catalyst element, and the Ni concentration on the surface of the silicon film. The Ni concentration on the surface of the silicon film was measured by a total reflection X-ray fluorescence (TRXRF) method. With the TRXRF method, an approximately 10-nm outermost layer of the silicon film is examined. The concentration of the hydrofluoric acid used is preferably about 1%. Although the Ni concentration on the surface of the silicon film decreases as the hydrofluoric acid treatment time is extended, the effect saturates at a certain point, beyond which the concentration will not be further decreased by extending the treatment time. The Ni concentration at the saturation point is about one half of the initial concentration. Hydrofluoric acid selectively etches away Ni silicide, and does not etch away metal Ni. With respect to the composition of Ni silicide, the etching rate is high for a higher silicide ($NiSi_2$), and is low for other lower silicides (such as $Ni_2Si$ and NiSi). As a result, higher Ni silicide masses having relatively large sizes and a stable composition ($NiSi_2$) can be removed to some extent, whereas smaller silicide masses or lower silicide masses cannot be removed. Therefore, the effect of decreasing the Ni concentration saturates at about one half of the initial concentration, and it has been found that this method alone provides substantially no effect in reducing the TFT defect rate. After this treatment, the silicon film has holes where Ni silicide masses have been etched away. This is shown in FIG. 19. FIG. 19 is a scanning electron microscope (SEM) image.

Based on the experimental results described above, the present inventors developed a method of performing a multi-stage gettering process including a plurality of gettering steps while clearly specifying the object to be gettered at each stage, each gettering step being suited to the type and the state of the gettering object at that stage. Specifically, large $NiSi_2$ masses, which are difficult to getter with the conventional methods, are removed in one step, followed by another separate step of gettering the remaining small $NiSi_2$ masses and/or lower silicide masses, etc. This method proved to produce a significant synergistic effect, and the present inventors successfully gettered substantially all of the catalyst element. An active matrix liquid crystal display device including TFTs that were produced by using a crystalline semiconductor film obtained by this method had substantially no catalyst element-induced defects, thus achieving a high production yield that had not been achieved before.

Specifically, a method for manufacturing a semiconductor film of the present invention includes: (a) a first step of forming an amorphous semiconductor layer on an insulative surface; (b) a second step of adding a catalyst element capable of promoting crystallization to the amorphous semiconductor layer and then performing a first heat treatment so as to crystallize the amorphous semiconductor layer, thereby obtaining a crystalline semiconductor layer; (c) a third step (first gettering step) of performing a first getting process to remove the catalyst element from the amorphous semiconductor layer; and (d) a fourth step (second gettering step) of performing a second gettering process that is different from the first gettering process to remove the catalyst element from the amorphous semiconductor layer.

In the method described above, it is preferred that step (c) is a third step (first gettering step) of removing at least large masses of a semiconductor compound of the catalyst element present in the crystalline semiconductor layer; and that step (d) is a fourth step (second gettering step) of moving at least a portion of the catalyst element remaining in the crystalline semiconductor layer so as to form a low-catalyst-concentration region in the crystalline semiconductor layer, the low-catalyst-concentration region having a lower catalyst element concentration than in other regions.

A method for manufacturing a semiconductor device of another preferred embodiment the present invention preferably includes a fifth step of forming a channel region of a TFT by using the crystalline semiconductor film having a catalyst element concentration that has been reduced.

It is preferred that the step (c) includes a step of removing a higher semiconductor compound of the catalyst element, and the low-catalyst-concentration region includes substantially no higher semiconductor compound. For example, the crystalline semiconductor layer is preferably substantially made of Si, the catalyst element is a metal element M, and the higher semiconductor compound has a composition of $M_xSi_y$ (x<y).

It is preferred that the step (d) includes a step of moving the catalyst element forming a lower semiconductor compound of the catalyst element, and the low-catalyst-concentration region includes substantially no lower semiconductor compound. For example, the crystalline semiconductor layer is substantially made of Si, the catalyst element is a metal element M, and the lower semiconductor compound has a composition of $M_xSi_y$ (x≧y).

It is preferred that the step (d) includes a step of moving the catalyst element present in the form of solid solution in the crystalline semiconductor layer.

As described above, according to various preferred embodiments of the present invention, a multi-stage gettering process including a plurality of gettering steps is performed while clearly specifying the object to be gettered at each stage, each gettering step being suited to the type and the state of the gettering object (catalyst element) at that stage. Thus, it is possible to completely getter small masses of a catalyst element compound, low catalyst element compounds, etc., as well as large masses of a catalyst element compound, which are difficult to getter with the conventional single-step gettering processes. Moreover, by performing each gettering step while targeting a specific object, as in preferred embodiments of the present invention, the multi-stage gettering process provides a significant synergistic effect and thus a significant improvement over a conventional single-step gettering process.

In the first gettering step of preferred embodiments of the present invention, large masses of the semiconductor compound of the catalyst element present in the crystalline semiconductor film (which are typically made of a higher semiconductor compound) are selectively etched away.

In a preferred embodiment, the first gettering step is performed by exposing the surface of the crystalline semiconductor film to an etchant, the etchant being acid including at least hydrogen fluoride.

In contrast, the second gettering step is performed by first dissolving relatively small masses of the higher semiconductor compound of the catalyst element remaining in the crystalline semiconductor film and/or the lower semiconductor compound of the catalyst element into the semiconductor film, and then moving them into regions other than the channel region. In this step, the catalyst element present in the form of solid solution in the semiconductor film is also moved.

The second gettering step is preferably performed by performing a second heat treatment after providing a gettering region or a gettering layer capable of attracting the catalyst element, thereby first dissolving the catalyst element and the semiconductor compounds thereof remaining in the crystalline semiconductor film into the semiconductor film, and then moving them into the gettering region or the gettering layer.

With such a method including the first and second gettering steps as described above, the catalyst element compound masses (particularly large masses and masses of a higher semiconductor compound) that are difficult to getter with the conventional method (a method of moving them into regions other than the channel region through a heat treatment) can be effectively removed in the first gettering step. In the second gettering step, it is possible to effectively remove small masses of catalyst element compounds and lower semiconductor compounds of the catalyst element, which are unlikely to be removed by the selective etching process in the first gettering step, as well as the catalyst element present in solid solution in the crystalline semiconductor film. Although the catalyst element present in solid solution in the crystalline semiconductor film has relatively small influence on the TFTs to be produced as compared to the catalyst element compounds, it may form a compound and may re-precipitate during the operation of the TFTs. Therefore, it is preferably reduced to a level that is lower than the solid solubility thereof in the semiconductor film at least by one order of magnitude, rather than reducing it to a level that is barely lower than the solid solubility thereof in the semiconductor film. In the first gettering step, it is possible to selectively etch away only the catalyst element compounds without damaging the semiconductor film by using hydrofluoric acid.

In one preferred embodiment of the present invention, an amorphous silicon film is used as the amorphous semiconductor film to be formed on the insulative surface in the first step, and the semiconductor compound of the catalyst element to be reduced in the third step (first gettering step) is a silicide compound. Furthermore, the higher semiconductor compound of the catalyst element to be reduced in the third step (first gettering step) is a silicide compound having a composition of $NiSi_2$, and the lower semiconductor compounds of the catalyst element to be reduced in the fourth step (second gettering step) are primarily $Ni_2Si$ and NiSi silicide compounds.

In one preferred embodiment, the second step (a step of adding a catalyst element capable of promoting crystallization to the amorphous semiconductor film and then performing a first heat treatment so as to crystallize the amorphous semiconductor film, thereby obtaining a crystalline semiconductor film) is performed by selectively adding a catalyst element to a portion of the amorphous semiconductor film and then performing a first heat treatment so that the crystal growth proceeds laterally from each region to which the catalyst element has been selectively added.

In this way, in the laterally-grown crystal region, it is possible to obtain a desirable crystalline semiconductor film with a substantially uniform crystal growth direction, whereby it is possible to further increase the current driving power of a TFT. Moreover, in the laterally-grown crystal region, the catalyst element concentration after the crystal growth can be reduced by one to two orders of magnitude from that in the region where the catalyst element is added, thereby reducing the load for the subsequent gettering process.

How such a crystalline film with a substantially uniform crystal growth direction is obtained by the method as described above will now be described with reference to FIG. 20A, to FIG. 20C.

In the crystalline semiconductor film of preferred embodiments of the present invention (which is used at least for the formation of the channel region), the orientated crystal planes are primarily planes of <111> crystal zone. More specifically, among all the <111> crystal zone planes, the (110) plane orientation and the (211) plane orientation account for 50% or more in the crystalline semiconductor film. Typically, when crystallized without a catalyst element, a crystalline semiconductor film is likely to be oriented along the (111) plane, due to the influence of the insulator base film underlying the semiconductor film (particularly in the case of amorphous silicon dioxide). In contrast, when an amorphous semiconductor film is crystallized with the addition of a catalyst element, the orientated crystal planes of the obtained crystalline semiconductor film are primarily planes of <111> crystal zone, which is schematically shown in FIG. 20A. In FIG. 20A, reference numeral 281 is a base insulator, 282 is an amorphous semiconductor film in an uncrystallized region, 283 is a crystalline semiconductor film, and 284 is a semiconductor compound of a catalyst element, which is the driving force of the crystal growth.

Figure 20A:
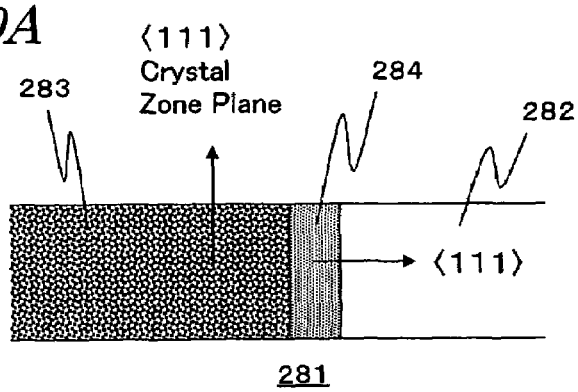
FIG. 20A to FIG. 20C are diagrams illustrating the crystal orientation of the crystalline semiconductor film obtained by various preferred embodiments of the present invention.

As illustrated in FIG. 20A, a catalyst element compound 284 is present at the front line of crystal growth and gradually crystallizes the amorphous region 282 from left to right in the figure. In this process, the catalyst element compound 284 tends to grow strongly in the <111> direction. As a result, the obtained crystalline semiconductor film is oriented in the <111> crystal zone planes, as illustrated in FIG. 20A.

Figure 20B:
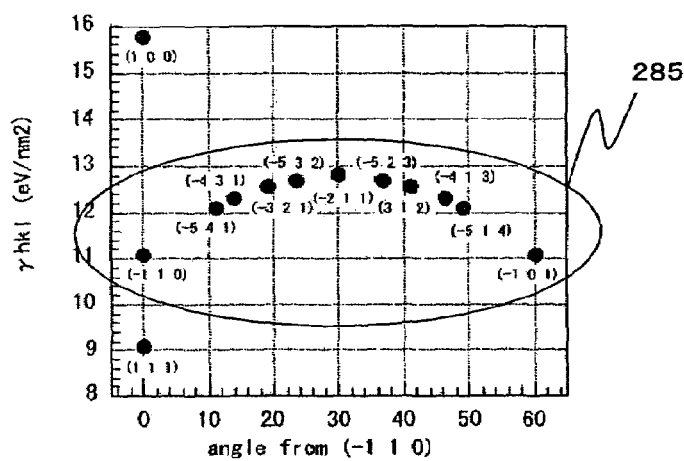

FIG. 20B illustrates the <111> crystal zone planes. In FIG. 20B, the horizontal axis represents the inclination angle with respect to the (−110) plane, and the vertical axis represents the surface energy. Reference numeral 285 denotes a group of crystal planes that are <111> crystal zone planes The (100) plane and the (111) plane are shown for the purpose of comparison, though they are not <111> crystal zone planes.

Figure 20C:
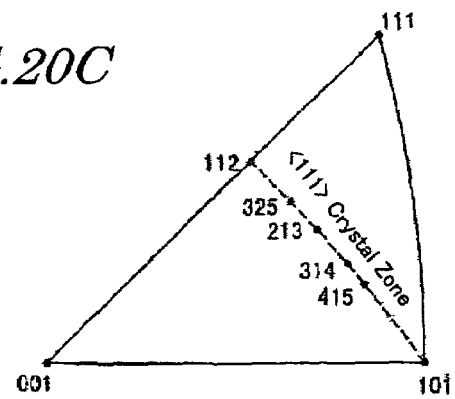

Moreover, FIG. 20C illustrates a standard triangle of crystal orientation. The distribution of the <111> crystal zone planes is as indicated by a broken line. The indices of typical poles are shown numerically. Among all the <111> crystal zone planes, the (110) plane or the (211) plane is dominant in the crystalline semiconductor film obtained in preferred embodiments of the present invention, and advantageous effects are obtained when these planes account for 50% or more of the planes present. These two crystal planes, having much higher hole mobilities than other planes, are capable of improving the performance of particularly a p-channel TFT, which is inferior in performance to an n-channel TFT, thereby also providing an advantage that it is easy to produce a well-balanced semiconductor circuit.

Note that it was confirmed by, for example, EBSP (Electron BackScattered diffraction Pattern) that the crystal grains (domains) of the crystalline semiconductor film of preferred embodiments of the present invention had such characteristics as described above.

In one preferred embodiment of the present invention, the process further includes a step of irradiating the crystalline semiconductor film with laser light after the first heat treatment. When the crystalline semiconductor film is irradiated with laser light, crystal grain boundary portions and minute residual amorphous regions (uncrystallized regions) are treated in a concentrated manner due to the difference in melting point between a crystalline portion and an amorphous portion. A crystalline silicon film that has been crystallized while introducing a catalyst element thereto is in the form of columnar crystals, with the inside thereof being monocrystalline. Therefore, if the crystal grain boundary portions are treated with laser light irradiation, the crystallinity is improved significantly, obtaining a desirable crystalline silicon film that is substantially monocrystalline across the entire surface of the substrate. As a result, the TFT on-state characteristics are improved significantly, thereby realizing a semiconductor device having an improved current driving power.

Specifically, a method for manufacturing a semiconductor device of a preferred embodiment of the present invention at least includes: a first step of forming an amorphous semiconductor film on an insulative surface; a second step of adding, to the amorphous semiconductor film, a first element (catalyst element) capable of promoting crystallization of the amorphous semiconductor film; a third step of performing a first heat treatment so as to crystallize the amorphous semiconductor film using a semiconductor compound of the catalyst element as nuclei, thereby obtaining a crystalline semiconductor film; a fourth step (first gettering step) of selectively etching away masses of the semiconductor compound of the catalyst element present in the crystalline semiconductor film; a fifth step of adding a second element (gettering element) capable of attracting the catalyst element to a portion of the crystalline semiconductor film; a sixth step (second gettering step) of performing a second heat treatment so that the catalyst element remaining in the crystalline semiconductor film is moved into the region (gettering region) to which the gettering element has been added; and a seventh step of forming a channel region of a TFT using the crystalline semiconductor film other than the region to which the gettering element has been added.

Alternatively, the method of another preferred embodiment of the present invention at least includes: a first step of forming an amorphous semiconductor film on an insulative surface; a second step of adding, to the amorphous semiconductor film, a first element (catalyst element) capable of promoting crystallization of the amorphous semiconductor film; a third step of performing a first heat treatment so as to crystallize the amorphous semiconductor film using a semiconductor compound of the catalyst element as nuclei, thereby obtaining a crystalline semiconductor film; a fourth step (first gettering step) of selectively etching away masses of the semiconductor compound of the catalyst element present in the crystalline semiconductor film; a fifth step of forming a gettering layer capable of attracting the catalyst element on the crystalline semiconductor film; a sixth step (second gettering step) of performing a second heat treatment so that the catalyst element remaining in the crystalline semiconductor film is moved into the gettering layer; and a seventh step of forming a channel region of a TFT using the crystalline semiconductor film.

It is preferred that the semiconductor device obtained by these manufacturing methods is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region and a drain region, wherein: a plurality of holes of minute diameters are present in the active region; the active region includes a catalyst element capable of promoting crystallization of an amorphous semiconductor film; and substantially all of the catalyst element is present in the form of solid solution in the semiconductor film in the active region. The traces of the semiconductor compound of the catalyst element that is selectively removed in the first gettering step are left in the form of holes of minute diameters in the semiconductor film. Therefore, the active region of the completed semiconductor device has a plurality of holes of minute diameters. Thus, the finished end product semiconductor device of preferred embodiments of the present invention has such a structure including such holes of minute diameters.

In the second step of adding a catalyst element to the amorphous semiconductor film, it is preferred that one or more element selected from Ni, Co, Sn, Pb, Pd, Fe and Cu is used as the catalyst element. One or more element selected from among these elements can provide a crystallization promoting effect even in very small amounts. Particularly, Ni can provide the most significant effect. The catalyst element alone does not provide the function, but it promotes crystal growth when bound to silicon in the silicon film to form a silicide. When crystallizing the amorphous silicon film, the crystalline structure of the silicide functions as a type of a mold, thereby promoting the crystallization of the amorphous silicon film. An Ni atom binds to two Si atoms to form $NiSi_2$. $NiSi_2$ exhibits a fluorite-like crystalline structure, which is very similar to that of diamond made of monocrystalline silicon. Moreover, the lattice constant of $NiSi_2$ is 5.406 Å (0.5406 nm), which is very close to that of a crystalline silicon diamond structure, i.e., 5.430 Å (0.5430 nm). Thus, $NiSi_2$ is an optimal mold for crystallizing the amorphous silicon film, and Ni is most preferably used as the catalyst element for producing a crystalline silicon film.

As a result of using such a catalyst element, one or more element selected from Ni, Co, Sn, Pb, Pd, Fe and Cu is present in the active region of the semiconductor device of preferred embodiments of the present invention as a catalyst element that promotes the crystallization of the amorphous semiconductor film. Moreover, the catalyst element concentration in the active region is reduced to about $1 \times 10^{14}$ to $1 \times 10^{17}$ atoms/$cm^3$, whereas the catalyst element concentration in a gettering region or a gettering layer is increased by two to four orders of magnitude.

Another manufacturing method of another preferred embodiment of the present invention at least includes: a first step of forming an amorphous semiconductor film on an insulative surface; a second step of adding, to the amorphous semiconductor film, a first element (catalyst element) capable of promoting crystallization of the amorphous semiconductor film; a third step of performing a first heat treatment so as to crystallize the amorphous semiconductor film using a semiconductor compound of the catalyst element as nuclei, thereby obtaining a crystalline semiconductor film; a fourth step (first gettering step) of selectively etching away masses of the semiconductor compound of the catalyst element present in the crystalline semiconductor film; a fifth step of etching the crystalline semiconductor film to form an active region (semiconductor layer) of a TFT; a sixth step of adding, to a source region and a drain region of the active region, a second element (gettering element) capable of attracting the catalyst element; and a seventh step (second gettering step) of performing a second heat treatment so that the catalyst element in the active region is moved from a channel region of the active region into the source region and the drain region to which the gettering element has been added. With this method, as compared to the other two manufacturing methods, gettering is performed by using the source/drain region of the active region. Therefore, it is not necessary to provide a specific dedicated extra step in addition to the second gettering step, thus simplifying and shortening the process. This is because this method performs gettering and activation of the source/drain region at the same time in the second heat treatment.

The semiconductor device obtained by this method is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region and a drain region, wherein: a plurality of holes having small diameters are present in the active region; the active region includes a catalyst element capable of promoting crystallization of an amorphous semiconductor film; and substantially all of the catalyst element is present in the form of solid solution in the semiconductor film at least in the channel region of the active region.

A semiconductor device according to still another preferred embodiment of the present invention is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region and a drain region, wherein: a plurality of holes having small diameters are present in the active region; the active region includes a catalyst element capable of promoting crystallization of an amorphous semiconductor film; and substantially all of the catalyst element is presented in the form of solid solution in the semiconductor film at least near the junction between the channel region and the source/drain region in the active region.

A semiconductor device according to still another preferred embodiment of the present invention is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region and a drain region, wherein: a plurality of holes having small diameters are present in the active region; the active region includes a catalyst element capable of promoting crystallization of an amorphous semiconductor film; and the catalyst element is present at a higher concentration in the source region and the drain region of the active region than in the channel region.

Moreover, a semiconductor device according to still another preferred embodiment is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region and a drain region, wherein: a plurality of holes having small diameters are present in the active region; the active region includes a catalyst element capable of promoting crystallization of an amorphous semiconductor film; and the catalyst element is present at a higher concentration in the source region and the drain region of the active region than near the junction between the channel region and the source/drain region.

Specifically, when using a method in which a gettering element is added to the source/drain region, after which the catalyst element in the active region is moved from the channel region to the source/drain region in the second heat treatment, the catalyst element is present at a concentration of about $1 \times 10^{18}$ to about $1 \times 10^{20}$ atoms/cm$^3$ in the source region and the drain region of the active region in the obtained semiconductor device. In contrast, the catalyst element concentration in the channel region or near the junction between the channel region and the source/drain region is reduced to about $1 \times 10^{14}$ to about $1 \times 10^{17}$ atoms/cm$^3$. Herein, "near the junction between the channel region and the source/drain region of the active region" is preferably a region within about 2 μm from the junction boundary between the channel region and the source/drain region. This is because the influence of the electric field localization at the junction extends across a region within about 2 μm from the junction.

Moreover, a semiconductor device according to still another preferred embodiment of the present invention includes a group VB impurity element giving n-type conductivity in the source region and the drain region of the active region. This is because a group VB impurity element functions as a gettering element, which will later be described in greater detail.

Another manufacturing method according to yet another preferred embodiment of the present invention at least includes: a first step of forming an amorphous semiconductor film on an insulative surface; a second step of adding, to the amorphous semiconductor film, a first element (catalyst element) capable of promoting crystallization of the amorphous semiconductor film; a third step of performing a first heat treatment so as to crystallize the amorphous semiconductor film using a semiconductor compound of the catalyst element as nuclei, thereby obtaining a crystalline semiconductor film; a fourth step (first gettering step) of selectively etching away masses of the semiconductor compound of the catalyst element present in the crystalline semiconductor film; a fifth step of etching the crystalline semiconductor film to form an active region (semiconductor layer) of a TFT; a sixth step of adding, to a region in the active region other than a channel region, a source region and a drain region, a second element (gettering element) capable of attracting the catalyst element, thereby forming a gettering region; and a seventh step (second gettering step) of performing a second heat treatment so that the catalyst element in the active region is moved from the channel region, the source region and the drain region of the active region into the gettering region.

In the sixth step of forming a gettering region, the gettering region is formed adjacent to the source region and/or the drain region and outside the region of the active region through which electrons or holes move. After this step, lines for electrically connecting TFTs together are formed in the source region and the drain region, and this line formation step is performed so that the route of the lines includes at least a portion of the source region and the drain region. This method also performs gettering and activation of the source/drain region at the same time in the second heat treatment. Therefore, it is not necessary to provide a specific dedicated extra step in addition to the second gettering step, thus simplifying and shortening the process. Furthermore, since a dedicated gettering region is provided separately from the source/drain region in the active region, the gettering region can be optimized, as compared to the method described above in which the source/drain region is used also as the gettering region. This is because with the method described above in which the source/drain region is used also as the gettering region, it is necessary to ensure the quality as a source/drain region (especially the low resistance) of the region, which imposes significant limitations. Note however that it is preferred that the gettering region is arranged at least so as not to interfere with the movement of carriers (electrons or holes) in the active region, as described above.

It is preferred that the semiconductor device obtained by this manufacturing method is a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and substantially all of the catalyst element is present in the form of solid solution in the semiconductor film at least in the channel region of the active region.

Alternatively, the semiconductor device may be a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and substantially all of the catalyst element is present in the form of solid solution in the semiconductor film at least near the junction between the channel region and the source/drain region in the active region.

Alternatively, the semiconductor device may be a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and substantially all of the catalyst element is present in the form of solid solution in the semiconductor film at least in the channel region, the source region and the drain region in the active region.

Moreover, in view of the positional relationship with respect to the gettering region, a semiconductor device of one preferred embodiment of the present invention may be a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and the catalyst element is present at a higher concentration in the gettering region of the active region than in the channel region.

Alternatively, the semiconductor device may be a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and the catalyst element is present at a higher concentration in the gettering region of the active region than near the junction between the channel region and the source/drain region.

Alternatively, the semiconductor device may be a semiconductor device including a TFT using a crystalline semiconductor film formed on an insulative surface as the active region, the TFT including an active region (semiconductor layer) on the insulative surface, a gate insulating film on the active region, and a gate electrode on the gate insulating film, the active region including a channel region, a source region, a drain region and a gettering region, wherein: a plurality of holes having small diameters are present in the active region; the active region includes a catalyst element capable of promoting crystallization of an amorphous semiconductor film; and the catalyst element is present at a higher concentration in the gettering region of the active region than in the channel region, the source region and the drain region.

Furthermore, in these semiconductor devices, the gettering region in the active region may be formed adjacent to the source region and/or the drain region and outside the region through which electrons and holes move in the active region, and lines for electrically connecting TFTs together are formed in the source region and the drain region so that the route of the lines includes at least a portion of the source region and the drain region. Specifically, a dedicated gettering region is provided separately from the source/drain region in the active region, and this region is maintained so as to be present even after the completion of the TFT. This is not just a structure that is obtained as a result of the manufacturing process, but the constant and permanent presence of the gettering region in the device is itself advantageous. This is because when the gettering region is absent in the device, heat is generated in no small measure from driving the TFT, whereby the catalyst element of a concentration less than or equal to the solid solubility, which is sometimes remaining, may be newly precipitated in the form of a semiconductor compound. In view of this, it is advantageous to have a strong gettering region present in the active region even after the completion of the semiconductor device so as to provide some gettering capability even when driving the TFT, thereby making such precipitation unlikely to occur. Furthermore, the gettering region can be optimized as a dedicated gettering region and thus can be provided with a strong gettering capability. As a result, the reliability of the TFT can be further increased. Note however that since the gettering region is optimized for a gettering process without taking into consideration other characteristics such as the resistance, the gettering region is preferably arranged at least so as not to interfere with the movement of carriers (electrons or holes) in the active region, as described above.

Thus, when using a method in which a gettering element is added to the gettering region, after which the catalyst element in the active region is moved into the gettering region in the second heat treatment, the catalyst element is present at a concentration of about $1 \times 10^{18}$ to about $1 \times 10^{20}$ atoms/cm$^3$ in the gettering region of the active region in the obtained semiconductor device. In contrast, the catalyst element concentration in the channel region, near the junction between the channel region and the source/drain region, or entirely across the channel region and the source/drain region is reduced to about $1 \times 10^{14}$ to about $1 \times 10^{17}$ atoms/cm$^3$.

Moreover, it is preferred that the gettering region of the active region includes a larger amount of an amorphous component than in other regions in the active region. The content of the amorphous component in each region can be determined by micro-laser Raman spectroscopy. The gettering region is characterized by its larger Pa/Pc ratio between the TO-phonon peak Pa of amorphous Si and the TO-phonon peak Pc of crystalline Si than those of other regions in the active region.

Gettering can be achieved in a gettering region by increasing the solid solubility of the gettering region for the catalyst element with respect to the other regions so as to move the catalyst element into the gettering region ("first gettering action"), or by forming defects or localized segregation sites for trapping the catalyst element so that the catalyst element is moved and trapped in the gettering region ("second gettering action"). Thus, by forming the gettering region of the active region so that it has a larger amorphous component content than in the other regions in the active region, it is possible to realize the effect of the second gettering action. IT is important that such a state of the gettering region is kept and remains even after the completion. of the TFT. If the amorphous gettering region is crystallized at a certain point in the process, the gettering effect will be small thereafter, whereby the catalyst element that has been moved away in a heat treatment may later come back in a reverse flow in a subsequent step. Moreover, even if such a reverse flow of the catalyst element is prevented from occurring during the manufacturing process, heat is generated in no small measure from driving the TFT, and the catalyst element that has been once moved into the gettering region may come back to the channel region in a reverse flow when driving the TFT, thus resulting in a reliability problem. Therefore, in a case where the gettering region is provided in the active region of the TFT, it is preferred that the region is maintained and remains amorphous even after the completion of the TFT so as to keep the same level of gettering capability as that during the gettering process at any time.

Moreover, with the semiconductor device structure and the method for manufacturing the same as described above, a gettering region is provided in the TFT active region separately from the source region and the drain region, and the gettering region is formed outside the region through which carriers (electrons or holes) move so as not to interfere with the movement of the carriers in the TFT, whereby an optimal amount of an n-type impurity or a p-type impurity can be added to the source/drain region in a separate step without being influenced by gettering considerations. Thus, even if the gettering region includes an amorphous component, the TFT is not influenced at all by the high resistance due to the gettering region. As a result, the process margin is increased, the throughput of the doping apparatus can be improved significantly, and the resistance of the source/drain region can be reduced, thereby improving the on-state characteristics of the TFT.

Moreover, the gettering region of the active region may include a group VB impurity element giving n-type conductivity and a group IIIB impurity element giving p-type conductivity. Alternatively, the gettering region of the active region may include one or more rare gas element selected from Ar, Kr and Xe. This is because these elements can function effectively as gettering elements, which will later be described in greater detail.

Moreover, when one uses, among all the semiconductor device structures described above, the one in which the gettering element is added to the source/drain region of the active region so that the catalyst element is thermally moved into that region, or the one in which a dedicated gettering region is formed in the active region so that the catalyst element is thermally moved into that region, the second heat treatment is performed for gettering and also for activating the source/drain region. Thus, since the second heat treatment is performed after the formation of a gate electrode, the material of the gate electrode is preferably one or more element or alloy thereof selected from W, Ta, Ti and Mo, which are high-melting metals having a high heat resistance.

Moreover, in the semiconductor film of preferred embodiments of the present invention, the holes of minute diameters present in the active region preferably have sizes (diameters) in the range of about 0.05 μm to about 1.0 μm. It can be seen that preferred embodiments of the present invention are highly effective when the diameter is within the range. If the diameter is below the range, the first gettering step will be insufficient, and the semiconductor compound of the catalyst element will not be sufficiently removed in the first gettering step. That is, the first gettering step will be finished before the saturation of the Ni concentration, as illustrated in the graph of FIG. 18. If the diameter is above the range, the treatment with hydrofluoric acid will be excessive, resulting in a serious etching damage to the underlying film. This leads to a reliability problem and a leak through the overlying gate insulating film. FIG. 19 shows the holes of minute diameters. As described above, FIG. 19 is a scanning electron microscope (SEM) image.

Moreover, in the semiconductor film of preferred embodiments of the present invention, the average surface roughness Ra in the channel region of the active region is preferably in the range of about 4 nm to about 9 nm. As can be seen from the SEM image of FIG. 19, the silicon film has surface irregularities. When a semiconductor film is melted/solidified to be recrystallized by being irradiated with laser light, the surface irregularities occur at boundary portions due to the difference in volumetric expansion coefficient, and the surface irregularities are commonly called "ridges". As described above, it is effective to form a crystalline semiconductor film in a heat treatment after adding a catalyst element thereto, and then irradiate the crystalline semiconductor film with laser light to further improve the crystallinity, and these steps produce such ridges. The surface roughness being below the range specified above means that the laser power is not sufficient, thereby failing to sufficiently improve the crystallinity. The surface roughness being above the range means that the laser power is excessive, in which case the crystallinity deteriorates at some locations and varies significantly from one location to another, and the reliability (voltage endurance of the gate insulating film) may be affected.

In the manufacturing method of preferred embodiments of the present invention as described above, it is preferred that the method includes a step of irradiating the crystalline semiconductor film with laser light after the first heat treatment, and the fourth step (first gettering step) of selectively etching away the semiconductor compound of the catalyst element present in the crystalline semiconductor film is performed as a single step together with the step of cleaning the substrate surface preceding the laser light irradiation step. While the reason for adding the laser light irradiation step is to further improve the crystallinity of the crystalline semiconductor film, as described above, by treating the surface of the semiconductor film with hydrofluoric acid as a single step together with the cleaning step preceding this step, it is possible to eliminate the need to perform the first gettering step as a separate step, thereby shortening and simplifying the process.

Alternatively, it is preferred that the method includes a step of forming a gate insulating film on the crystalline semiconductor film, and the fourth step (first gettering step) of selectively etching away the semiconductor compound of the catalyst element present in the crystalline semiconductor film is performed as a single step together with the step of cleaning the substrate surface preceding the formation of the insulating film (typically a gate insulating film). Before the formation of the gate insulating film, it is necessary to remove a natural oxide film on the surface of the semiconductor film, which is to be the channel interface. Therefore, by performing the cleaning step with hydrofluoric acid as a single step together with the first gettering step, it is possible to shorten and simplify the process. Note however that whether the first gettering step is performed as a single step together with the cleaning step preceding the laser irradiation or the cleaning step preceding the formation of the gate insulating film, it is necessary to appropriate set the process conditions for the first gettering step. For example, the process time of the cleaning step may need to be extended in view of gettering, as compared to a conventional cleaning step whose purpose is only to remove the natural oxide film. Specifically, it is preferred to set conditions such that the residual Ni concentration saturates as illustrated in FIG. 18.

In a manufacturing method of one preferred embodiment of the present invention, the fifth step of adding, to a portion of the crystalline semiconductor film, a second element (gettering element) capable of attracting the catalyst element is preferably performed by an ion doping method, and the region where the gettering element is added is more amorphized than other regions. Thus, the gettering region is amorphized to deliberately form crystal defects or localized segregation sites for trapping the catalyst element so as to utilize the second gettering action as described above. With this manufacturing method, the gettering region is formed outside the active region, and the gettering region does not remain in the active region after the second gettering step. Therefore, the gettering region being amorphized does not cause a problem.

Moreover, with the method in which a gettering element is added to the source/drain region of the active region so that the catalyst element is moved into that region, the sixth step of adding, to the source region and the drain region of the active region, a second element (gettering element) capable of attracting the catalyst element is performed by an ion doping method, and the source and drain regions to which the gettering element is added are more amorphized than the channel region. Also in this case, the object is to effect the second gettering action by promoting the amorphization of the source/drain region. Note however that the source/drain regions need to have a low resistance eventually because they are functional elements of the TFT. Therefore, it is preferred that after the amorphization is promoted, the crystallinity of these regions is recovered to some extent during the second heat treatment for gettering.

Moreover, in one preferred embodiment of the present invention where a dedicated gettering region is formed in the active region separately from the source/drain region, the sixth step of forming a gettering region by adding, to a region in the active region other than the channel region, the source region and the drain region, a second element (gettering element) that is capable of attracting the catalyst element is performed by an ion doping method, and the gettering region to which the gettering element is added is more amorphized than the channel region, the source region and the drain region. Also in this case, the object is to effect the second gettering action by promoting the amorphization of the gettering region. Note however that since the gettering region may be left amorphous after the completion of the TFT, the freedom of the process is improved. For a semiconductor device, it is rather preferable that the amorphous component content is larger in the gettering region in the active region, as described above.

Preferably, the gettering element used in the manufacturing methods described above is one or more group VB element selected from P, As and Sb. When these group VB elements are introduced into a silicon film, the solid solubility of the region for the catalyst element is increased. Thus, the catalyst element is gettered by the first gettering action. Among these elements, phosphorus has a particularly high effect. Moreover, in an n-channel TFT, these elements can be used as they are in the source/drain region.

More preferably, one or more group IIIB element selected from B and Al is used, in addition to one or more group VB element selected from P, As and Sb, as the gettering element. It has been confirmed that although a group VB element alone has some gettering capability, a greater gettering effect can be obtained when a group IIIB element is additionally introduced. If boron is doped, in addition to phosphorus, into the silicon film in the gettering region, the gettering mechanism changes. With only phosphorus, the gettering process is diffusion-migration-type gettering (the first gettering action) utilizing the difference in solid solubility for the catalyst element between the gettering region and the non-doped non-gettering region. When boron is used additionally, the catalyst element is rather likely to be precipitated in the gettering region, whereby gettering to defects or segregation sites (the second gettering action) becomes more dominant. The gettering effects are increased synergistically. Note however that since an element giving p-type conductivity is doped in addition to an element giving n-type conductivity, the gettering region into which these elements are introduced is likely to have a high resistance. Therefore, this approach is more effective with the method in which a dedicated gettering region is provided outside the source/drain region. Preferred concentrations of the impurity elements contained in the gettering region are as follows. The concentration of the group VB element is preferably about $1 \times 10^{19}$ to about $1 \times 10^{21}/cm^3$, and the concentration of the group IIIB element is preferably about $1.5 \times 10^{19}$ to about $3 \times 10^{21}/cm^3$. A sufficient gettering efficiency is obtained within these ranges.

Other gettering elements that can be used in the manufacturing method of preferred embodiment of the present invention include one or more rare gas element selected from Ar, Kr and Xe. The presence of these rare gas elements in the gettering region causes large lattice strain, whereby the second gettering action utilizing defects/segregation sites is effected very strongly. Moreover, Ar is most effective among these rare gas elements, and the greatest effect can be obtained when Ar is used. The concentration of the rare gas element contained in the gettering region is preferably in the range of about $1 \times 10^{19}$ to about $3 \times 10^{21}$ atoms/cm$^3$. A sufficient gettering efficiency is obtained within this range.

In a method for manufacturing a semiconductor film according to a preferred embodiment of the present invention, a gettering layer capable of attracting the catalyst element is formed on the crystalline semiconductor film, and the second heat treatment is performed, so that the catalyst element remaining in the crystalline semiconductor film is moved into the gettering layer. In this method, it is preferred that the gettering layer is removed after the sixth step (second gettering step) of performing the second heat treatment so as to move the catalyst element remaining in the crystalline semiconductor film into the gettering layer. In this way, unlike the other methods, it is possible to obtain a crystalline semiconductor film having no gettering region, where the catalyst element is collected, across the entire surface of the substrate, thereby increasing the freedom in the subsequent steps and the freedom in the design layout. A semiconductor film of a preferred embodiment of the present invention produced as described above is a film of a semiconductor formed on an insulative surface, wherein the semiconductor film is crystalline, includes a catalyst element capable of promoting crystallization of the semiconductor, and has a plurality of minute holes. The concentration of the catalyst element may be lowered substantially across the entire region of the semiconductor film, as described above. Alternatively, the concentration of the catalyst element may be lowered in regions corresponding to those regions that are to be active regions (at least channel regions).

The gettering layer is preferably an amorphous semiconductor film including one or more group VB element selected from P, As and Sb. Alternatively, the gettering layer may be an amorphous semiconductor film including both one or more group VB element selected from P, As and Sb and one or more group IIIB element selected from B and Al. Alternatively, the gettering layer may be an amorphous semiconductor film including one or more rare gas element selected from Ar, Kr and Xe. A reason for using a silicon film in an amorphous state is that it is then possible to effect the second gettering action utilizing crystal defects/segregation sites as described above. A reason for using element species is that element species can function as gettering elements. Also, the gettering region formed in the semiconductor film may be removed.

First Preferred Embodiment

The first preferred embodiment of the present invention will be described with reference to FIG. 1A to FIG. 1l. The first preferred embodiment is directed to a method for producing an n-channel TFT on a glass substrate. The TFT of the present preferred embodiment can be used as a device component in a thin film integrated circuit, as well as in the driver circuit or the pixel section of an active matrix liquid crystal display device or an organic EL display device. FIG. 1A to FIG. 11 are cross-sectional views sequentially illustrating steps for producing the n-channel TFT.

First, as illustrated in FIG. 1A, a base film 103 preferably made of silicon oxide is formed on a glass substrate 101 to a thickness of about 300 nm to about 500 nm by a plasma CVD method, for example. The silicon oxide film is provided in order to prevent diffusion of impurities from the glass substrate 101. Then, an intrinsic (I type) amorphous silicon film (a-Si film) 104 is deposited to a thickness of about 20 nm to about 80 nm (e.g., about 40 nm). In the present preferred embodiment, the deposition of the a-Si film 104 was performed by using a parallel-plate plasma CVD apparatus at a temperature of about 250° C. to about 400° C. (e.g., about 350° C.) while using an $SiH_4$ gas and an $H_2$ gas as material gases.

Then, a small amount of nickel 105 is added to the surface of the a-Si film 104. The catalyst element to be used is preferably one or more element selected from nickel (Ni), cobalt (Co), tin (Sn), lead (Pb), palladium (Pd), iron (Fe) and copper (Cu). Alternatively, ruthenium (Ru), rhodium (Rh), osmium (Os), iridium (Ir), platinum (Pt), gold (Au), etc., may be used. The addition of a small amount of nickel 105 was performed by holding a nickel solution on the a-Si film 104, uniformly spreading the solution across the substrate 101 by a spinner, and then drying the substrate 101. In the present preferred embodiment, nickel acetate was used as the solute, water was used as the solvent, and the nickel concentration in the solution was controlled to be 10 ppm. This state is shown in FIG. 1A. The amount of the catalyst element added is very small, and the catalyst element concentration on the surface of the a-Si film 104 is controlled by a total reflection X-ray fluorescence (TRXRF) method. In the present preferred embodiment, the concentration was about $5\times10^{12}$ atoms/cm$^2$.

Then, a first heat treatment is performed in an inert atmosphere (e.g., a nitrogen atmosphere). The annealing process is performed at about 530° C. to about 600° C. for approximately 30 minutes to 8 hours. For example, in the present preferred embodiment, the heat treatment was performed at about 550° C. for approximately 4 hours. In this heat treatment, nickel 105 added to the surface of the a-Si film 104 diffuses into the a-Si film 104 while being silicified, and the crystallization of the a-Si film 104 proceeds using the silicide as nuclei. As a result, the a-Si film 104 is crystallized into a crystalline silicon film 104a. Note that while the crystallization process is herein performed in a heat treatment using a furnace, it may alternatively be performed by an RTA (Rapid Thermal Annealing) apparatus using a lamp, or the like, as a heat source.

Then, as illustrated in FIG. 1B, the surface of the crystalline silicon film 104a is exposed to acid 106 including hydrogen fluoride, thereby performing the first gettering step. In the present preferred embodiment, this step was performed by a dipping method (where a substrate is dipped entirely in a solution) using a 1% hydrofluoric acid solution. With hydrofluoric acid of such a concentration, the treatment time is preferably about 60 seconds to about 180 seconds (about 120 seconds in the present preferred embodiment).

After the substrate was dipped in the hydrofluoric acid solution, the solution was substituted with pure water, and the substrate was washed and spun dry. Through this step, Ni silicide masses (particularly large masses and masses of $NiSi_2$) present in the crystalline silicon film are selectively etched away by hydrofluoric acid 106, thereby leaving minute holes 107 in the crystalline silicon film 104a as traces of the etched-away silicide masses. The diameters of the holes were about 0.1 μm to about 0.8 μm.

Then, as illustrated in FIG. 1C, the crystalline silicon film 104a obtained by the heat treatment is irradiated with laser light 108 to further crystallize the crystalline silicon film 104a, thereby obtaining a crystalline silicon film 104b with an improved crystallinity. The dipping treatment with hydrofluoric acid 106 illustrated in FIG. 1B serves also as a pre-cleaning step for this laser irradiation step. The laser light used in this step may be XeCl excimer laser (wavelength: about 308 nm, pulse width: about 40 nsec) or KrF excimer laser (wavelength: about 248 nm). The laser light is shaped so as to form an elongate beam spot on the surface of the substrate 101 so that the substrate is crystallized across the entire surface thereof by being scanned with the laser beam in the direction perpendicular to the longitudinal direction of the beam spot. The substrate surface is preferably scanned so that adjacent beam traces have an overlap therebetween and any point on the surface of the crystalline silicon film 104a is scanned with laser light a plurality of times, thereby improving the uniformity. The crystalline silicon film 104a obtained by solid-phase crystallization as described above is turned into the crystalline silicon film 104b of a higher quality as the crystal defects are reduced through the melting/solidification process by the laser irradiation.

Then, as illustrated in FIG. 1D, a photoresist mask 109 is formed on the crystalline silicon film 104b. The mask 109 is arranged so that Portions of the crystalline silicon film 104b are masked in an island-shaped pattern. The masked portions of the crystalline silicon film will be the active regions (semiconductor layers) of the TFTs to be produced.

Next, as illustrated in FIG. 1D, the substrate 101 is ion-doped with phosphorus 110 from above the substrate 101 and across the entire surface thereof. The Ion doping was performed by using phosphine ($PH_3$) as the doping gas with an acceleration voltage of about 5 kV to about 15 kV, and a dose of about $5\times10^{15}$ cm$^{-2}$ to about $2\times10^{16}$ cm$^{-2}$ (e.g., about $1\times10$ cm$^{-2}$). Through this step, the exposed regions of the crystalline silicon film 104b are doped with phosphorus 110, thereby forming phosphorus-doped regions 111. In the region 111, the crystalline structure is destroyed to some extent by the ion doping step, thus amorphizing the region 111. The masked regions of the crystalline silicon film 104b are not doped with phosphorus 110, whereby the crystalline structure thereof is not destroyed.

Then, the photoresist mask 109 is removed by ashing (oxygen plasma treatment) and by using a stripping solution, after which the second heat treatment is performed in an inert atmosphere (e.g., a nitrogen atmosphere). In the present preferred embodiment, the heat treatment was performed in a nitrogen atmosphere at about 500° C. to about 600° C. for approximately 30 minutes to 8 hours (e.g., at about 550° C. for approximately 4 hours). In this process, the phosphorus-doped, amorphized region 111 functions as a gettering region, thereby performing the second gettering step. In the region 111, defects, segregation sites, etc., capable of trapping nickel have been formed, while the solid solubility of the silicon film for nickel has been increased significantly by the phosphorus doping. Utilizing these gettering powers, nickel 105 remaining in the masked portion of the crystalline silicon film is moved into the gettering region 111 as indicated by arrow 114, as illustrated in FIG. 1E.

In the second gettering step, first, nickel present in the form of solid solution in the crystalline silicon film is moved into the gettering region 111. As a result, the nickel concentration in the silicon film is decreased, whereby Ni silicide masses (particularly small masses and masses of lower semiconductor compounds such as NiSi and $Ni_2Si$) remaining in the film start dissolving in the silicon film. Then, the newly dissolved Ni atoms are also moved into the gettering region 111. Eventually, small $NiSi_2$ masses and lower silicide masses such as NiSi and $Ni_2Si$ masses, which could not be removed in the first gettering step, are completely removed, and the concentration of solid-solution nickel is also reduced. As measured by secondary ion mass spectrometry (SIMS), the nickel concentration in the masked regions of the crystalline silicon film 104b was decreased to about $5 \times 10^{15}$ atoms/$cm^3$, which is close to the measurable lower limit. Needless to say, nickel remaining in this region is not present in the form of silicides but in the form of solid solution, i.e., as interstitial nickel atoms.

Then, a device isolation process is performed by removing unnecessary portions of the crystalline silicon film 104b. Through these steps, an island-shaped crystalline silicon film 115 is formed, as illustrated in FIG. 1F, which is to be the active region (the source/drain region and the channel region) of the TFT.

Then, a silicon oxide film having a thickness of about 20 nm to about 150 nm (about 100 nm in the present preferred embodiment) is deposited, as a gate insulating film 116, so as to cover the crystalline silicon film 115 to be the active region. The silicon oxide film was formed by decomposing and depositing TEOS (Tetra Ethoxy Ortho Silicate) by an RF plasma CVD method with oxygen at a substrate temperature of about 150° C. to about 600° C. (preferably about 300° C. to about 450° C.). Alternatively, the silicon oxide film may be formed by a low-pressure CVD method or an atmospheric pressure CVD method using TEOS with an ozone gas at a substrate temperature of about 350° C. to about 600° C. (preferably about 400° C. to about 550° C.).

Then, aluminum is deposited to a thickness of about 400 nm to about 800 nm (e.g., about 600 nm) by a sputtering method. Then, the aluminum film is patterned to form a gate electrode 117. Furthermore, the surface of the aluminum electrode is anodized to form an oxide film 118. This state is shown in FIG. 1G. When the present preferred embodiment is applied to pixel TFTs of a liquid crystal display device, or the like, the gate electrode 117 also forms a gate bus line as viewed from above. The anodization is performed in an ethylene glycol solution including about 1% to about 5% of tartaric acid by first increasing the voltage to about 220 V with a constant current supply and then holding the voltage for about 1 hour, after which the anodization is terminated. The thickness of the obtained oxide film 118 is approximately 300 nm. Note that since the thickness of the oxide film 118 defines the length of the offset gate region to be formed in the subsequent ion doping step, the length of the offset gate region can be determined in this anodization step.

Then, as illustrated in FIG. 1H, an n-type impurity (phosphorus) 123 is implanted into the active region by an ion doping method using the gate electrode 117 and the surrounding oxide film 118 as a mask. Phosphine ($PH_3$) is used as the doping gas, the acceleration voltage is preferably set to about 60 kV to about 90 kV (e.g., about 80 kV), and the dose is preferably set to about $1 \times 10^{15}$ $cm^{-2}$ to about $8 \times 10^{15}$ $cm^{-2}$ (e.g., about $2 \times 10^{15}$ $cm^{-2}$). The region 124 that is doped with an impurity later becomes the source/drain region of the TFT, and a region 120 that is masked with the gate electrode 117 and the surrounding oxide film 118 and is not doped with an impurity later becomes the channel region of the TFT. Then, the substrate is annealed by being irradiated with laser light from above the substrate so as to activate the implanted n-type impurity while improving the crystallinity of portions where the crystallinity has been deteriorated through the impurity introducing step as described above. In this step, XeCl excimer laser (wavelength: about 308 nm, pulse width: about 40 nsec) was used with an energy density of about 150 mJ/$cm^2$ to about 400 mJ/$cm^2$ (preferably about 200 mJ/$cm^2$ to about 250 mJ/$cm^2$). The channel region 120 is masked with the overlying gate electrode 117 and is not irradiated with laser light. The sheet resistance of the obtained n-type impurity (phosphorus) region 124 was about 200 Ω/square to about 500 Ω/square.

Then, as illustrated in FIG. 11, a silicon oxide film or a silicon nitride film having a thickness of about 600 nm is formed as an interlayer insulating film 132. In a case where a silicon oxide film is used, the silicon oxide film is preferably formed by a plasma CVD method using TEOS with oxygen, or a low-pressure CVD method or an atmospheric pressure CVD method using TEOS with ozone, thereby obtaining an interlayer insulating film having a desirable step-covering property. Moreover, when a silicon nitride film is deposited by a plasma CVD method using $SiH_4$ and $NH_3$ as material gases, it is possible to obtain an effect of reducing dangling bonds that deteriorate the TFT characteristics by supplying hydrogen atoms to the interface between the active region and the gate insulating film.

Then, contact holes are made in the interlayer insulating film 132, and an electrode/line 133 of the TFT is formed by using a metal film, e.g., a two-layer film of titanium nitride and aluminum. The titanium nitride film is a barrier film for preventing the diffusion of aluminum into the semiconductor layer. In a case where the TFT (134 in FIG. 1I) is used as a pixel TFT for switching a pixel electrode, a pixel electrode formed from a transparent conductive film such as ITO is connected to one of the two electrodes other than the gate electrode (i.e., the drain electrode), and a source bus line is connected to the other electrode (i.e., the source electrode). In the present preferred embodiment, the source electrode and the source bus line are preferably formed integrally with each other. A video signal is supplied via the source bus line, and a necessary charge is written to the pixel electrode based on the gate signal from the gate bus line 117. Moreover, the TFT can easily be applied to a thin film integrated circuit, in which case an additional contact hole is made over the gate electrode 117 for providing a necessary line.

Finally, an annealing process is performed in a nitrogen atmosphere or a hydrogen atmosphere at about 350° C. for approximately 1 hour, thereby completing the TFT 134, as illustrated in FIG. 1I. As necessary, a protection film made of silicon nitride, or the like, may be further provided on the TFT 134 for the purpose of protecting the TFT 134.

A TFT produced according to the preferred embodiment as described above had a very high performance with a field-effect mobility of about 30 $cm^2$/Vs and a threshold voltage of about 1.5 V, and still had no abnormal increase in the TFT off-state leak current, which is frequently seen in the prior art, with the leak current stably exhibiting a very low value on the order of about 0.1 pA per unit W or less. This value is substantially the same as that of a conventional TFT produced without using a catalyst element, and the TFT defect rate was about 1/10000 or less, indicating a significant improvement in the production yield. Moreover, substantially no characteristics deterioration was observed in tests for the resistance to repeated operations, the resistance to bias voltages and the resistance to thermal stresses, indicating a much higher reliability over the prior art.

Second Preferred Embodiment

The second preferred embodiment of the present invention will now be described. The second preferred embodiment is also directed to a method for producing an n-channel TFT on a glass substrate, as in the first preferred embodiment.

FIG. 2A to FIG. 2I are cross-sectional views sequentially illustrating steps for producing the n-channel TFT of the present preferred embodiment.

Figure 2A:
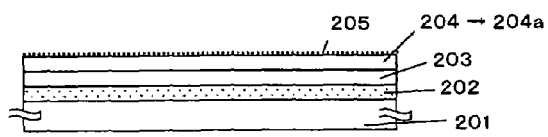
FIG. 2A to FIG. 2I are schematic cross-sectional views illustrating steps for manufacturing a semiconductor device according to a second preferred embodiment of the present invention.

Referring to FIG. 2A, a low-alkali glass substrate or a quartz substrate may be used as a substrate 201. A low-alkali glass substrate was used in the present preferred embodiment. In such a case, the substrate may be subjected to a pre-heat treatment at a temperature that is lower than the glass deformation point by about 10° C. to 20° C. A base film such as a silicon oxide film, a silicon nitride film or a silicon oxide nitride film is formed on the TFT side of the substrate 201 for preventing the diffusion of an impurity from the oxide nitride film was deposited, as a lower first base film 202, by a plasma CVD method using material gases of $SiH_4$, $NH_3$ and $N_2O$, and a second base film 203 was deposited on the first base film 202 similarly by a plasma CVD method using material gases of $SiH_4$ and $N_2O$. The thickness of the silicon oxide nitride film of the first base film 202 was set to 25 to 200 nm (e.g., 100 nm), and the thickness of the silicon oxide nitride film of the second base film 203 was preferably about 25 nm to about 300 nm (e.g., about 100 nm). Then, an intrinsic (I type) amorphous silicon film (a-Si film) 204 having a thickness of about 20 to about 80 nm (e.g., about 50 nm) is deposited by a plasma CVD method. In the present preferred embodiment, the first base film 202, the second base film 203 and the a-Si film 204 were deposited successively without exposing the substrate to the atmospheric air by using a multi-chamber parallel-plate plasma CVD apparatus.

Then, a catalyst element is added to the a-Si film 204, and a heat treatment is performed. An aqueous solution (aqueous nickel acetate solution) including, for example, an approximately 10 ppm by weight of catalyst element (nickel in the present preferred embodiment) is applied on the a-Si film by a spin coating method, thereby forming a catalyst-element-including layer 205. Note that while nickel is added by a spin coating method in the present preferred embodiment, a thin film of a catalyst element (nickel film in the present preferred embodiment) may alternatively be formed on an amorphous silicon film 204 by a vapor deposition method, a sputtering method, or other suitable method. This state is shown in FIG. 2A. The concentration of added nickel on the surface of the a-Si film 204 in the state as illustrated in FIG. 2A was about $5 \times 10^{12}$ atoms/cm², as measured by a total reflection X-ray fluorescence (TRXRF) method.

Then, a first heat treatment is performed in an inert atmosphere (e.g., a nitrogen atmosphere). The heat treatment is preferably performed at about 550° C. to about 600° C. for approximately 30 minutes to 4 hours. In the present preferred embodiment, the heat treatment was performed at about 580° C. for approximately 1 hour. In this heat treatment, nickel 205 added to the surface of the a-Si film 204 diffuses into the a-Si film 204 while being silicified, and the crystallization of the a-Si film 204 proceeds using the silicide as nuclei. As a result, the a-Si film 204 is crystallized into a crystalline silicon film 204a.

Figure 2B:
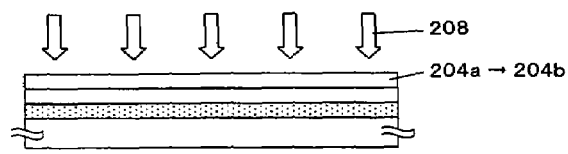

Then, as illustrated in FIG. 2B, the crystalline silicon film 204a obtained by the heat treatment is irradiated with laser light 208 to further crystallize the crystalline silicon film 204a, thereby obtaining a crystalline silicon film 204b with an improved crystallinity. In this step, XeCl excimer laser (wavelength: about 308 nm, pulse width: about 40 nsec) was used as the laser light. The laser light irradiation was performed at a substrate temperature of about 200° C. to about 450° C. (e.g., about 400° C.) and with an energy density of about 250 mJ/cm² to about 450 mJ/cm² (e.g., about 350 mJ/cm²). Moreover, in the present preferred embodiment, the laser light was shaped so as to form an elongate beam spot having a size of 150 mm by 1 mm on the surface of the substrate 201, and the substrate 201 was scanned in the direction perpendicular to the longitudinal direction of the beam spot and in a line sequential manner with a step width of about 0.05 mm. Thus, any point on the crystalline silicon film 204a is irradiated with laser light a total of 20 times. The crystalline silicon film 204a obtained by solid-phase crystallization as described above is turned into the crystalline silicon film 204b of a higher quality as the crystal defects are reduced through the melting/solidification process by the laser irradiation.

Figure 2C:
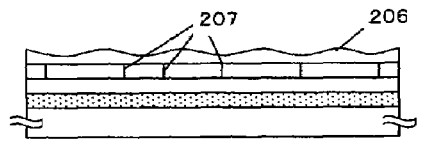

Then, as illustrated in FIG. 2C, the surface of the crystalline silicon film 204b is exposed to acid 206 including hydrogen fluoride, thereby performing the first gettering step. In the present preferred embodiment, this step was performed by a dipping method (where a substrate is dipped entirely in a solution) using a 1:10 buffered hydrogen fluoride (BHF, hydrogen fluoride concentration: about 5%) solution. With hydrofluoric acid of such a concentration, the treatment time is preferably about 10 to about 30 seconds (about 15 seconds in the present preferred embodiment). After the substrate was dipped in the 1:10 BHF solution, the solution was substituted with pure water, and the substrate was washed and then dried with an air knife. Through this step, Ni silicide masses (particularly large masses and masses of $NiSi_2$) present in the crystalline silicon film are selectively etched away by acid 206 including hydrogen fluoride, thereby leaving minute holes 207 in the crystalline silicon film 204a as traces of the etched-away silicide masses. The diameters of the holes were about 0.05 µm to about 0.5 µm.

Then, the surface of the crystalline silicon film 204b is oxidized to form a thin silicon oxide film 212 to be an etching stopper. The silicon oxide film 212 was formed by holding ozone water on the surface of the crystalline silicon film 204b. In this step, the ozone concentration of ozone water is preferably about 5 mg/L or more (about 8 mg/L in the present preferred embodiment). The holding time for which ozone water was held on the surface of the crystalline silicon film 204b was about 1 minute. In order to form the silicon oxide film 212 with a better quality, it is preferred to remove the natural oxide film on the surface of the crystalline silicon film 204b before the ozone water treatment. In the present preferred embodiment, the ozone water treatment was performed after an active surface of the silicon film was exposed through the first gettering step with acid 206 including hydrogen fluoride, which functions also as a cleaning step with hydrogen fluoride preceding the ozone water treatment. The thickness of the obtained silicon oxide film 212 was about 30 Å as measured by spectroscopic ellipsometry.

Figure 2D:
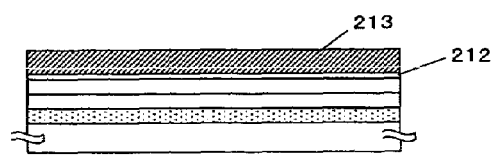

Then, a phosphorus-including a-Si film 213 is formed preferably by a plasma CVD method so as to cover the oxide film 212. The phosphorus-including a-Si film functions as a gettering layer. The phosphorus-including a-Si film 213 was formed by a plasma CVD method using silane ($SiH_4$) and phosphine ($PH_3$) as material gases. The phosphorus concentration of the a-Si film 213 can be adjusted by controlling the flow rate of the phosphine gas. In the present preferred embodiment, the $PH_3/SiH_4$ flow rate was set to about 3/100. Then, the phosphorus concentration of the a-Si film 213 was about 1%. While phosphorus was used as the gettering element included in the gettering layer in the present preferred embodiment, the gettering capability can be further increased by using boron in addition to phosphorus. This can be done by using a diborane ($B_2H_6$) gas as an additional deposition material gas in addition to the two gases specified above. A high gettering effect can also be obtained by introducing a rare gas element such as Ar, instead of phosphorus, during the deposition step so as to obtain an a-Si film with the rare gas included therein. This state is shown in FIG. 2D.

Then, the second heat treatment is performed in an inert atmosphere. In the present preferred embodiment, a rapid thermal annealing process was performed in a nitrogen atmosphere, for example. The rapid thermal annealing was performed as follows. The substrate was pre-heated to about 400° C., and the temperature was increased at a rate of about 50° C./min to about 300° C./min and held at a temperature of about 600° C. to about 750° C. for approximately 30 seconds to 15 minutes (more preferably at a temperature of about 650° C. to about 700° C. for approximately 1 minute to 10 minutes). In the present preferred embodiment, a rapid thermal annealing process of such a temperature profile as described above was realized by providing a temperature gradient in the furnace by using a resistive heating furnace and controlling the speed at which the substrate is inserted into the furnace. In this process, one substrate is processed at a time and a nitrogen gas heated to a high temperature is blown uniformly onto the surface of the substrate 201, thereby obtaining a high temperature-increasing rate that cannot be obtained only with heat radiation, and also obtaining a thermal uniformity across the surface of the substrate while it is being heated.

Figure 2E:
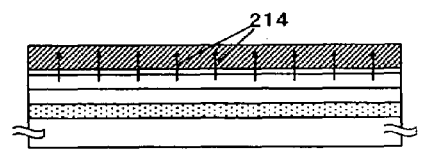

With such a rapid thermal annealing process, nickel 205 in the crystalline silicon film 204b is moved upwardly by the phosphorus-including a-Si film 213 as indicated by arrow 214 in FIG. 2E. While nickel 205 needs to pass through the silicon oxide film 212, the movement of nickel 205 is not hindered by such a thin silicon oxide film of the present preferred embodiment. The solid solubility of the a-Si film 213 for nickel has been increased significantly by phosphorus, while defects, etc., therein function as segregation traps for nickel to effect a gettering action, thereby performing the second gettering step. In the second gettering step, first, nickel present in the form of solid solution in the crystalline silicon film 204b is moved into the gettering layer 213. As a result, the nickel concentration in the silicon film is decreased, whereby Ni silicide masses (particularly small masses and masses of lower semiconductor compounds such as NiSi and $Ni_2Si$) remaining in the film start dissolving in the silicon film. Then, the newly dissolved Ni atoms are also moved into the gettering layer 213. Eventually, small $NiSi_2$ masses and lower silicide masses such as NiSi and $Ni_2Si$ masses, which could not be removed in the first gettering step, are completely removed, and the concentration of solid-solution nickel is also reduced. As measured by secondary ion mass spectrometry (SIMS), the nickel concentration in the crystalline silicon film 204b was decreased to about $5 \times 10^{15}$ atoms/cm$^3$, which is close to the measurable lower limit. Needless to say, nickel remaining in the crystalline silicon film 204b is not present in the form of silicides but in the form of solid solution, i.e., as interstitial nickel atoms.

Then, the a-Si film 213, being a gettering layer, is etched away entirely. The etching process requires an etchant having a sufficient etching selectivity between the a-Si film and the silicon oxide film so that the underlying silicon oxide film 212 sufficiently functions as an etching stopper. In the present preferred embodiment, a strong alkaline solution such as a developer solution was preferably used. Then, after removing the a-Si film 213, which is a gettering layer, the silicon oxide film 212 is etched away. The etching process was a wet etching process using an etchant of 1:100 buffered hydrogen fluoride (BHF), which has a sufficient etching selectivity between the silicon oxide film and the underlying silicon film 204b.

Figure 2F:
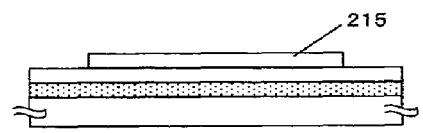
Figure 2G:
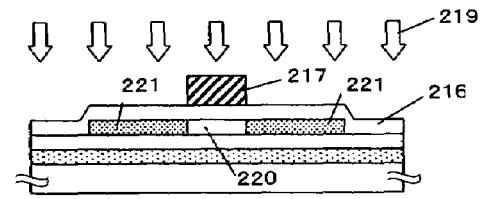

Then, a device isolation process is performed by removing unnecessary portions of the crystalline silicon film 204b. Through these steps, an island-shaped crystalline silicon film 215 is formed, as illustrated in FIG. 2F, which is to be the active region (the source/drain region and the channel region) of the TFT. Then, a gate insulating film 216 is formed to cover the island-shaped crystalline silicon film 215. The gate insulating film 216 is preferably a silicon oxide film having a thickness of about 20 nm to about 150 nm. In the present preferred embodiment, a silicon oxide film having a thickness of 100 nm was formed by a plasma CVD method using TEOS and an oxygen gas as material gases. After the deposition process, an annealing process was performed in an inert gas atmosphere at about 500° C. to about 600° C. for approximately 1 to 4 hours in order to improve the bulk properties of the gate insulating film itself and the characteristics of the interface between the crystalline silicon film and the gate insulating film.

Then, a conductive film was deposited on the gate insulating film 216 by a sputtering method or a CVD method, and patterned to form a gate electrode 217. In the present preferred embodiment, aluminum (including about 1% of scandium) is deposited by a sputtering method to a thickness of about 400 nm to about 800 nm (e.g., about 500 nm) and patterned to form the gate electrode 217. The high temperature resistance of the aluminum film can be improved by adding thereto a small amount of scandium, titanium, silicon, or other suitable material.

Then, as illustrated in FUG. 2G, a low concentration of an impurity (phosphorus) 219 is implanted into the active region by an ion doping method using the gate electrode 217 as a mask. Phosphine ($PH_3$) is used as the doping gas, the acceleration voltage is preferably set to about 60 kV to about 90 kV (e.g., about $8 \times 10^{12}$ cm$^{-2}$). Through this step, a low concentration of phosphorus 219 is implanted into a region 221 of the island-shaped silicon film 215 that is not covered with the gated electrode 217, and a region 220 that is marked with the gate electrode 217 and is not doped with phosphorus 219 will later be the channel region of the TFT.

Figure 2H:
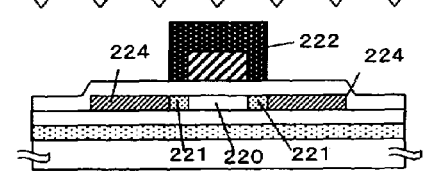

Then, a photoresist doping mask 222 with a thick side wall is provided so as to cover the gate electrode 217, as illustrated in FIG. 2H. Then, a high concentration of an impurity (phosphorus) 223 is implanted into the active region by an ion doping method using the resist mask 222. Phosphine ($PH_3$) is used as the doping gas, the acceleration voltage is preferably set to about 60 kV to about 90 kV (e.g., about 80 kV), and the dose is preferably set to about $1 \times 10^{15}$ to about $8 \times 10^{15}$ cm$^{-2}$ (e.g., about $2 \times 10^{15}$ cm$^{-2}$). The region doped with a high concentration of the impurity (phosphorus) 223 will later be a source/drain region 224 of the TFT.

In the active region 215, the region that is covered with the resist mask 222 and is not doped with a high concentration of phosphorus 223 is left as a region doped with a low concentration of phosphorus, which forms the LDD (Lightly Doped Drain) region 221. By forming the LDD region 221 as described above, the electric field localization at the junction between the channel region and the source/drain region is reduced, whereby it is possible to reduce the TFT off-state leak current and to suppress the deterioration due to hot carriers, thus improving the reliability of the TFT.

Then, after the photoresist 222 used as a doping mask is removed, the substrate is annealed by being irradiated with laser light from above the substrate so as to activate the implanted impurity while improving the crystallinity of portions where the crystallinity has been deteriorated through the impurity introducing step as described above. In this step, XeCl excimer laser (wavelength: about 308 nm, pulse width: about 40 nsec) was used with an energy density of about 150 mJ/cm$^2$ to 400 mJ/cm$^2$ (preferably about 200 mJ/cm$^2$ to about 250 mJ/cm$^2$). The sheet resistance of the obtained n-type impurity (phosphorus) region 224 was about 200 Ω/square to 500 Ω/square, and the sheet resistance of the LDD region 221 doped with a low concentration of phosphorus was about 30 Ω/square to about 50 kΩ/square.

Figure 2I:
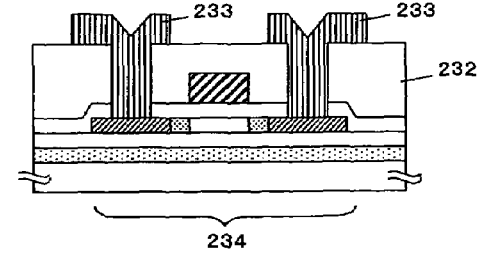

Then, as illustrated in FIG. 2I, a silicon oxide film or a silicon nitride film having a thickness of about 400 nm to about 1000 nm is formed as an interlayer insulating film 232. Then, contact holes are made in the interlayer insulating film 232, and an electrode/line 233 of the TFT is formed by using a metal film, e.g., a two-layer film of titanium nitride and aluminum. The titanium nitride film is a barrier film for preventing the diffusion of aluminum into the semiconductor layer. In a case where the TFT (234 in FIG. 2I) is used as a pixel TFT, a pixel electrode formed from a transparent conductive film such as ITO is connected to one of the two electrodes other than the gate electrode (i.e., the drain electrode). Finally, an annealing process is performed in a nitrogen atmosphere or a hydrogen atmosphere at about 350° C. for approximately 1 hour, thereby completing the TFT 234, as illustrated in FIG. 2I. As necessary, a protection film made of silicon nitride, or other suitable material, may be further provided on the TFT 234 for the purpose of protecting the TFT 234.

A TFT produced according to the preferred embodiment described above exhibited excellent electrical characteristics as with the TFT produced in the first preferred embodiment. TFTs having a dual-gate structure were produced according to the present preferred embodiment and used as pixel TFTs on the active matrix substrate of a liquid crystal display panel. The obtained liquid crystal panel, as compared with a reference panel produced by a conventional method, had a high display quality with a significantly reduced display non-uniformity, very few pixel defects due to TFT leak, and a high contrast ratio.

Third Preferred Embodiment

The third preferred embodiment of the present invention will now be described. The present preferred embodiment is directed to a process of producing, on a glass substrate, a circuit having a CMOS structure including a complementary set of an n-channel TFT and a p-channel TFT, which is used in a peripheral driving circuit of an active matrix liquid crystal display device or a general thin film integrated circuit.

FIG. 3A to FIG. 3E and FIG. 4A to FIG. 4D are cross-sectional views sequentially illustrating steps for producing the TFTs of the present preferred embodiment.

Figure 3A:
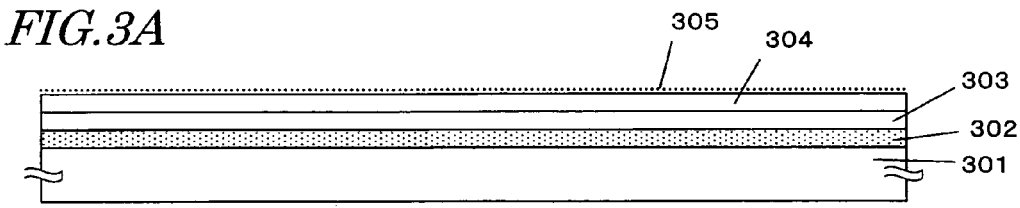
FIG. 3A to FIG. 3E are schematic cross-sectional views illustrating steps for manufacturing a semiconductor device according to a third preferred embodiment of the present invention.

Referring to FIG. 3A, a low-alkali glass substrate was used as a substrate 301. In such a case, the substrate may be subjected to a pre-heat treatment at a temperature that is lower than the glass deformation point by about 10° C. to about 2020 C. A base film such as a silicon oxide film, a silicon nitride film or a silicon oxide nitride film is formed on the TFT side of the substrate 301 for preventing the diffusion of an impurity from the substrate 301. In the present preferred embodiment, a silicon oxide nitride film was deposited, as a lower first base film 302, by a plasma CVD method using material gases of $SiH_4$, $NH_3$ and $N_2O$, and a second base film 303 was deposited on the first base film 302 similarly by a plasma CVD method using material gases of $SiH_4$ and $N_2O$. The thickness of the silicon oxide nitride film of the first base film 302 was preferably set to about 25 nm to about 200 nm (e.g., about 50 nm), and the thickness of the silicon oxide nitride film of the second base film 303 was preferably set to about 25 nm to about 300 nm (e.g., about 100 nm). While a two-layer base film is used in the present preferred embodiment, a single-layer silicon oxide film, for example, may alternatively be used.

Then, an amorphous silicon film (a-Si film) 304 having a thickness of about 20 nm to about 150 nm (preferably about 30 nm to about 80 nm) is formed by a known method such as a plasma CVD method or a sputtering method. In the present preferred embodiment, an amorphous silicon film was formed to a thickness of about 50 nm by a plasma CVD method. Since the base films 302 and 303 and the amorphous silicon film 304 can be formed by the same deposition method, they may alternatively be formed successively. By not exposing the base films to the atmosphere after they are formed, it is possible to prevent the contamination of the surface of the base films, thereby reducing the characteristics variations among TFTs produced and the fluctuations in the threshold voltage.

Then, a small amount of a catalyst element (nickel in the present preferred embodiment) 305 is added to the surface of the a-Si film 304. The addition of a small amount of nickel 305 was performed by holding a nickel solution on the a-Si film 304, uniformly spreading the solution across the substrate 301 by a spinner, and then drying the substrate 301. In the present preferred embodiment, nickel acetate was used as the solute, water was used as the solvent, and the nickel concentration in the solution was controlled to be about 8 ppm. This state is shown in FIG. 3A. The concentration of added nickel on the surface of the a-Si film 304 in the state as illustrated in FIG. 3A was about $5 \times 10^{12}$ atoms/cm$^2$, as measured by a total reflection X-ray fluorescence (TRXRF) method. Methods for adding a catalyst element to an amorphous silicon film include, in addition to the method of applying a solution including the catalyst element, vapor-phase application methods such as a plasma doping method, a vapor deposition method and a sputtering method. When a solution is used, it is easy to control the amount of the catalyst element to be added, and very small amounts of the catalyst element can easily be added.

Figure 3B:
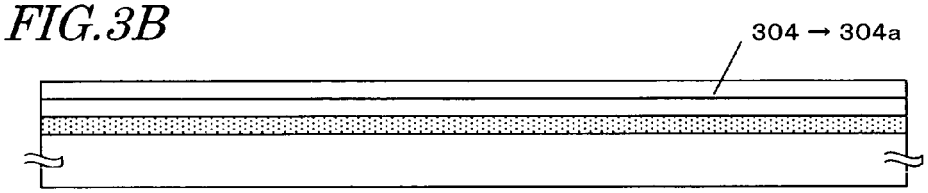

Then, a first heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 580° C. for approximately 1 hour. In this heat treatment, nickel 305 added to the surface of the a-Si film 304 diffuses into the a-Si film 304 while being silicified, and the crystallization of the a-Si film 304 proceeds using the silicide as nuclei. As a result, the a-Si film 304 is crystallized into a crystalline silicon film 304a, as illustrated in FIG. 3B.

Figure 3C:
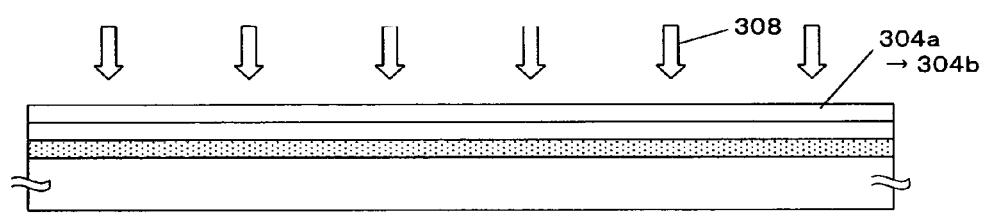

Then, as illustrated in FIG. 3C, the crystalline silicon film 304a is irradiated with laser light 308 to further crystallize the crystalline silicon film 304a, thereby improving the crystallinity thereof. In this step, XeCl excimer laser (wavelength: about 308 nm, pulse width: about 40 nsec) was used as the laser light. The laser light irradiation was performed without heating the substrate and with an energy density of about 250 mJ/cm$^2$ to about 500 mJ/cm$^2$ (e.g., about 400 mJ/cm$^2$). The laser light was shaped so as to form an elongate beam spot having a size of about 150 mm by about 1 mm on the surface of the substrate 301, and the substrate 301 was scanned in the direction that is substantially perpendicular to the longitudinal direction of the beam spot and in a line sequential manner with a step width of about 0.05 mm. Thus, any point on the crystalline silicon film 304a is irradiated with laser light a total of 20 times. The crystalline silicon film 304a obtained by solid-phase crystallization as described above is turned into a crystalline silicon film 304b of a higher quality as the crystal defects are reduced through the melting/solidification process by the laser irradiation. The laser light used in this step may be KrF excimer laser, XeCl excimer laser, YAG laser or YVO$_4$ laser of either a pulsed oscillation type or a continuous oscillation type. The crystallization conditions may be determined appropriately for each specific application.

Figure 3D:
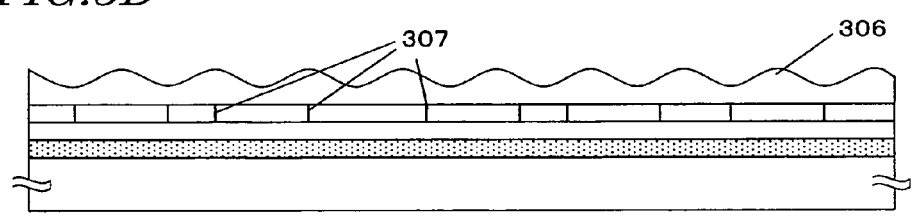

Then, as illustrated in FIG. 3D, the surface of the crystalline silicon film 304b is exposed to acid 306 including hydrogen fluoride, thereby performing the first gettering step. In the present preferred embodiment, this step was performed by a dipping method (where a substrate is dipped entirely in a solution) using a 1% hydrofluoric acid solution. With hydrofluoric acid of such a concentration, the treatment time is preferably about 60 seconds to about 180 seconds (about 120 seconds in the present preferred embodiment). After the substrate was dipped in the hydrofluoric acid solution, the solution was substituted with pure water, and the substrate was washed and spun dry. Through this step, Ni silicide masses (particularly large masses and masses of NiSi$_2$) present in the crystalline silicon film are selectively etched away by hydrofluoric acid 306, thereby leaving minute holes 307 in the crystalline silicon film 304b as traces of the etched-away silicide masses. The diameters of the holes were about 0.05 μm to about 0.5 μm.

Figure 3E:
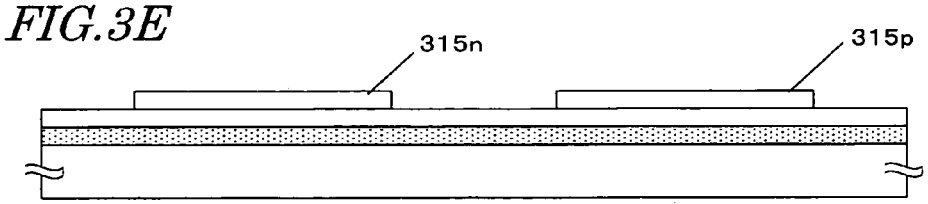

Then, a device isolation process is performed by removing unnecessary portions of the crystalline silicon film 304b. Through this step, island-shaped crystalline silicon films 315n and 315p are formed, which will later be the active regions (the source/drain regions and the channel regions) of the n-channel TFT and the p-channel TFT, respectively, as illustrated in FIG. 3E.

Boron (B) may be added, as an impurity element giving p-type conductivity, to the entire surface of the active regions of the n-channel TFT and the p-channel TFT at a concentration of about $1\times10^{16}$ to about $5\times10^{17}$/cm$^3$ for the purpose of controlling the threshold voltage. Boron (B) may be added by an ion doping method, or may alternatively be added to the amorphous silicon film when the amorphous silicon film is deposited.

Then, a silicon oxide film having a thickness of about 20 nm to about 150 nm (about 100 nm in the present preferred embodiment) is deposited, as a gate insulating film 316, so as to cover the crystalline silicon films 315n and 315p to be the active regions. The silicon oxide film was formed by decomposing and depositing TEOS by an RF plasma CVD method with oxygen at a substrate temperature of about 300° C. to about 450° C. The gate insulating film 316 may alternatively be any other suitable silicon-including insulating film and may be a single-layer film or a multi-layer film.

Then, a high-melting metal is deposited by a sputtering method and then-patterned to form gate electrodes 317n and 317p. The high-melting metal may be an element selected from tantalum (Ta), tungsten (W), molybdenum (Mo) and titanium (Ti), an alloy including one of these elements as its main component, or an alloy of these elements (typically, an Mo—W alloy or an Mo—Ta alloy). The material may alternatively be tungsten silicide, titanium silicide or molybdenum silicide. In the present preferred embodiment, tungsten (W) was deposited to a thickness of about 300 nm to about 600 nm (e.g., about 450 nm). The concentration of the impurity to be added for reducing the resistance is preferably low. When the oxygen concentration was set to about 30 ppm or less, a resistivity value of about 20 μΩcm or less was realized.

Figure 4A:
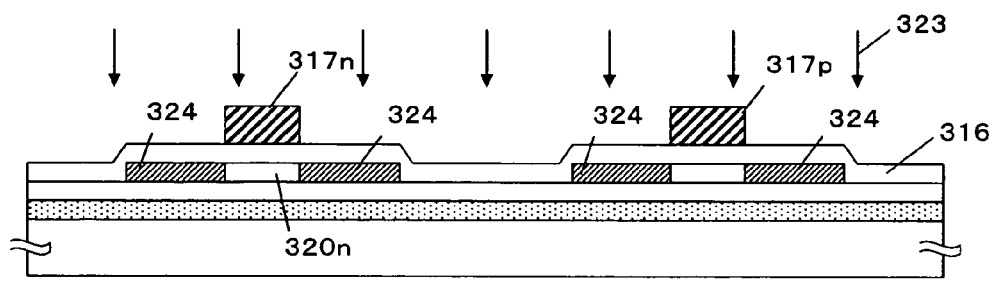
FIG. 4A to FIG. 4D are schematic cross-sectional views illustrating steps for manufacturing a semiconductor device according to the third preferred embodiment of the present invention (continued from FIG. 3E).

Then, as illustrated in FIG. 4A, an n-type impurity (phosphorus) 323 is implanted into the active region by an ion doping method using the gate electrodes 317n and 317p as masks. Phosphine (PH$_3$) is used as the doping gas, the acceleration voltage is set to about 60 kV to about 90 kV (e.g., about 80 kV), and the dose is set to about $1\times10^{15}$ cm$^{-2}$ to about $1\times10^{16}$ cm$^{-2}$ (e.g., about $6\times10^{15}$ cm$^{-2}$). In the active region 315n of the n-channel TFT, a region 324 doped with a high concentration of phosphorus 323 will later be the source/drain region of the n-channel TFT, and the region that is masked with the gate electrode 317n and is not doped with phosphorus 323 will later be a channel region 320n of the n-channel TFT. The active region 315p of the p-channel TFT is also doped with phosphorus. This is done so that a high concentration of phosphorus implanted into these regions can be used as a gettering element for gettering the catalyst element into the source and drain regions in the subsequent second heat treatment.

Figure 4B:
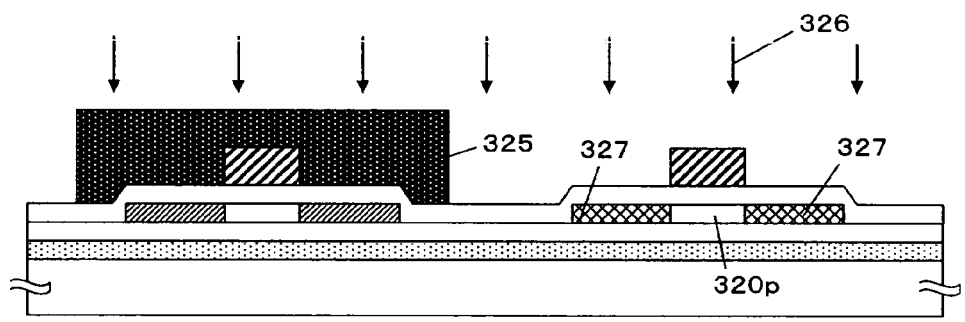

Then, as illustrated in FIG. 4B, a photoresist doping mask 325 is provided so as to cover the active region 315n of the n-channel TFT. Then, an impurity giving p-type conductivity (boron) 326 is implanted into the active region 315p of the p-channel TFT by an Ion doping method using the resist mask 325 and the gate electrode 317p of the p-channel TFT as masks. Diborane (B$_2$H$_6$) is used as the doping gas, the acceleration voltage is set to about 40 kV to about 80 kV (e.g., 65 kV), and the dose is set to about $5\times10^{15}$ to about $2\times10^{16}$ cm$^{-2}$ (e.g., about $1\times10^{16}$ cm$^{-2}$). The polarity of a region 327 that is doped with a high concentration of boron 326 is inverted from n type to p type through a so-called "counter doping" process, and will later be the source/drain region of the p-channel TFT, whereas the region that is masked with the gate electrode 317p and is not doped with an impurity will later be a channel region 320p of the p-channel TFT. In this step, since the active region 315n of the n-channel TFT is covered entirely with a mask 325, the active region 315n is not at all doped with boron 326.

As described above, each of the n-type impurity and the p-type impurity is selectively doped by using a photoresist for covering a region that does not need to be doped with the impurity, thereby forming the heavily-doped n-type impurity region 324 and the p-type impurity region 327. Note that n-type and p-type impurity elements are added in this order to the semiconductor layer in the present preferred embodiment, the order is not limited to this but may be determined appropriately for each specific application.

Figure 4C:
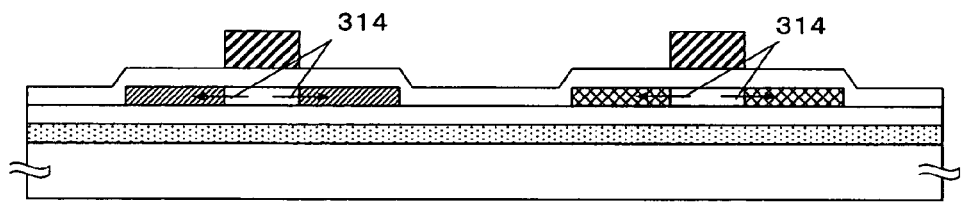

Then, after the resist mask 325 is removed, the second heat treatment is performed in an inert atmosphere (e.g., a nitrogen atmosphere). In the present preferred embodiment, the heat treatment is preferably performed at about 520° C.

to about 600° C. for about 30 minutes to 8 hours. In this heat treatment step, phosphorus doped into the source/drain region in each of the active region 315$n$ of the n-channel TFT and the active region 315$p$ of the p-channel TFT increases the solid solubility of the region for nickel, so that nickel is moved from the channel regions 320$n$ and 320$p$ into the source/drain regions 324 and 327 as indicated by arrow 314, thereby performing the second gettering step (FIG. 4C).

In the second gettering step, first, nickel present in the form of solid solution in the channel regions 320$n$ and 320$p$ is moved into the source/drain regions 324 and 327. As a result, the nickel concentration in each channel region is decreased, whereby Ni silicide masses (particularly small masses and masses of lower semiconductor compounds such as NiSi and Ni$_2$Si) remaining in the channel region start dissolving in the channel region. Then, the newly dissolved Ni atoms are also moved into the source/drain regions 324 and 327. Eventually, small NiSi$_2$ masses and lower silicide masses such as NiSi and Ni$_2$Si masses, which could not be removed in the first gettering step, are completely removed, and the concentration of solid-solution nickel is also reduced. As measured by secondary ion mass spectrometry (SIMS), the nickel concentration in the channel regions 320$n$ and 320$p$ was decreased to about $5 \times 10^{15}$ atoms/cm$^3$, which is close to the measurable lower limit. Needless to say, nickel remaining in each channel region is not present in the form of silicides but in the form of solid solution, i.e., as interstitial nickel atoms. On the other hand, since nickel is moving into the source/drain region, the nickel concentration is about $1 \times 10^{19}$/cm$^3$ or more in the source/drain regions 324 and 327.

This heat treatment step also activates the n-type impurity (phosphorus) 323 doped into the source/drain region 324 of the n-channel TFT and the p-type impurity (boron) 326 doped into the source/drain region 327 of the p-channel TFT. As a result, the sheet resistance value of the source/drain region 324 of the n-channel TFT was about 400 Ω/square to about 700 Ω/square, and the sheet resistance value of the source/drain region 327 of the p-channel TFT was about 1 Ω/square to about 1.5 kΩ/square.

Figure 4D:
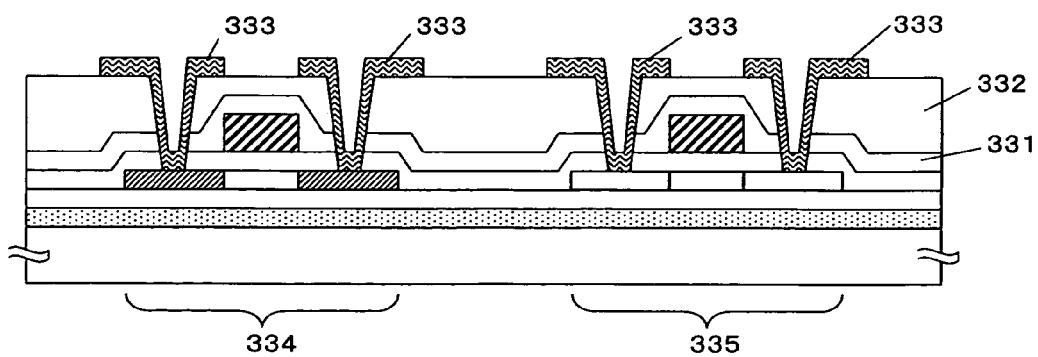

Then, as illustrated in FIG. 4D, an inorganic interlayer insulating film is formed. A silicon nitride film, a silicon oxide film or a silicon nitride oxide film is formed to a thickness of about 400 nm to about 1500 nm (typically, about 600 nm to about 1000 nm). In the present preferred embodiment, a silicon nitride film 331 having a thickness of about 200 nm and a silicon oxide film 332 having a thickness of about 700 nm were deposited on one another, thereby providing a two-layer film. The deposition process is performed by a plasma CVD method to continuously form the silicon nitride film using SiH$_4$ and NH$_3$ as material gases, and the silicon oxide film using TEOS and O$_2$ as material gases. Needless to say, the inorganic-interlayer insulating film may alternatively be any other suitable silicon-including insulating film and may be a single-layer film or a multi-layer film.

Then, another heat treatment is performed at about 300° C. to about 500° C. for 1 to several hours as a step of hydrogenating the semiconductor layer. This step is performed for terminating and inactivating dangling bonds that deteriorate the TFT characteristics by supplying hydrogen atoms to the interface between the active region and the gate insulating film. In the present preferred embodiment, a heat treatment was performed in a nitrogen atmosphere including about 3% of hydrogen at about 410° C. for approximately 1 hour. When a sufficient amount of hydrogen is contained in the interlayer insulating film (particularly the silicon nitride film 331), the effect can be obtained also by performing the heat treatment in a nitrogen atmosphere. Other hydrogenation processes that can be used include a plasma hydrogenation process (using hydrogen excited by a plasma).

Then, contact holes are made in the interlayer insulating film, and an electrode/line 333 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel TFT 334 and a p-channel TFT 335 as illustrated in FIG. 4D. As necessary, additional contact holes may be made over the gate electrodes 317$n$ and 317$p$ for providing necessary connection between electrodes with the line 333. Moreover, a protection film made of silicon nitride, or other suitable material, may be further provided on each TFT for the purpose of protecting the TFT.

An n-channel TFT and a p-channel TFT produced according to the preferred embodiment as described above exhibited very desirable characteristics with high field-effect mobilities of about 250 cm$^2$/Vs to about 300 cm$^2$/Vs and about 120 cm$^2$/Vs to 150 cm$^2$/Vs, respectively, and with threshold voltages of about 1 V and about −1.5 V, respectively. Moreover, these TFTs exhibited substantially no abnormal increase in the TFT off-state leak current, which is frequently seen in the prior art, and substantially no characteristics deterioration was observed in tests for the resistance to repeated operations, the resistance to bias voltages and the resistance to thermal stresses. Moreover, as a CMOS circuit having a complementary set of an n-channel TFT and a p-channel TFT produced according to the present preferred embodiment was used in various circuits such as an inverter chain and a ring oscillator, the circuits exhibited a much higher reliability and more stable circuit characteristics over the prior art.

Fourth Preferred Embodiment

The fourth preferred embodiment of the present invention will now be described. The present preferred embodiment is also directed to a process of producing, on a glass substrate a circuit having a CMOS structure including a complementary set of an n-channel TFT and a p-channel TFT.

FIG. 5A to FIG. 5F and FIG. 6A to FIG. 6D are cross-sectional views sequentially illustrating steps for producing the TFTs of the present preferred embodiment.

Figure 5A:
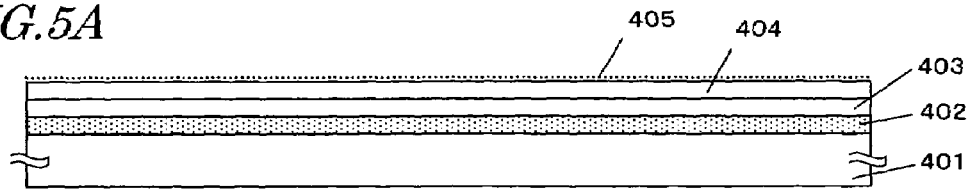
FIG. 5A to FIG. 5F are schematic cross-sectional views illustrating steps for manufacturing a semiconductor device according to a fourth preferred embodiment of the present invention.

Referring to FIG. 5A, a base film such as a silicon oxide film, a silicon nitride film or a silicon oxide nitride film is formed on the TFT side of a low-alkali glass substrate 401 for preventing the diffusion of an impurity from the substrate 401. In the present preferred embodiment, a silicon oxide nitride film was deposited, as a lower first base film 402, by a plasma CVD method using material gases of SiH$_4$, NH$_3$ and N$_2$O, and a second base film 403 was deposited on the first base film 402 similarly by a plasma CVD method using material gases of TEOS and O$_2$. The thickness of the silicon oxide nitride film of the first base film 402 was set to about 100 nm, for example, and the thickness of the silicon oxide nitride film of the second base film 403 was also set to about 100 nm, for example.

Then, an amorphous silicon film (a-Si film) 404 having a thickness of about 20 nm to about 150 nm (preferably about 30 nm to about 80 nm) is formed by a known method such as a plasma CVD method or a sputtering method. In the present preferred embodiment, an amorphous silicon film was formed to a thickness of about 50 nm by a plasma CVD method. Since the base films 402 and 403 and the amorphous silicon film 404 can be formed by the same deposition method, they may alternatively be formed successively.

Then, a small amount of a catalyst element (nickel in the present preferred embodiment) 405 is added to the surface of the a-Si film 404. The addition of a small amount of nickel 405 was performed by holding a nickel solution on the a-Si film 404, uniformly spreading the solution across the substrate 401 by a spinner, and then drying the substrate 401. In the present preferred embodiment, nickel acetate was used as the solute, water was used as the solvent, and the nickel concentration in the solution was controlled to be about 8 ppm. This state is shown in FIG. 5A. The concentration of added nickel on the surface of the a-Si film 404 in the state as illustrated in FIG. 5A was about $5 \times 10^{12}$ atoms/cm$^2$, as measured by a total reflection X-ray fluorescence (TRXRF) method.

Figure 5B:
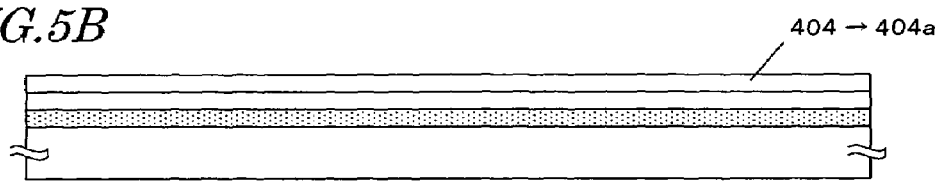

Then, a heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 550° C. for approximately 4 hours. In this heat treatment, nickel 405 added to the surface of the a-Si film 404 diffuses into the a-Si film 404 while being silicified, and the crystallization of the a-Si film 404 proceeds using the silicide as nuclei. As a result, the a-Si film 404 is crystallized into a crystalline silicon film 404a, as illustrated in FIG. 5B.

Figure 5C:
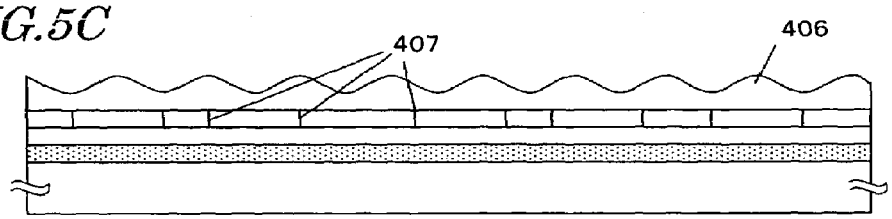
Figure 5D:
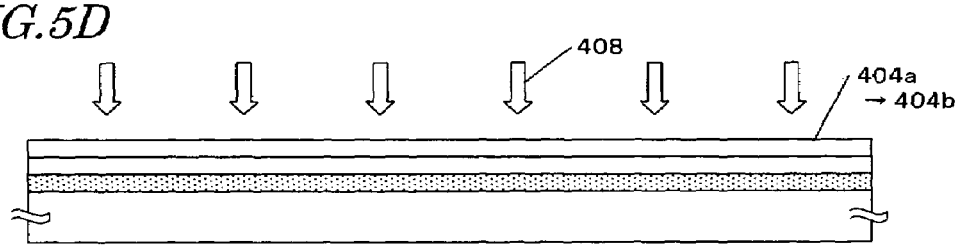

Then, as illustrated in FIG. 5C, the surface of the crystalline silicon film 404a is exposed to acid 406 including hydrogen fluoride, thereby performing the first gettering step. In the present preferred embodiment, this step was performed by a dipping method (where a substrate is dipped entirely in a solution) using a 1% hydrofluoric acid solution. With hydrofluoric acid of such a concentration, the treatment time is preferably about 60 seconds to about 180 seconds (about 120 seconds in the present preferred embodiment). After the substrate was dipped in the hydrofluoric acid solution, the solution was substituted with pure water, and the substrate was washed and spun dry. Through this step, Ni silicide masses (particularly large masses and masses of NiSi$_2$) present in the crystalline silicon film are selectively etched away by hydrofluoric acid 406, thereby leaving minute holes 407 in the crystalline silicon film 404a as traces of the etched-away silicide masses. The diameters of the holes were about 0.1 μm to about 0.8 μm.

Then, as illustrated in FIG. 4D, the crystalline silicon film 404a is irradiated with laser light 408 to further crystallize the crystalline silicon film 404a, thereby improving the crystallinity thereof. The dipping treatment with hydrofluoric acid 406 illustrated in FIG. 4C serves also as a pre-cleaning step for this laser irradiation step. In this step, XeCl excimer laser (wavelength: about 308 nm, pulse width: about 40 nsec) was used as the laser light. The laser light irradiation was performed with an energy density of about 400 mJ/cm$^2$. The laser light was shaped so as to form an elongate beam spot having a size of about 150 mm by about 1 mm, and the substrate was scanned in the direction that is substantially perpendicular to the longitudinal direction of the beam spot and in a line sequential manner with a step width of about 0.05 mm. Thus, any point on the crystalline silicon film 404a is irradiated with laser light a total of 20 times. The crystalline silicon film 404a obtained by solid-phase crystallization as described above is turned into a crystalline silicon film 404b of a higher quality as the crystal defects are reduced through the melting/solidification process by the laser irradiation.

Figure 5E:
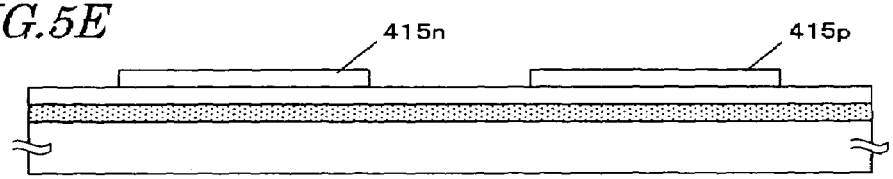

Then, a device isolation process is performed by removing unnecessary portions of the crystalline silicon film 404b. Through this step, island-shaped crystalline silicon films 415n and 415p, which will later be the active regions (the source/drain regions and the channel regions) of the n-channel TFT and the p-channel TFT, respectively, as illustrated in FIG. 5E.

Boron (B) may be added, as an impurity element giving p-type conductivity, to the entire surface of the active regions. of the n-channel TFT and the p-channel TFT at a concentration of about $1 \times 10^{16}$ to about $5 \times 10^{17}$/cm$^3$ for the purpose of controlling the threshold voltage. Boron (B) may be added by an ion doping method, or may alternatively be added to the amorphous silicon film when the amorphous silicon film is deposited.

Then, a silicon oxide film having a thickness of about 20 nm to about 150 nm (about 100 nm in the present preferred embodiment) is deposited, as a gate insulating film 416, so as to cover the crystalline silicon films 415n and 415p to be the active regions. The silicon oxide film was formed by decomposing and depositing TEOS by an RF plasma CVD method with oxygen at a substrate temperature of about 150° C. to about 600° C. (preferably about 300° C. to about 450° C.).

Figure 5F:
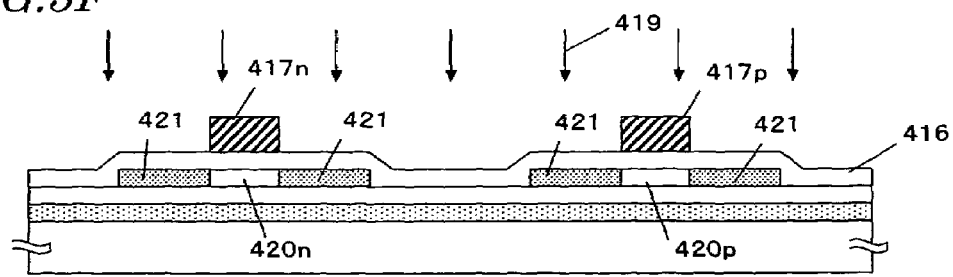

Then, as illustrated in FIG. 5F, a high-melting metal is deposited by a sputtering method and then patterned to form gate electrodes 417n and 417p. In the present preferred embodiment, tantalum (Ta) doped with a small amount of nitrogen was deposited to a thickness of about 300 nm to about 600 nm (e.g., about 450 nm).

Then, a low concentration of an impurity (phosphorus) 419 is implanted into the active region by an ion doping method using the gate electrodes 417n and 417p as masks. Phosphine (PH$_3$) is used as the doping gas, the acceleration voltage is set to about 60 kV to about 90 kV (e.g., about 80 kV), and the dose is set to about $1 \times 10^{12}$ to about $1 \times 10^{14}$ cm$^{-2}$ (e.g., about $2 \times 10^{13}$ cm$^{-2}$). Through this step, regions of the island-shaped silicon films 415n and 415p that are not covered with the gate electrodes 417n and 417p become regions 421 doped with a low concentration of phosphorus 419, and regions that are masked with the gate electrodes 417n and 417p and are not doped with the impurity 419 will later be channel regions 420n and 420p of the n-channel TFT and the p-channel TFT, respectively. This state is shown in FIG. 5F.

Figure 6A:
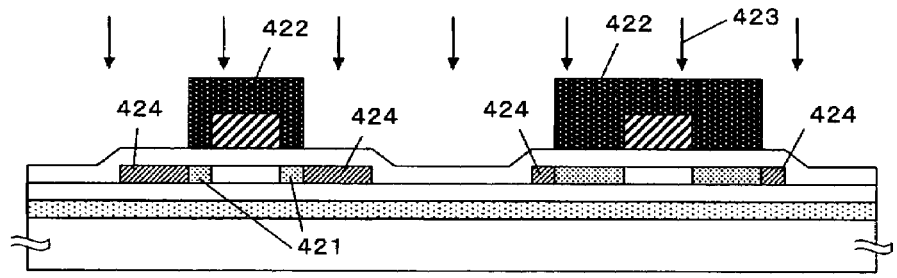
FIG. 6A to FIG. 6D are schematic cross-sectional views illustrating steps for manufacturing a semiconductor device according to the fourth preferred embodiment of the present invention (continued from FIG. 5F).

Then, as illustrated in FIG. 6A, photoresist doping masks 422 are provided. For the n-channel TFT, the photoresist doping mask 422 with a thick side wall is provided so as to cover the gate electrode 417n, as illustrated in FIG. 6A. For the p-channel TFT, the photoresist doping mask 422 with a thicker side wall is provided so as to cover the gate electrode 417p with only a peripheral portion of the active region 415p being exposed. Then, a high concentration of an impurity (phosphorus) 423 is implanted into the active region by an ion doping method using the resist masks 422. Phosphine (PH$_3$) is used as the doping gas, the acceleration voltage is set to about 60 kV to about 90 kV (e.g., about 80 kV), and the dose is set to about $2 \times 10^{15}$ cm$^{-2}$ to about $1 \times 10^{16}$ cm$^{-2}$ (e.g., about $5 \times 10^{15}$ cm$^{-2}$). For the n-channel TFT, a region 424 doped with a high concentration of the impurity (phosphorus) 423 will later be the source/drain region of the n-channel TFT. The region of the active region 415n that is covered with the resist mask 422 and is not doped with a high concentration of phosphorus 423 is left as a region doped with a low concentration of phosphorus, which forms the LDD (Lightly Doped Drain) region 421. For the p-channel TFT, the region 424 doped with a high concentration of the impurity (phosphorus) 423 will later form the gettering region of the p-channel TFT. The concentration of the n-type impurity element (phosphorus) 423 in the region 424 is about $1\times10^{19}$ to about $1\times10^{21}$/cm$^3$. Moreover, the concentration of the n-type impurity element (phosphorus) 419 in the LDD region 421 of the n-channel TFT is in the range of about $1\times10^{17}$ to about $1\times10^{20}$/cm$^3$, within which the region functions as an LDD region.

Figure 6B:
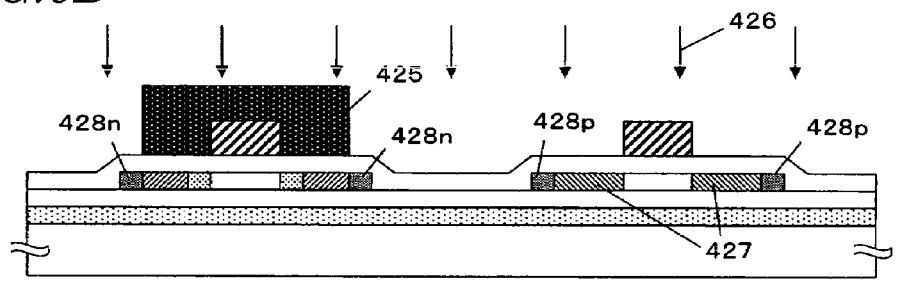

Then, after the resist mask 422 is removed, a photoresist doping mask 425 is provided in the active region 415n of the n-channel TFT, as illustrated in FIG. 6B. The photoresist doping mask 425 with a thick side wall is provided so as to cover the LDD region 421 with only a peripheral portion of the active region 415n being exposed, as illustrated in FIG. 6B. At this time, no mask is provided for the p-channel TFT, whereby the TFT is entirely exposed. Then, an impurity giving p-type conductivity (boron) 426 is implanted into the active regions by an ion doping method using the resist mask 425 and the gate electrode 417p of the p-channel TFT as masks. Diborane ($B_2H_6$) is used as the doping gas, the acceleration voltage is set to about 40 kV to about 80 kV (e.g., 65 kV), and the dose is set to about $1\times10^{15}$ cm$^{-2}$ to about $1\times10^{16}$ cm$^{-2}$ (e.g., about $7\times10^{15}$ cm$^{-2}$). For the n-channel TFT, a region 428n doped with a high concentration of boron 426 will later function as the gettering region of the n-channel TFT. The region of the active region 415p of the p-channel TFT other than the channel region 420p under the gate electrode 417p, which has been doped with a low concentration of n-type impurity (phosphorus) 419 in the previous step, is doped with a high concentration of boron 426, whereby the conductivity type thereof is inverted from n type to p type and the region will later be a source/drain region 427 of the p-channel TFT. Moreover, the region 424, which has been doped with a high concentration of phosphorus 423, is doped with an even higher concentration of boron 426, thereby forming a gettering region 428p of the p-channel TFT. The concentration of the p-type impurity element (boron) 426 in the region 427 and the regions 428n and 428p is preferably about $1.5\times10^{19}$ to about $3\times10^{21}$/cm$^3$. The concentration is about 1 to 2 times that of the n-type impurity element (phosphorus). The gettering region 428n of the n-channel TFT and the gettering region 428p of the p-channel TFT are regions that have been doped with phosphorus 423 (in the previous step) and with boron 426 (in the current step).

As described above, each of the n-type impurity and the p-type impurity is selectively doped by using a photoresist for covering regions that do not need to be doped with the impurity, thereby forming the heavily-doped n-type impurity region 424 and the p-type impurity region 427 and forming the gettering regions 428n and 428p, thus obtaining an n-channel TFT and a p-channel TFT. Note that n-type and p-type impurity elements are added in this order to the semiconductor layer in the present preferred embodiment, the order is not limited to this but may be determined appropriately for each specific application.

Then, after the resist mask 425 is removed, the second heat treatment is performed in an inert atmosphere (e.g., a nitrogen atmosphere). In the present preferred embodiment, a heat treatment was performed at about 550° C. for approximately 4 hours. In this heat treatment step, phosphorus and boron doped at high concentrations into the gettering region 428n formed outside the source/drain region in the active region 415n of the n-channel TFT increase the solid solubility of the region for nickel, and also form segregation sites for nickel. Moreover, crystal defects created during the doping process also function as segregation sites for nickel.

Figure 6C:
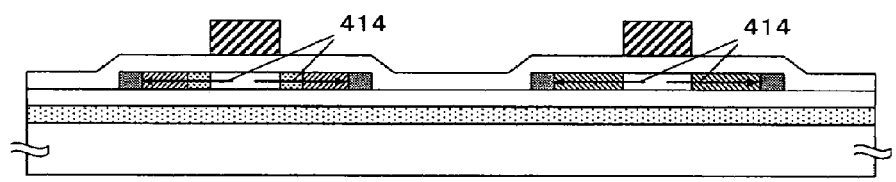

Then, nickel present in the channel region 420n, the LDD region 421 and the source/drain region 424 is moved from the channel region to the LDD region, the source/drain region and to the gettering region 428n as indicated by arrow 414 in FIG. 6C. Although the source/drain region 424 doped only with phosphorus has a gettering effect, the gettering capability of the gettering region 428n doped with phosphorus and boron is so much higher that nickel is collected into the gettering region 428n. Also in the active region 415p of the p-channel TFT, phosphorus and boron doped at high concentrations into the gettering region 428p formed outside the source/drain region provide a similar function, whereby nickel present in the channel region 420p and the source/drain region 427 is moved from the channel region to the source/drain region and to the gettering region 428p as indicated by arrow 414. Thus, the second gettering step is performed.

In the second gettering step, first, nickel present in the form of solid solution in the channel region 420, the LDD region 421 and the source/drain regions 424 and 427 is moved into the gettering region 428. As a result, the nickel concentration is decreased in these regions, whereby Ni silicide masses (particularly small masses and masses of lower semiconductor compounds such as NiSi and $Ni_2Si$) remaining in the region start dissolving in the region. Then, the newly dissolved Ni atoms are also moved into the gettering region 428. Eventually, small $NiSi_2$ masses and lower silicide masses such as NiSi and $Ni_2Si$ masses, which could not be removed in the first gettering step, are completely removed, and the concentration of solid-solution nickel is also reduced. On the other hand, since nickel is moving into the gettering regions 428n and 428p in the heat treatment step, the nickel concentration is about $1\times10^{19}$/cm$^3$ or more in the gettering regions 428n and 428p. As measured by secondary ion mass spectrometry (SIMS), the nickel concentration was decreased to about $5\times10^{15}$ atoms/cm$^3$, which is close to the measurable lower limit, in the channel region of the TFT active region, the junction between the channel region and the source/drain region and the junction between the channel region and the LDD region. Needless to say, nickel remaining in these regions is not present in the form of silicides but in the form of solid solution, i.e., as interstitial nickel atoms.

This heat treatment step also activates the n-type impurity (phosphorus) doped into the source/drain region 424 and the LDD region 421 of the n-channel TFT and the p-type impurity (boron) doped into the source/drain region 427 of the p-channel TFT. As a result, the sheet resistance value of the source/drain region 424 of the n-channel TFT was about 400 Ω/square to about 700 Ω/square, and the sheet resistance value of the LDD region 421 was about 30 kΩ/square to about 60 kΩ/square. Moreover, the sheet resistance value of the source/drain region 427 of the p-channel TFT was about 1 Ω/square to about 1.5 kΩ/square.

Figure 6D:
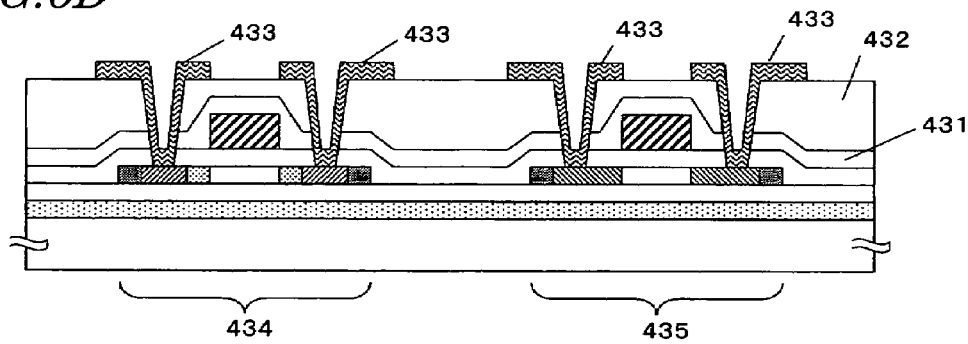

Then, as illustrated in FIG. 6D, an interlayer insulating film is formed. A silicon nitride film, a silicon oxide film or a silicon nitride oxide film is formed to a thickness of about 400 nm to about 1500 nm (typically, about 600 nm to about 1000 nm). In the present preferred embodiment, a silicon nitride film 431 having a thickness of about 200 nm and a silicon oxide film 432 having a thickness of about 700 nm were deposited on one another, thereby providing a two-layer film. Needless to say, the inorganic interlayer insulating film may alternatively be any other suitable silicon-including insulating film and may be a single-layer film or a multi-layer film.

Then, another heat treatment is performed at about 300° C. to about 500° C. for about 1 hour. This step is performed for terminating and inactivating dangling bonds that deteriorate the TFT characteristics by supplying hydrogen atoms form the interlayer insulating film (particularly the silicon nitride film 431) to the interface between the active region and the gate insulating film. In the present preferred embodiment, a heat treatment was performed in a nitrogen atmosphere at about 410° C. for approximately 1 hour.

Then, contact holes are made in the interlayer insulating film, and an electrode/line 433 of the TFT is formed by using a metal film, e.g., a two-layer film of titanium nitride and aluminum. The titanium nitride film is a barrier film for preventing the diffusion of aluminum into the semiconductor layer. Finally, an annealing process is performed at about 350° C. for approximately 1 hour, thereby obtaining an n-channel TFT 434 and a p-channel TFT 435 as illustrated in FIG. 6D. As necessary, additional contact holes may be made over the gate electrodes 417n and 417p for providing necessary connection between electrodes with the line 433. Moreover, a protection film made of silicon nitride, or other suitable material, may be further provided on each TFT for the purpose of protecting the TFT.

Each TFT produced according to the present preferred embodiment exhibits a desirable field-effect mobility as in the third preferred embodiment of the present invention.

Furthermore, in the present preferred embodiment, as compared with the first or second preferred embodiment, the gettering region can be formed in the source/drain region formation step for each of the n-channel TFT and the p-channel TFT. Therefore, it is possible to eliminate additional steps for the gettering process (a photolithography step, a doping step and an annealing step). As a result, it is possible to simplify the manufacturing process while reducing the manufacturing cost of the semiconductor device and improving the production yield.

Fifth Preferred Embodiment

The fifth preferred embodiment of the present invention will now be described with reference to FIG. 7A to FIG. 7F and FIG. 8A to FIG. 8D. The present preferred embodiment is also directed to a process of producing an n-channel TFT and a p-channel TFT on the same substrate.

A first base insulating film 502 made of silicon nitride and having a thickness of about 50 nm is formed on a glass substrate 501, and then a second base insulating film 503 made of silicon oxide and having a thickness of about 100 nm is formed on the first base insulating film 502. Furthermore, an a-Si film 504 having a thickness of about 20 nm to about 100 nm (e.g., about 50 nm) is formed on the second base insulating film 503.

Figure 7A:
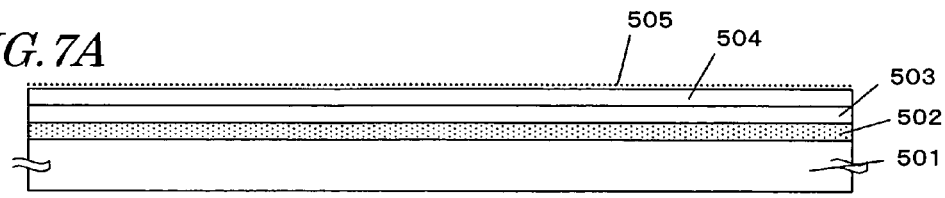
FIG. 7A to FIG. 7F are schematic cross-sectional views illustrating steps for manufacturing a semiconductor device according to the fifth preferred embodiment of the present invention.

Then, a catalyst element is added to the a-Si film 504, and a heat treatment is performed. An aqueous solution (aqueous nickel acetate solution) including approximately 10 ppm by weight of a catalyst element (nickel in the present preferred embodiment) is applied on the amorphous silicon film by a spin coating method, thereby forming a catalyst-element-including layer 505. This state is shown in FIG. 7A.

Figure 7B:
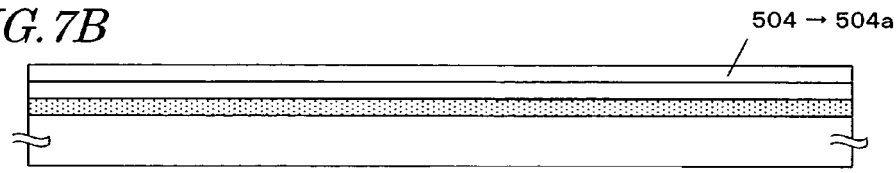

Then, a first heat treatment is performed in an inert atmosphere (e.g., a nitrogen atmosphere). The heat treatment is performed at about 520° C. to about 600° C. for approximately 1 to 8 hours. In the present preferred embodiment, the heat treatment was performed at about 550° C. for approximately 4 hours. In this heat treatment, nickel 505 added to the surface of the a-Si film 504 is silicified, and the crystallization of the a-Si film 504 proceeds using the silicide as nuclei. As a result, the a-Si film 504 is crystallized into a crystalline silicon film 504a, as illustrated in FIG. 7B.

Figure 7C:
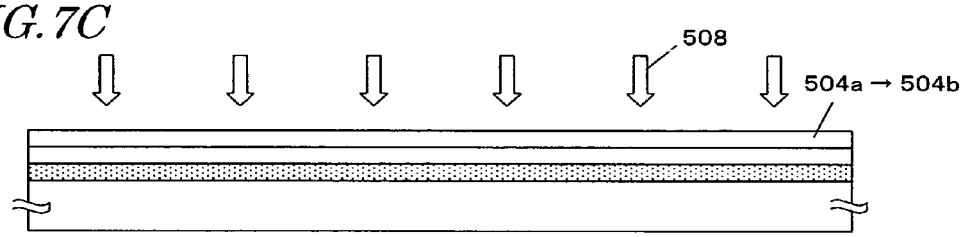

Then, as illustrated in FIG. 7C, the crystalline silicon film 504a obtained by the heat treatment is irradiated with laser light, thereby obtaining a crystalline silicon film 504b with an improved crystallinity. The crystallinity of the crystalline silicon film 504b is improved significantly by the laser light irradiation. Also in the present preferred embodiment, pulsed oscillation type XeCl excimer laser (wavelength: about 308 nm) was used as the laser light.

Then, the crystalline silicon film is etched into a predetermined pattern, thereby forming an active region 515n of an n-channel TFT and an active region 515p of a p-channel TFT.

Figure 7D:
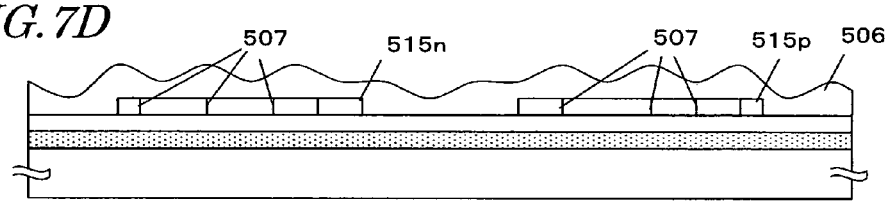

Then, as illustrated in FIG. 7D, the surface of the island-shaped crystalline silicon films 515n and 515p which are to be the active regions of the TFTs are exposed to acid 506 including hydrogen fluoride, thereby performing the first gettering step. In the present preferred embodiment, this step was performed by a dipping method (where a substrate is dipped entirely in a solution) using a 1% hydrofluoric acid solution. With hydrofluoric acid of such a concentration, the treatment time is preferably about 60 seconds to about 180 seconds (about 90 seconds in the present preferred embodiment). After the substrate was dipped in the hydrofluoric acid solution, the solution was substituted with pure water, and the substrate was washed and spun dry. Through this step, Ni silicide masses (particularly large masses and masses of $NiSi_2$) present in the island-shaped crystalline silicon film are selectively etched away by hydrofluoric acid 506, thereby leaving minute holes 507 in the TFT active regions 515n and 515p as traces of the etched-away silicide masses. The diameters of the holes were about 0.05 μm to about 0.5 μm. Note that the second base film 503, being a silicon oxide film, is also exposed to hydrofluoric acid 506, and thus the thickness thereof is reduced accordingly. However, under the conditions described above, the thickness is reduced by only about 30 nm, which does not cause a problem.

Figure 7E:
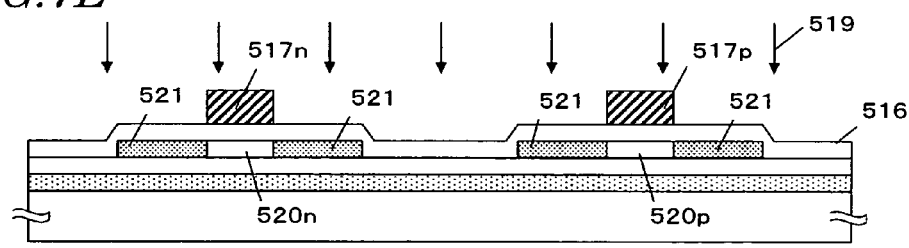

Then, a gate insulating film 516 is formed so as to cover the active regions 515n and 515p. The treatment with hydrofluoric acid serves also as a cleaning step preceding the formation of the gate insulating film, and a natural oxide film on the surface of the active regions 515n and 515p is removed while performing the first gettering step. Then, a conductive film is deposited on the gate insulating film 516 by using a sputtering method, a CVD method, or other suitable method. The material of the conductive film may be any one of W, Ta, Ti and Mo, which are high-melting metals, or an alloy material thereof. Then, as illustrated in FIG. 7E, the conductive film is etched to form gate electrodes 517n and 517p.

Then, a low concentration of n-type impurity (phosphorus) 519 is implanted into the active region by an ion doping method using the gate electrodes 517n and 517p as masks. In the present preferred embodiment, phosphine ($PH_3$) was used as the doping gas, the acceleration voltage was set to about 80 kV, and the dose was set to about $2 \times 10^{13}$ $cm^{-2}$. Through this step, regions of the island-shaped silicon films 515n and 515p that are not covered with the gate electrodes 517n and 517p become regions 521 doped with a low concentration of phosphorus 519, and regions that are masked with the gate electrodes 517n and 517p and are not doped with the impurity 519 will later be channel regions 520n and 520p of the n-channel TFT and the p-channel TFT, respectively. This state is shown in FIG. 7E.

Figure 7F:
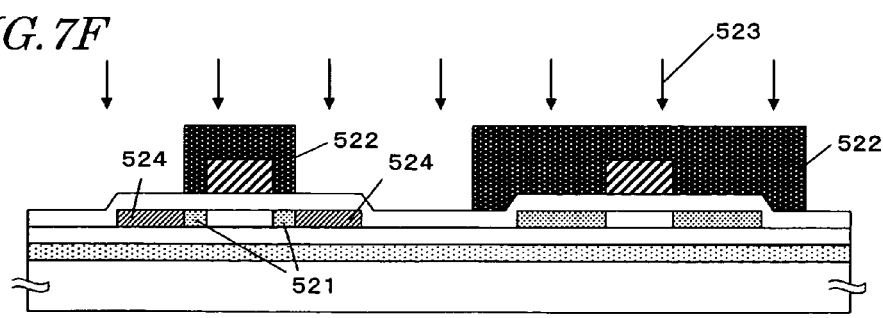

Then, as illustrated in FIG. 7F, photoresist doping masks 522 are provided. In the active region 515n of the n-channel TFT, the photoresist doping masks 522 with a thick side wall is provided so as to cover the gate electrode 517n, as illustrated in FIG. 7F. In the active region 515p of the p-channel TFT, the photoresist doping masks 522 with an even thicker side wall is provided so as to cover the entire active region, as illustrated in FIG. 7F. Then, a high concentration of an impurity (phosphorus) 523 is implanted into the active regions by an ion doping method using the resist masks 522. In the present preferred embodiment, phosphine (PH$_3$) was used as the doping gas, the acceleration voltage was set to about 80 kV, and the dose was set to about $5\times10^{15}$ cm$^{-2}$. For the n-channel TFT, a region 524 doped with a high concentration (about $1\times10^{19}$ to about $1\times10^{21}$/cm$^3$) of phosphorus 523 will later be the source/drain region of the n-channel TFT. In the active region 515n, the region that is covered with the resist mask 522 and is not doped with a high concentration of phosphorus 523 is left as a region doped with a low concentration of phosphorus, which forms the LDD (Lightly Doped Drain) region 521. For the p-channel TFT, no phosphorus is implanted into the active region 515p.

Figure 8A:
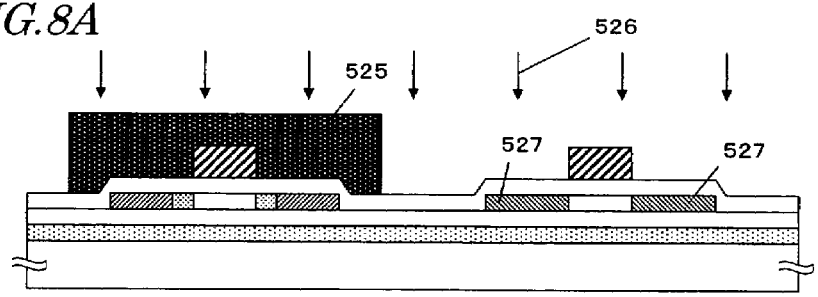
FIG. 8A to FIG. 8D are schematic cross-sectional views illustrating steps for manufacturing a semiconductor device according to the fifth preferred embodiment of the present invention (continued from FIG. 7F).

Then, after the resist masks 522 are removed, a photoresist doping mask 525 is provided so as to entirely cover the active region 515n of the n-channel TFT, as illustrated in FIG. 8A. At this time, no mask is provided over the active region 515p of the p-channel TFT, whereby the TFT is entirely exposed. Then, an impurity giving p-type conductivity (boron) 526 is implanted into the active regions by an ion doping method using the resist mask 525 and the gate electrode 517p of the p-channel TFT as masks. Diborane (B$_2$H$_6$) was used as the doping gas, the acceleration voltage was set to about 65 kV, and the dose was set to about $7\times10^{16}$ cm$^{-2}$. The region of the active region 515p of the p-channel TFT other than the channel region 520p under the gate electrode 517p, which has been doped with a low concentration of n-type impurity (phosphorus) 519 in the previous step, is doped with a high concentration of boron 526, whereby the conductivity type thereof is inverted from n type to p type and the region will later be a source/drain region 527 of the p-channel TFT.

Figure 8B:
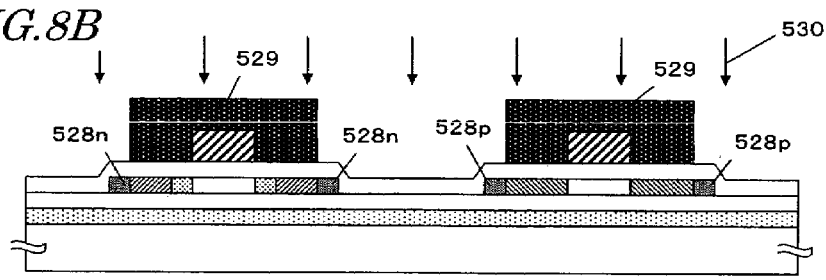
Figure 8C:
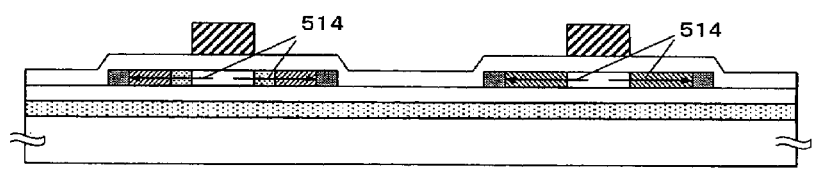

Then, after the resist mask 525 is removed, resist masks 529 are formed so as to cover the gate electrode 517n of the n-channel TFT and the gate electrode 517p of the p-channel TFT, as illustrated in FIG. 8B. With the masks 529, a (peripheral) portion of each of the active regions 515n and 515p of the n-channel TET and the p-channel TFT is exposed. Then, the substrate is ion-doped with a rare gas element (Ar in the present preferred embodiment) 530 from above the substrate across the entire surface of the substrate. Through this step, the rare gas element 530 is implanted into the exposed region of each TFT active region. Thus, gettering regions 528n and 528p are formed in peripheral portions of the active regions 515n and 515p of the n-channel TFT and the p-channel TFT, respectively. In this step, argon 530 was doped as follows. A 100% Ar gas was used as the doping gas, the acceleration voltage was set to about 60 kV to about 90 kV (e.g., about 80 kV), and the dose was set to about $1\times10^{15}$ cm$^{-2}$ to about $1\times10^{16}$ cm$^{-2}$ (e.g., about $3\times10^{15}$ cm$^{-2}$). The region covered with the masks 529 is not doped with the rare gas element. The rare gas element may be one or more rare gas element selected from Ar, Kr and Xe. Moreover, in this step, the concentration of the rare gas element in the gettering region 528 is controlled to be about $1\times10^{19}$ to about $3\times10^{21}$ atoms/cm$^3$. Moreover, through this step, the crystallinity of the gettering region 528 is destroyed, thus amorphizing the gettering region 528.

Then, after the resist masks 529 are removed, a second heat treatment is performed in an inert atmosphere (e.g., a nitrogen atmosphere). In the present preferred embodiment, an RTA (Rapid Thermal Annealing) process was used. The RTA apparatus used was an apparatus capable of performing an annealing process in a nitrogen atmosphere while rapidly increasing and decreasing the temperature by blowing a high-temperature nitrogen gas onto the surface of the substrate. Specifically, the substrate is held at about 550° C. to about 750° C. for about 30 seconds to 15 minutes, more preferably at about 600° C. to about 700° C. for about 1 minute to about 10 minutes. In the present preferred embodiment, an RTA process was performed at about 670° C. for approximately 5 minutes. The temperature-increasing rate and the temperature-decreasing rate are preferably about 100° C./min or more (about 200° C./min in the present preferred embodiment). In the active region of each TFT, a high concentration of argon 530 doped into the gettering region 528 formed outside the source/drain region and the crystal defects created through amorphization during the doping process form segregation sites for nickel to effect a gettering action. In this heat treatment step, in the active region 515n of the n-channel TFT, nickel present in the channel region 520n, the LDD region 521 and the source/drain region 524 is moved from the channel region to the LDD region, the source/drain region and to the gettering region 528n as indicated by arrow 514 in FIG. 8C. Similarly, in the active region 515p of the p-channel TFT, nickel present in the channel region 520p and the source/drain region 527 is moved from the channel region to the source/drain region and to the gettering region 528p as indicated by arrow 514.

In the second gettering step, first, nickel-present in the form of solid solution in the channel region 520, the LDD region 521 and the source/drain regions 524 and 527 is moved into the gettering region 528. As a result, the nickel concentration is decreased in these regions, whereby Ni silicide masses (particularly small masses and masses of lower semiconductor compounds such as NiSi and Ni$_2$Si) remaining in the region start dissolving in the region. Then, the newly dissolved Ni atoms are also moved into the gettering region 528. Eventually, small NiSi$_2$ masses and lower silicide masses such as NiSi and Ni$_2$Si masses, which could not be removed in the first gettering step, are completely removed, and the concentration of solid-solution nickel is also reduced. On the other hand, since nickel is moving into the gettering regions in the heat treatment step, the nickel concentration is about $1\times10^{19}$ cm$^3$ or more in the gettering regions 528n and 528p. As measured by secondary ion mass spectrometry (SIMS), the nickel concentration was decreased to about $5\times10^{15}$ atoms/cm$^3$, which is close to the measurable lower limit, in the channel region of the TFT active region, the junction between the channel region and the source/drain region and the junction between the channel region and the LDD region. Needless to say, nickel remaining in these of solid solution, i.e., as interstitial nickel atoms.

This heat treatment step also activates the n-type impurity (phosphorus) doped into the source/drain region 524 and the LDD region 521 of the n-channel TFT and the p-type impurity (boron) doped into the source/drain region 527 of the p-channel TFT. As a result, the sheet resistance value of the source/drain region 524 of the n-channel TFT was about 400 Ω/square to about 700 Ω/square, and the sheet resistance value of the LDD region 521 was about 30 kΩ/square to about 60 kΩ/square. Moreover, the sheet resistance value of the source/drain region 527 of the p-channel TFT was about 1 kΩ/square to about 1.5 kΩ/square. In the present preferred embodiment, a gettering region is formed outside the source region or the drain region in the active region of each of the n-channel TFT and the p-channel TFT, whereby even if the resistance increases in the source region or the drain region of the TFT through the amorphization due to the introduction of a rare gas element, it does not cause a problem.

After this step, the ratio Pa/Pc between the TO-phonon peak Pa of amorphous Si and the TO-phonon peak Pc of crystalline Si in the Raman spectrum as measured by laser Raman spectroscopy is larger in the gettering region of each TFT than in the channel region. In a case where a light-transmissive glass substrate is used, as in the present preferred embodiment, this measurement can be performed from the bottom surface of the substrate. Moreover, this condition is maintained even after the completion of the TFT because no high-temperature step is performed after this heat treatment step.

Figure 8D:
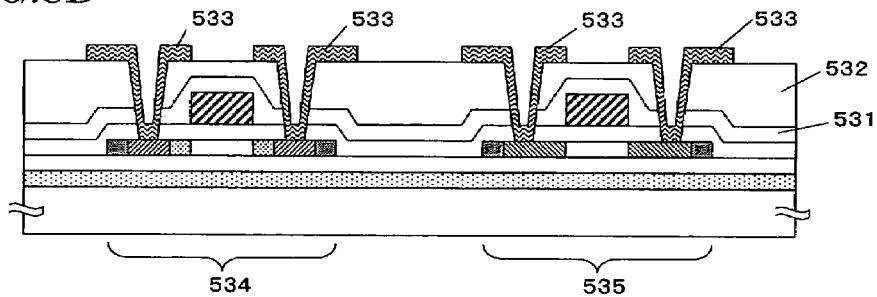

Then, as illustrated in FIG. 8D, an interlayer insulating film is formed. In the present preferred embodiment, a silicon nitride film 531 having a thickness of about 200 nm and a silicon oxide film 532 having a thickness of about 700 nm were deposited on one another, thereby providing a two-layer film.

Then, another heat treatment is performed at about 300° C. to about 500° C. for about 1 hour. This step is performed for terminating and inactivating dangling bonds that deteriorate the TFT characteristics by supplying hydrogen atoms form the interlayer insulating film (particularly the silicon nitride film 531) to the interface between the active region and the gate insulating film.

Then, contact holes are made in the interlayer insulating film, and an electrode/line 533 of the TFT is formed by using a metal film, thereby completing an n-channel TFT 534 and a p-channel TFT 535 as illustrated in FIG. 8D. As necessary, additional contact holes may be made over the gate electrodes 517n and 517p for providing necessary connection between electrodes with the line 533.

Each TFT produced according to the present preferred embodiment exhibited desirable field-effect mobility as in the third and fourth preferred embodiments of the present invention.

Sixth Preferred Embodiment

The present preferred embodiment is directed to a crystallization method that is different from those of the first to fifth preferred embodiments. The present preferred embodiment will be described with reference to FIG. 9A to FIG. 9E. FIG. 9A to FIG. 9E are cross-sectional views sequentially illustrating the manufacturing steps of the present preferred embodiment.

First, as in the first to fifth preferred embodiments, a base film such as a silicon oxide film, a silicon nitride film or a silicon oxide nitride film is formed on a substrate (a glass substrate in the present preferred embodiment) 601 for preventing the diffusion of an impurity from the substrate 601. In the present preferred embodiment, a silicon nitride film was deposited as a lower first base film 602, and a silicon oxide film was deposited as a second base film 603 on the first base film 602. The thickness of the silicon oxide nitride film of the first base film 602 was set to about 100 nm, for example, and the thickness of the silicon oxide nitride film of the second base film 603 was also set to about 100 nm, for example. Then, an a-Si film 604 having a thickness of about 30 nm to about 80 nm is formed by a known method such as a plasma CVD method or a sputtering method. In the present preferred embodiment, an amorphous silicon film was formed to a thickness of about 50 nm by a plasma CVD method. In this step, the base insulating films and the amorphous semiconductor film may be formed successively without exposing the substrate to the atmospheric air.

Figure 9A:
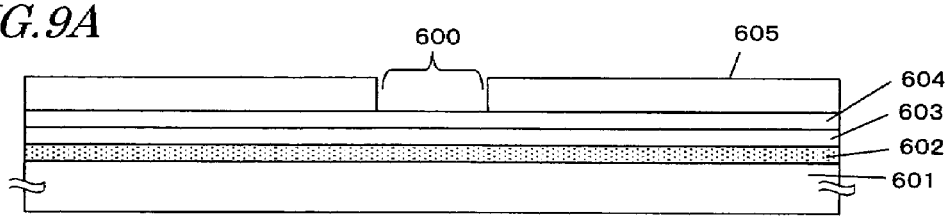
FIG. 9A to FIG. 9E are schematic cross-sectional views illustrating steps for manufacturing a semiconductor device according to a sixth preferred embodiment of the present invention.

Then, a mask insulating film 605 made of silicon oxide is formed to a thickness of about 200 nm. The mask insulating film 605 includes an opening 600 through which a catalyst element is added to the semiconductor film, as illustrated in FIG. 9A.

Figure 9B:
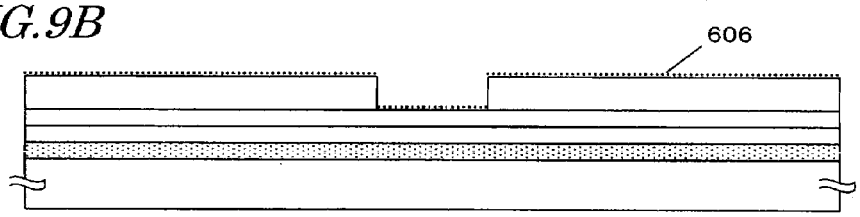

Then, as illustrated in FIG. 9B, an aqueous solution (aqueous nickel acetate solution) including approximately 100 ppm by weight of a catalyst element (nickel in the present preferred embodiment) is applied by a spin coating method, thereby forming a catalyst element layer 606. In this step, the catalyst element 606 selectively contacts the a-Si film 604 in the opening 600 of the mask insulating film 605, thereby forming a catalyst-element-added region. The catalyst element that can be used in the present preferred embodiment is one or more element selected from iron (Fe), nickel (Ni), cobalt (Co), ruthenium (Ru), rhodium (Rh), palladium (Pd), osmium (Os), iridium (Ir), platinum (Pt), copper (Cu) and gold (Au).

Moreover, while nickel is added by a spin coating method in the present preferred embodiment, a thin film of a catalyst element (nickel film in the present preferred embodiment) may alternatively be formed on an a-Si film by a vapor deposition method, a sputtering method, or other suitable process.

Figure 9C:
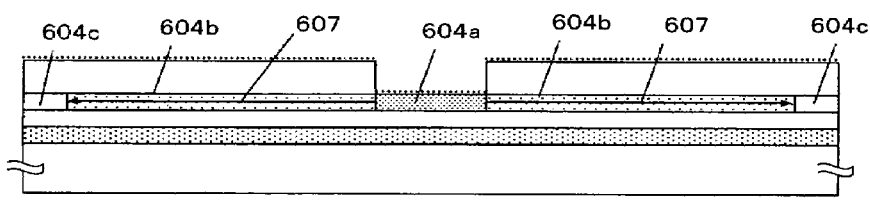

Then, a heat treatment is performed at about 500° C. to about 650° C. (preferably about 550° C. to about 600° C.) for approximately 6 to 20 hours (preferably about 8 to 15 hours). In the present preferred embodiment, a heat treatment is performed at about 570° C. for approximately 14 hours. As a result, as illustrated in FIG. 9C, crystal nuclei are formed in the catalyst-element-added region 600, and the a-Si film in the region 600 is first crystallized into a crystalline silicon film 604a. Starting from the crystallized region, the crystallization further proceeds in a direction generally parallel to the substrate (as indicated by arrow 607), thereby forming a crystalline silicon film 604b where the crystal growth direction is uniform macroscopically. In this step, nickel 606 present above the mask 605 is blocked by the mask film 605 and does not reach the underlying a-Si film. Therefore, the crystallization of the a-Si film 604 is effected only by nickel that is introduced in the region 600. Moreover, the region to which the lateral growth frontline does not reach is left as an amorphous region 604c. Depending on the layout, however, two laterally-grown crystal regions coming from adjacent openings may collide with each other to form a boundary therebetween, in which case such an amorphous region may not be present.

Figure 9D:
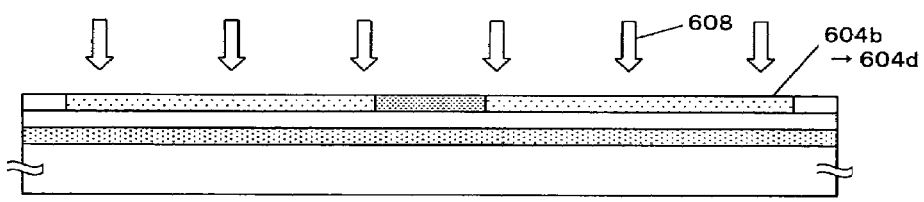
Figure 9E:
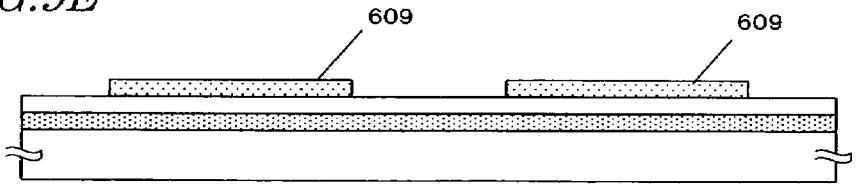

After the silicon oxide film 605, used as a mask, is removed, the obtained crystalline silicon film may be irradiated with laser light as illustrated in FIG. 9D so as to improve the crystallinity as in the first to fifth preferred embodiments. Thus, the crystalline silicon film in the laterally-grown crystal region 604b is further improved in quality and forms a crystalline silicon film 604d.

Then, the crystalline silicon film in the laterally-grown crystal region 604d is etched into a predetermined pattern, thereby forming an active region 609 of the TFT.

The crystallization method of the present preferred embodiment may be applied to the crystallization step of the first to fifth preferred embodiments so as to realize a TFT having a higher current driving power and a higher performance. The first gettering step of exposing the surface of the crystalline silicon film to acid including hydrogen fluoride may be performed before the laser light (608) irradiation step (before the step of FIG. 9D in the present preferred embodiment) as in the first and fourth preferred embodiments, or may be performed after the laser irradiation step (after the step of FIG. 9D) as in the second and third preferred embodiments. Alternatively, it may be performed after the formation of the active region 609 as in the fifth preferred embodiment.

Seventh Preferred Embodiment

The present preferred embodiment is directed to how to arrange, in the active region, gettering regions for moving a catalyst element for crystallizing a semiconductor film as illustrated in the fourth or fifth preferred embodiment. The present preferred embodiment will be described with reference to FIG. 10A to FIG. 10D, FIG. 11A and FIG. 1B.

By applying the present preferred embodiment to the TFT manufacturing process of the fourth or fifth preferred embodiment, it is possible to form gettering regions of various shapes in the active regions of the n-channel TFT and the p-channel TFT. Moreover, the catalyst element gettering efficiency in the n-channel TFT can be matched with that of the p-channel TFT by controlling the area of the gettering region in the active region of the n-channel TFT to be generally equal to that in the active region of the p-channel TFT while controlling the distance from the, gettering region to the channel region in the n-channel TFT to be generally equal to that in the p-channel TFT. Examples of the shape of the gettering region formed in the active region will now be shown.

Note that controlling the area of the gettering region in the active region of the n-channel TFT to be generally equal to that in the active region of the p-channel TFT means to control the ratio S/W in the n-channel TFT to be generally equal to that in the p-channel TFT, where W is the width of the active region (channel region) and S is the area of the gettering region.

Figure 10A:
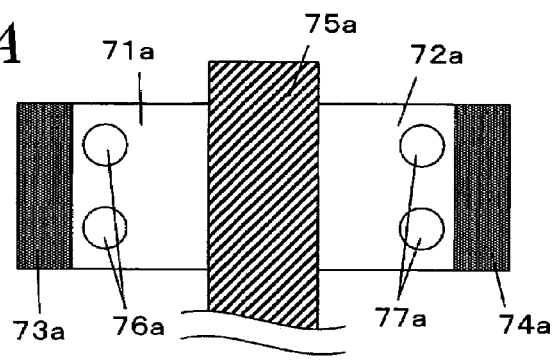
FIG. 10A to FIG. 10D are schematic diagrams each illustrating an alternative arrangement of gettering regions according to a seventh preferred embodiment of the present invention.

FIG. 10A shows an example where each of gettering regions 73a and 74a is arranged remote from the channel region in the active region below a gate electrode 75a (in a peripheral portion of the active region), and has a substantially rectangular shape extending substantially parallel to the gate electrode 75a, with corner portions thereof being generally aligned with corner portions of the active region.

Figure 10B:
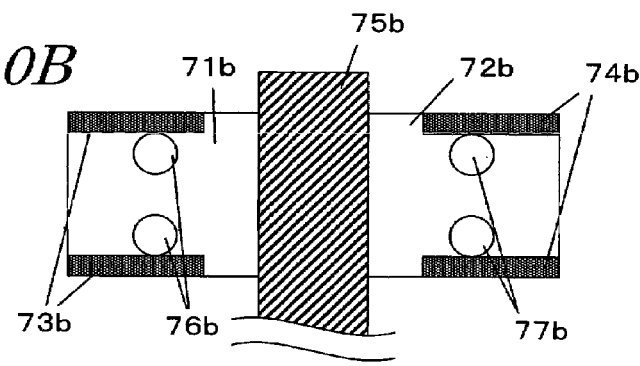

FIG. 10B shows an example where each of gettering regions 73b and 74b is arranged remote from the channel region in the active region below a gate electrode 75b (in a peripheral portion of the active region), and has a substantially rectangular shape extending substantially perpendicular to the gate electrode 75b, with a corner portion thereof being generally aligned with a corner portion of the active region.

Figure 10C:
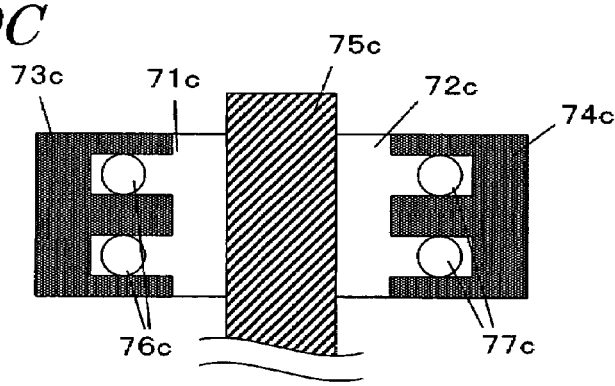

FIG. 10C shows an example where each of gettering regions 73c and 74c is arranged remote from the channel region in the active region below a gate electrode 75c (in a peripheral portion of the active region), and has a complicated shape including a substantially rectangular component extending substantially parallel to the gate electrode 75c and other substantially rectangular components extending substantially perpendicular to the gate electrode 75c, with corner portions thereof being generally aligned with corner portions of the active region. With this arrangement, as compared with those of FIG. 10A and FIG. 10B, the area of the gettering region can be increased, thereby increasing the catalyst element gettering efficiency.

In any of these arrangements, the gettering region is arranged so as not to block a current flow between contact portions formed in the source region and in the drain region (the term "contact portion" as used herein refers to a portion where a line for electrically connecting TFTs together is connected to the active region). Specifically, the gettering regions 73a and 74a of FIG. 10A are arranged so as not to block a current flow between contact portions 76a formed in a source region 71a and contact portions 77a formed in a drain region 72a.

Moreover, the gettering regions 73b and 74b of FIG. 10B are arranged so as not to block a current flow between contact portions 76b connected to a source region 71b and contact portions 77b formed in a drain region 72b.

Moreover, the gettering regions 73c and 74c of FIG. 10C are arranged so as not to block a current flow between contact portions 76c formed in a source region 71c and contact portions 77c formed in a drain region 72c.

Figure 10D:
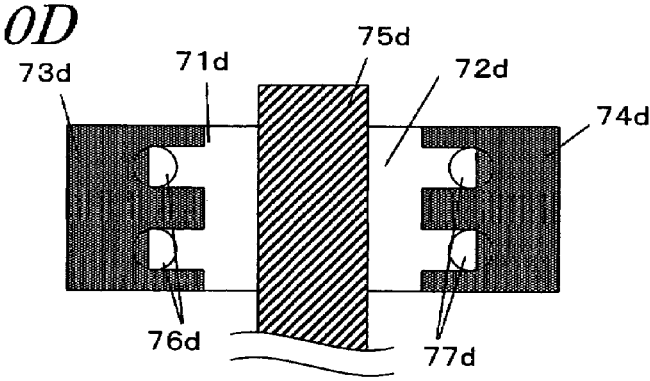
Figure 11A:
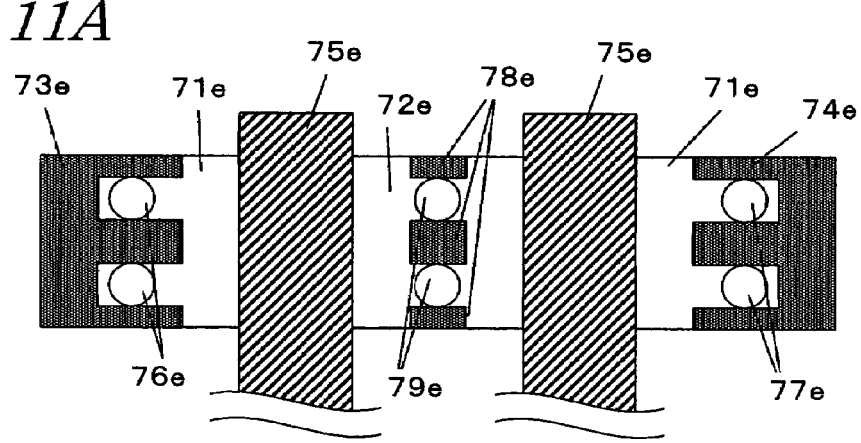
FIG. 11A and FIG. 11B are schematic diagrams each illustrating an alternative arrangement of gettering regions according to the seventh preferred embodiment of the present invention.
Figure 11B:
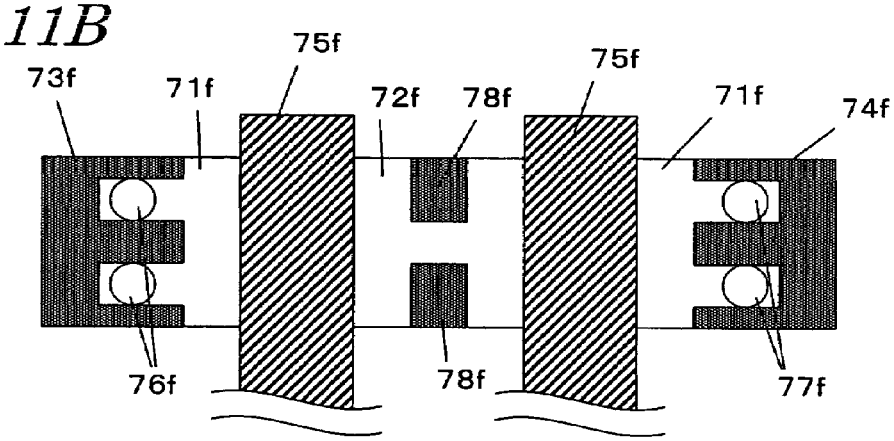

FIG. 10D shows an arrangement that is basically the same as that of FIG. 10C, except that gettering regions 73d and 74d overlap contact portions 76d and 77d, respectively, in order to further increase the area of the gettering regions 73d and 74d so as to further improve the gettering efficiency of the gettering regions 73d and 74d. Basically, some overlap between the gettering regions 73d and 74d and the contact portions 76d and 77d does not cause a problem. However, the area of overlap should not exceed one half of the area of the contact portion 76d or 77d. Therefore, the distance between the contact portions 76d and 77d and the gettering regions 73d and 74d needs to be determined appropriately in view of the alignment precision of an exposure apparatus used in a photolithography step for each region to be formed. Note that arrangement of the gettering regions is not limited to that of the present preferred embodiment, but may be any other arrangement as long as it does not affect (block) a current flow between the source region and the drain region.

FIG. 11E shows an example where a plurality of gate electrodes 75e run through the active region, with a plurality of channel regions being provided under the gate electrodes 75e. A source region 71e (or a drain region 72e), a gettering region 78e and a contact portion 79e are formed between the plurality of gate electrodes. Note that gettering regions 73e and 74e are formed in peripheral portions of the active region, as in the arrangements shown in FIG. 10A to FIG. 10D, and the source region 71e or the drain region 72e and contact portions 76e and 77e are formed between the gettering regions 73e and 74e. Also in the arrangement of FIG. 1E, the gettering region 73e may alternatively overlap the contact portion 76e. However, the area of overlap should not exceed one half of the area of the contact portion 76e or 77e.

FIG. 11F also shows an example where a plurality of gate electrodes 75f run through the active region, with a plurality of channel regions being provided under the gate electrodes 75f. In the arrangement of FIG. 11F, two TFTs are connected in series with each other while sharing an active region, and no contact portion is provided at the junction therebetween. Thus, this is an arrangement that can be used when it is not necessary to take out an electrical signal from the junction. Such a TFT circuit is actually used for clocked inverters, latch circuits, and other apparatuses. A source region 71f (or a drain region 72f) and a gettering region 78f are formed between the plurality of gate electrodes. Note that gettering regions 73f and 74f are formed in peripheral portions of the active region, as in the arrangements shown in FIG. 10A to FIG. 10D, and the source region 71f or the drain region 72f and contact portions 76f and 77f are formed between the gettering regions 73f and 74f. In the junction region, the gettering region 78f is arranged at least not to block a current flow from the contact portions 76f to the contact portions 77f.

Note that the shape of the active region of a TFT varies depending on the amount of current required for the TFT. Preferred embodiments of the present invention can be used either with a "waistless" arrangement where the width of the source/drain region is the same as that of the channel region, as in the arrangements shown in FIG. 10A to FIG. 10D and FIG. 11A and FIG. 11B, or with an "hourglass-shaped" arrangement where the width of the channel region is narrowed from that of the source/drain region.

Regardless of the shape of the gettering region, the catalyst element concentration in the gettering region increases to be about $1 \times 10^{19}/cm^3$ or more as the catalyst element moves into the gettering region in the gettering heat treatment.

The present preferred embodiment can be used in combination with the fourth or fifth preferred embodiment.

Eighth Preferred Embodiment

Figure 12A:
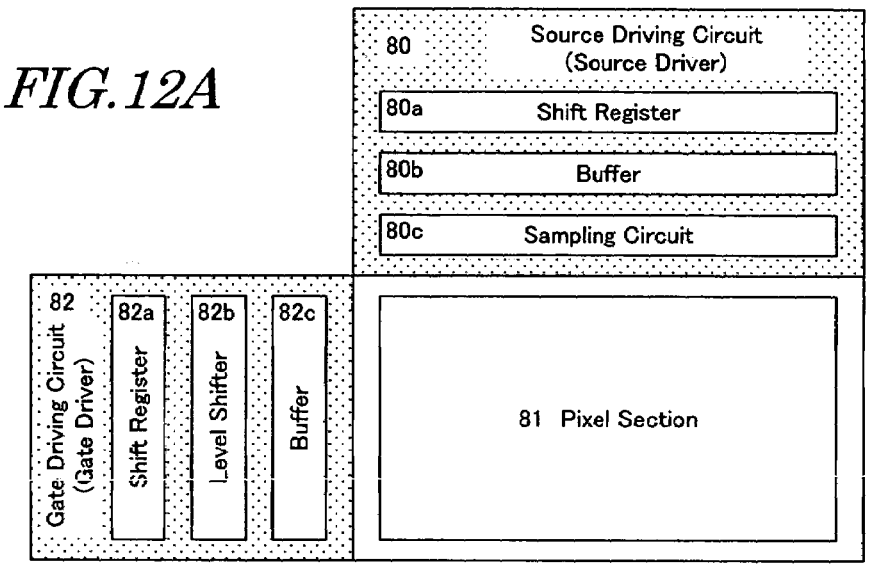
FIG. 12A and FIG. 12B are schematic diagrams each illustrating a configuration of a semiconductor device according to a eighth preferred embodiment of the present invention.
Figure 12B:
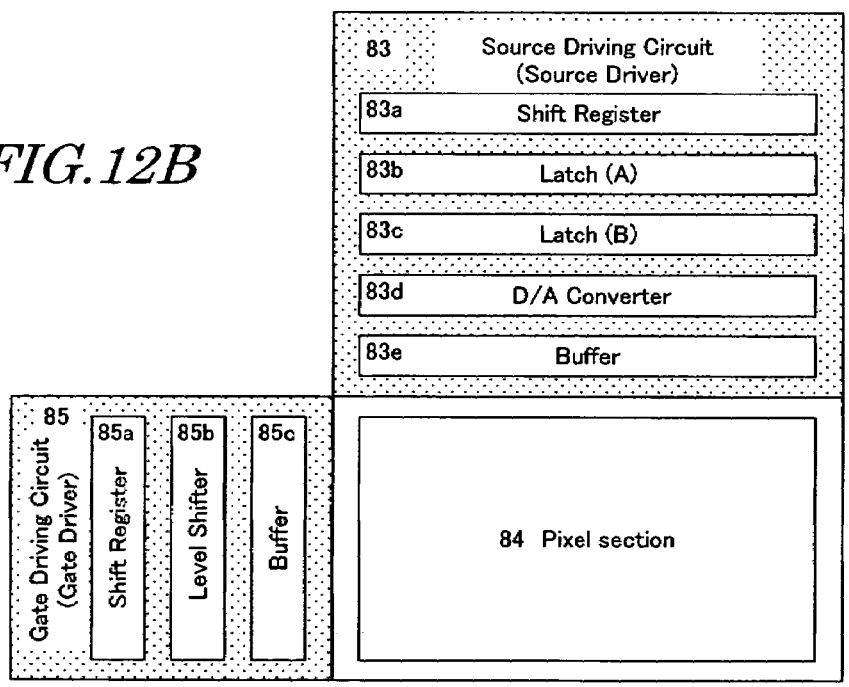

FIG. 12A and FIG. 12B are block diagrams each illustrating a semiconductor device produced according to a preferred embodiment of the present invention. Note that FIG. 12A shows a circuit configuration for analog driving. The semiconductor device of the present preferred embodiment includes a source driving circuit 80, a pixel section 81 and a gate driving circuit 82. Note that the term "driving circuit" as used herein is a generic-term encompassing a source driving circuit and a gate driving circuit.

The source driving circuit 80 includes a shift register 80a, a buffer 80b and the sampling circuit (transfer gate) 800. The gate driving circuit 82 includes a shift register 82a, a level shifter 82b and a buffer 82a. As necessary, a level shifter circuit may be provided between the sampling circuit and the shift register.

Moreover, in the present preferred embodiment, the pixel section 81 includes a plurality of pixels, each including a TFT.

Note that a further gate driving circuit (not shown) may alternatively be provided on the other side of the pixel section 81 from the gate driving circuit 82.

FIG. 12B shows a circuit configuration for digital driving. The semiconductor device of the present preferred embodiment includes a source driving circuit 83, a pixel section 84 and a gate driving circuit 85. For digital driving, a latch (A) 83b and a latch (B) 83c can be provided instead of the sampling circuit, as illustrated in FIG. 12B. A source driving circuit 83 includes a shift register 83a, the latch (A) 83b, the latch (B) 83c, a D/A converter 83d and a buffer 83e. The gate driving circuit 85 includes a shift register 85a, a level shifter 85b and a buffer 85c. As necessary, a level shifter circuit may be provided between the latch (B) 83c and the D/A converter 83d.

The configurations described above can be realized by the manufacturing processes of the first to seventh preferred embodiments above. Although only the pixel section and the driving circuit are illustrated in the present preferred embodiment, a memory or a microprocessor can be formed according to the manufacturing process of preferred embodiments of the present invention.

Ninth Preferred Embodiment

A CMOS circuit and a pixel section produced according to a preferred embodiment of the present invention can be used in an active matrix liquid crystal display device. Thus, the present invention can be used with any electric devices incorporating such a liquid crystal display device in its display section.

Such electric devices include a video camera, a digital camera, a projector (of a rear type or a front type), a head mounted display (a goggle type display), a personal computer, a portable information terminal (e.g., a mobile computer, a portable telephone, or an electronic book), and many other such apparatuses.

With the present invention, it is possible to obtain a crystalline silicon film having a desirable crystallinity using a catalyst element. Moreover, the catalyst element can be gettered sufficiently, whereby it is possible to greatly improve the characteristics of an n-channel TFT and a p-channel TFT, thus realizing a desirable CMOS driving circuit having a high reliability and stable circuit characteristics. Moreover, even with those TFTs whose off-state leak current has been a problem, including a pixel switching TFT and a TFT of a sampling circuit of an analog switch section, it is possible to sufficiently suppress the leak current, which is believed to be due to the segregation of the catalyst element. As a result, it is possible to realize a desirable display with no display non-uniformity. As a desirable display with no display non-uniformity is obtained, it is possible to save the use of the light source and thus the power consumption. Therefore, it is possible to realize an electric device (such as a portable telephone, a portable electronic book and a display) with a reduced power consumption.

As described above, the present invention can be used in a wide variety of applications, and can be used in any kind of electric devices. Moreover, an electric device of the present invention can be realized by using a display device that is produced based on one or more of the preferred embodiments above.

The present invention is not limited to those preferred embodiments specifically set forth above, but various modifications can be made based on the technical concept of the present invention.

For example, while an etching process with hydrofluoric acid is preferably performed as the first gettering step in the preferred embodiments described above, semiconductor compound masses of a catalyst element (particularly large masses and higher semiconductor compound masses) may alternatively be removed by any other suitable method.

Moreover, while nickel is preferred introduced by applying a nickel salt solution onto the surface of an amorphous silicon film in the preferred embodiments above, nickel may alternatively be introduced onto the surface of a base film before the deposition of the amorphous silicon film so that the crystal growth is performed while nickel diffuses from the layer under the amorphous silicon film. Moreover, the method of introducing nickel may be any other suitable method. For example, an SOG (spin-on-glass) material may be used as the solvent for the nickel salt so as to diffuse nickel from an $SiO_2$ film. Alternatively, nickel may be introduced in the form of a thin film by using a sputtering method, a vapor deposition method or a plating method, or nickel may be directly introduced by an ion doping method.

Moreover, while phosphorus is used in the second gettering step in the first to fourth preferred embodiments, arsenic or antimony may alternatively be used. While argon is doped in the fifth preferred embodiment, krypton and xenon are also effective.

With the present invention, it is possible to sufficiently reduce the amount of a catalyst element remaining in the device region (particularly, the channel region, or the junction between the channel region and the source region or the junction between the channel region and the drain region) of a crystalline semiconductor film with a desirable crystallinity that is produced by using a catalyst element. With a TFT using such a semiconductor film, it is possible to suppress the occurrence of a leak current and to improve the reliability, and it is possible to realize a high-performance semiconductor element having stable characteristics with little characteristics variations. Furthermore, it is possible to reduce the additional steps for the gettering process, thereby simplifying the manufacturing process. As a result, it is possible to significantly improve the production yield and to reduce the manufacturing cost of the semiconductor device.

Therefore, with the present invention, it is possible to realize a high-performance semiconductor element, and it is possible to obtain a highly-integrated, high-performance semiconductor device with a simple manufacturing process. Particularly, with a liquid crystal display device, the present invention provides an improvement in the switching characteristics of a pixel switching TFT, which is required for active matrix substrates, and an improvement in the performance and the degree of integration, which is required for TFTs of a peripheral driving circuit section. Therefore, in a driver-monolithic active matrix substrate having an active matrix section and a peripheral driving circuit section formed on the same substrate, it is possible to reduce the size of the module, improve the performance thereof, and reduce the cost thereof.

While the present invention has been described with reference to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method for manufacturing a semiconductor film, comprising the steps of:
  (a) forming an amorphous semiconductor layer on an insulative surface;
  (b) adding a catalyst element capable of promoting crystallization to the amorphous semiconductor layer and then performing a first heat treatment so as to crystallize the amorphous semiconductor layer, thereby obtaining a crystalline semiconductor layer;
  (c) performing a first gettering process to remove the catalyst element from the semiconductor layer; and
  (d) performing a second gettering process that is different from the first gettering process to remove the catalyst element from the semiconductor layer; wherein
  the first and second gettering processes getter different semiconductor compounds of the catalyst element; and
  at least one the first and second gettering processes getters the catalyst element that is not part of a semiconductor compound.

2. The method for manufacturing a semiconductor film according to claim 1, wherein the step (c) includes removing at least large masses of a semiconductor compound of the catalyst element present in the crystalline semiconductor layer.

3. The method for manufacturing a semiconductor film according to claim 1, wherein the step (d) includes moving at least a part of the catalyst element remaining in the crystalline semiconductor layer so as to form a low-catalyst-concentration region in the crystalline semiconductor layer, the low-catalyst-concentration region having a lower catalyst element concentration than in other regions.

4. The method for manufacturing a semiconductor film according to claim 1, wherein the step (c) includes a step of removing a higher semiconductor compound of the catalyst element, and the low-catalyst-concentration region includes substantially no higher semiconductor compound.

5. The method for manufacturing a semiconductor film according to claim 4, wherein the crystalline semiconductor layer is substantially made of Si, the catalyst element is a metal element M, and the higher semiconductor compound has a composition of $M_xSi_y$ ($x<y$).

6. The method for manufacturing a semiconductor film according to claim 1, wherein the step (d) includes a step of moving the catalyst element forming a lower semiconductor compound of the catalyst element, and the low-catalyst-concentration region includes substantially no lower semiconductor compound.

7. The method for manufacturing a semiconductor film according to claim 6, wherein the crystalline semiconductor layer is substantially made of Si, the catalyst element is a metal element M, and the lower semiconductor compound has a composition of $M_xSi_y$ ($x \geq y$).

8. The method for manufacturing a semiconductor film according to claim 1, wherein the step (d) includes a step of moving the catalyst element present in a form of solid solution in the crystalline semiconductor layer.

9. The method for manufactunng a semiconductor film according to claim 1, wherein the step (c) includes a step of selectively etching away a semiconductor compound of the catalyst element.

10. The method for manufacturing a semiconductor film according to claim 9, wherein the etching process in the step (c) is performed by using acid including at least hydrogen fluoride as an etchant.

11. The method for manufacturing a semiconductor film according to claim 1, wherein the step (d) includes a step of dissolving, in the crystalline semiconductor film, the catalyst element forming a semiconductor compound of the catalyst element remaining in the crystalline semiconductor film.

12. The method for manufacturing a semiconductor film according to claim 1, wherein the step (d) includes a step of forming a gettering region or a gettering layer capable of attracting the catalyst element, and a step of performing a second heat treatment so that the catalyst element remaining in the crystalline semiconductor film is moved into the gettering region or the gettering layer.

13. The method for manufacturing a semiconductor film according to claim 12, wherein the gettering region or the gettering layer has a larger amorphous component content than in other regions of the crystalline semiconductor film.

14. The method for manufacturing a semiconductor film according to claim 12, wherein the gettering region or the gettering layer includes a group VB impurity element giving n-type conductivity.

15. The method for manufacturing a semiconductor film according to claim 14, wherein the impurity element includes at least one element selected from the group consisting of P, As and Sb.

16. The method for manufacturing a semiconductor film according to claim 12, wherein the gettering region or the gettering layer includes a group IIIB impurity element giving p-type conductivity.

17. The method for manufacturing a semiconductor film according to claim 16, wherein the impurity element includes at least one of B and Al.

18. The method for manufacturing a semiconductor film according to claim 12, wherein the gettering region or the gettering layer includes at least one rare gas element selected from the group consisting of Ar, Kr and Xe.

19. The method for manufacturing a semiconductor film according to claim 12, wherein at least one of an impurity element and at least one rare gas element included in the gettering region or the gettering layer are introduced by an ion implantation method.

20. The method for manufacturing a semiconductor film according to claim 12, further comprising a step of removing the gettering region or the gettering layer after the step (d).

21. The method for manufacturing a semiconductor film according to claim 1, wherein the step (b) includes a step of selectively adding the catalyst element to a region of the amorphous semiconductor film and then performing the first heat treatment so that a crystal growth process proceeds laterally from the region to which the catalyst element has been selectively added.

22. The method for manufacturing a semiconductor film according to claim 1, wherein the step (b) includes a step of irradiating the crystalline semiconductor film with laser light after the first heat treatment.

23. The method for manufacturing a semiconductor film according to claim 22, wherein:
the step (c) includes a step of selectively etching away a semiconductor compound of the catalyst element; and
the etching step is performed after the first heat treatment step and before the laser light irradiation step in the step (b), and serves also as a surface cleaning step.

24. The method for manufacturing a semiconductor film according to claim 1, wherein:
the step (b) includes a step of forming an insulating film on the crystalline semiconductor film after the first heat treatment step;
the step (c) includes a step of selectively etching away a semiconductor compound of the catalyst element; and
the etching step is performed after the first heat treatment step and before the insulating film formation step in the step (b), and serves also as a surface cleaning step.

25. The method for manufacturing a semiconductor film according to claim 1, wherein the catalyst element is at least one metal element selected from the group consisting of Ni, Co, Sn, Pb, Pd, Fe and Cu.

26. A method for manufacturing a semiconductor device, comprising the steps of:
providing a semiconductor film manufactured by the method for manufacturing a semiconductor film according to claim 1;
and producing a thin film transistor including the semiconductor film in an active region thereof.

27. The method for manufacturing a semiconductor device according to claim 26, wherein:
the active region includes a channel region, a source region and a drain region; and
the step of producing the thin film transistor includes a step of forming at least the channel region in the low-catalyst-concentration region.

28. The method for manufacturing a semiconductor device according to claim 27, wherein the step of producing the thin film transistor includes a step of forming the channel region, the source region and the drain region in the low-catalyst-concentration region.

* * * * *